(12) United States Patent
Kang et al.

(10) Patent No.: US 11,682,751 B2
(45) Date of Patent: Jun. 20, 2023

(54) DISPLAY APPARATUS

(71) Applicant: SUZHOU LEKIN SEMICONDUCTOR CO., LTD., Taicang (CN)

(72) Inventors: Ki Man Kang, Seoul (KR); Do Yub Kim, Seoul (KR); Sang Youl Lee, Seoul (KR); Eun Dk Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 185 days.

(21) Appl. No.: 16/963,546

(22) PCT Filed: Jan. 22, 2019

(86) PCT No.: PCT/KR2019/000888
§ 371 (c)(1),
(2) Date: Jul. 21, 2020

(87) PCT Pub. No.: WO2019/143222
PCT Pub. Date: Jul. 25, 2019

(65) Prior Publication Data
US 2020/0357973 A1 Nov. 12, 2020

(30) Foreign Application Priority Data

Jan. 22, 2018 (KR) .................. 10-2018-0007817
Feb. 7, 2018 (KR) .................. 10-2018-0015126

(51) Int. Cl.
*H01L 33/62* (2010.01)
*G09G 3/32* (2016.01)
(Continued)

(52) U.S. Cl.
CPC .............. *H01L 33/62* (2013.01); *G09G 3/32* (2013.01); *H01L 25/0753* (2013.01); *H01L 33/382* (2013.01); *H01L 33/48* (2013.01)

(58) Field of Classification Search
CPC ..... H01L 33/62; H01L 25/0753; H01L 33/22; H01L 33/382; H01L 33/405; H01L 33/44; H01L 27/156; H01L 33/48; G09G 3/32
See application file for complete search history.

(56) References Cited

U.S. PATENT DOCUMENTS

2013/0334552 A1 12/2013 Yang et al.
2014/0110730 A1* 4/2014 Lee ..................... H01L 25/0753
257/88

(Continued)

FOREIGN PATENT DOCUMENTS

JP 2014-157948 A 8/2014
JP 2015-173222 A 10/2015
(Continued)

*Primary Examiner* — Patricia D Valenzuela
(74) *Attorney, Agent, or Firm* — Birch, Stewart, Kolasch & Birch, LLP

(57) ABSTRACT

Disclosed is a semiconductor device package comprising: first insulation layers disposed between first wiring lines and second wiring lines; a plurality of first pads electrically connected to the first wiring lines, respectively; and a plurality of second pads electrically connected to the second wiring lines, respectively, wherein the line having the longest length extended in a first direction, among the plurality of first wiring lines, has an area of a region, which is overlapped with an electrically connected semiconductor structure, that is larger than that of the line having the shortest extended length.

20 Claims, 35 Drawing Sheets

(51) Int. Cl.
*H01L 25/075* (2006.01)
*H01L 33/38* (2010.01)
*H01L 33/48* (2010.01)

(56) References Cited

U.S. PATENT DOCUMENTS

2016/0232838 A1\* 8/2016 Seo .................... G09G 3/20
2017/0025571 A1   1/2017 Kim et al.

FOREIGN PATENT DOCUMENTS

| JP | 2016-219652 A | 12/2016 |
|----|---------------|---------|
| KR | 10-2013-0139630 A | 12/2013 |
| KR | 10-2015-0037403 A | 4/2015 |
| KR | 10-2016-0137365 A | 11/2016 |
| KR | 10-1760317 B1 | 7/2017 |
| KR | 10-2017-0133717 A | 12/2017 |

\* cited by examiner (a)　　　　　　　(b)

DISPLAY APPARATUS

CROSS REFERENCE TO RELATED APPLICATIONS

This application is the National Phase of PCT International Application No. PCT/KR2019/000888, filed on Jan. 22, 2019, which claims priority under 35 U.S.C. 119(a) to Patent Application Nos. 10-2018-0007817, filed in the Republic of Korea on Jan. 22, 2018 and 10-2018-0015126, filed in the Republic of Korea on Feb. 7, 2018, all of which are hereby expressly incorporated by reference into the present application.

TECHNICAL FIELD

The present invention relates to a display apparatus.

BACKGROUND ART

Semiconductor devices including compounds such as GaN and AlGaN may be variously used as light-emitting devices, light-receiving devices, and various diodes due to many advantages thereof, such as wide and easily adjustable bandgap energy.

In particular, light-emitting devices, such as light-emitting diodes and laser diodes, which use a III-V group or II-VI group compound semiconductor material, are capable of rendering various colors, such as red, green, and blue, and ultraviolet rays by virtue of the development of thin-film growth technologies and device materials, are capable of producing white light at high efficiency using fluorescent materials or through color mixing, and have advantages such as low power consumption, semi-permanent lifespan, fast response speed, safety, and environmental friendliness as compared with conventional light sources such as fluorescent lamps and incandescent lamps.

In addition, when a light-receiving device such as a photodetector or a solar cell is manufactured using a III-V group or II-VI group compound semiconductor material, due to the development of an element material, the light-receiving device generates a photocurrent by absorbing light in various wavelength regions so that light in various wavelength regions from a gamma ray region to a radio wavelength region can be used. In addition, since the light-receiving device has advantages of having fast response speed, safety, environmental friendliness, and easy control of an element material, the light-receiving device can also be easily used for power control, microwave circuits, or communication modules.

Accordingly, application of the semiconductor device has expanded to being applied as a transmission module of an optical communication device, a light-emitting diode (LED) backlight capable of replacing a cold cathode fluorescent lamp (CCFL) which constitutes a backlight of a liquid crystal display (LCD) device; a white LED lighting device capable of replacing a fluorescent lamp or an incandescent lamp; a headlight for a vehicle; a traffic light; a sensor for sensing gas or fire; and the like. In addition, the application of the semiconductor device may be expanded to a high frequency application circuit, another power control device, and a communication module.

A plurality of light-emitting devices (chips) may be formed into a package and used as the headlight for a vehicle. In particular, recentely, there is a rising interest in headlights in which a plurality of chips can be independently turned on.

In this case, in order to make the plurality of chips appear as one light source, a distance between the chips should be minimized, but problems such as a short circuit may occur. In addition, since the individual chips are mounted on a substrate through wire bonding or the like, a space for the mounting is required, thereby resulting in a problem in that it is difficult to miniaturize the sizes of the individual chips and a package. Furthermore, there is a problem in that luminous flux is lowered.

SUMMARY

The present invention is directed to providing a display apparatus which is easy to drive.

The present invention is also directed to providing a display apparatus having a reduced resistance.

The present invention is also directed to providing a display apparatus having uniform current spreading.

The present invention is also directed to providing a display apparatus having improved luminous flux.

Problems to be solved in embodiments are not limited thereto, and objects and effects which may be determined from solutions to the problems and embodiments described below are also included.

According to an embodiment of the present invention, a semiconductor device package includes a substrate, a plurality of semiconductor structures disposed on the substrate, wherein the semiconductor structure is disposed on the substrate and includes a first conductivity-type semiconductor layer, a second conductivity-type semiconductor layer, and an active layer disposed between the first conductivity-type semiconductor layer and the second conductivity-type semiconductor layer, a plurality of first wiring lines disposed between the substrate and the plurality of semiconductor structures and electrically connected to the first conductivity-type semiconductor layer, a plurality of second interconnection lines disposed between the substrate and the plurality of semiconductor structures and electrically connected to the second conductivity-type semiconductor layer, a first insulating layer disposed between the first interconnection line and the second interconnection line, a plurality of first pads each electrically connected to the first interconnection line, and a plurality of second pads each electrically connected to the second interconnection line, wherein, among the plurality of first interconnection lines, an area of a region, in which the first interconnection line having a greatest length extending in a first direction overlaps the semiconductor structure electrically connected thereto, is greater than an area of a region in which the first interconnection line having a smallest length extending in the first direction overlaps the semiconductor structure electrically connected thereto.

In the plurality of first interconnection lines, as a length extending in the first direction is increased, the area of the region overlapping the electrically connected semiconductor structure may also be increased.

The first interconnection line may include a first through-portion which passes through the active layer, the second conductivity-type semiconductor layer, and the first insulating layer and is electrically connected to the first conductivity-type semiconductor layer, and a first end portion which extends to an edge of the substrate.

The second interconnection line may include a second end portion extending to the edge of the substrate.

The first end portion and the second end portion may be disposed to protrude further toward the edge of the substrate than an edge of the semiconductor structure.

The plurality of first interconnection lines may include a first-1a interconnection line, a first-1b interconnection line, a first-1c interconnection line, and a first-1d interconnection line.

The first-1a interconnection line, the first-1b interconnection line, the first-1c interconnection line, and the first-1d interconnection line may be disposed below the plurality of semiconductor structures which are in series in the first direction.

The first-1a interconnection line, the first-1b interconnection line, the first-1c interconnection line, and the first-1 d interconnection line may be sequentially disposed in a second direction.

A length in the first direction may be great in order from the first-1a interconnection line, the first-1d interconnection line, the first-1b interconnection line, to the first-1c interconnection line.

A length in the second direction may be great in order from the first-1a interconnection line, the first-1d interconnection line, the first-1b interconnection line, to the first-1c interconnection line.

The first-1a interconnection line may overlap the plurality of semiconductor structures in series in the first direction.

The first-1a interconnection line may include a first protrusion and a second protrusion which protrude in the second direction.

The first protrusion may overlap the first-1b interconnection line in the first direction.

The second protrusion may overlap the first-1b interconnection line, the first-1c interconnection line, and the first-1d interconnection line in the first direction.

The first-1b interconnection line may include a third protrusion.

The third protrusion may protrude in the second direction.

The third protrusion may overlap the first-1c interconnection line, the first-1d interconnection line, and the first-1a interconnection line in the first direction.

The first-1d interconnection line may include a fourth protrusion.

The fourth protrusion may protrude in the second direction.

The fourth protrusion may overlap the first-1c interconnection line, the first-1b interconnection line, and the first-1a interconnection line in the first direction.

A width ratio of a maximum width of the semiconductor structure in a second direction to a maximum width of the first interconnection line in the second direction, which overlaps the semiconductor structure in the second direction, may be in a range of 1:0.7 to 1:0.9.

The first pad may include a first region, which passes through the first insulating layer and is electrically connected to the first end portion, and a second region which extends from the first region and protrudes on the edge of the substrate.

The semiconductor device package may further include a channel layer disposed to expose portions of the first conductivity-type semiconductor layer and the second conductivity-type semiconductor layer between the substrate and the semiconductor structure.

The first electrode may be disposed on the first conductivity-type semiconductor layer exposed by the channel layer.

The second electrode may be disposed on the second conductivity-type semiconductor layer exposed by the channel layer.

The first pad, the channel layer, and the first end portion may overlap each other at the edge of the substrate in a thickness direction thereof.

The second pad, the channel layer, and the second end portion may overlap each other at the edge of the substrate in a thickness direction thereof.

The first insulating layer may be disposed to cover the channel layer and the second interconnection line.

The plurality of first pads and the plurality of second pads may be disposed along the edge of the substrate.

The plurality of semiconductor devices may be disposed at a central portion of the plurality of first pads and the plurality of second pads.

According to an embodiment of the present invention, a display apparatus includes a semiconductor device package which includes a substrate and a plurality of semiconductor structures disposed on the substrate in a matrix type, a plurality of first interconnection lines electrically connected to the semiconductor structures and disposed in columns, and a plurality of second interconnection lines electrically connected to the semiconductor structures and disposed in rows, a plurality of data lines which are connected to the plurality of first interconnection lines, a plurality of scan lines which are connected to the plurality of second interconnection lines, a first driving unit which is connected to the plurality of data lines to provide a first control signal, a second driving unit which is connected to the plurality of scan lines to provide a second control signal, and a controller which determines the number of time divisions according to input data to provide the first control signal and the second control signal to the first driving unit and the second driving unit.

In the plurality of first interconnection lines, as a length extending in the first direction is increased, an area of a region overlapping the electrically connected semiconductor structure may also be increased.

The semiconductor structure may include a first conductivity-type semiconductor layer, a second conductivity-type semiconductor layer, and an active layer disposed between the first conductivity-type semiconductor layer and the second conductivity-type semiconductor layer. The first interconnection line may include a first through-portion which passes through the active layer, the second conductivity-type semiconductor layer, and the first insulating layer and is electrically connected to the first conductivity-type semiconductor layer, and a first end portion which extends to an edge of the substrate. The second interconnection line may include a second end portion extending to the edge of the substrate.

The first end portion and the second end portion may be disposed to protrude further toward the edge of the substrate than an edge of the semiconductor structure.

A width ratio of a maximum width of the semiconductor structure in a second direction to a maximum width of the first interconnection line in the second direction, which overlaps the semiconductor structure in the second direction, may be in a range of 1:0.7 to 1:0.9.

The display apparatus may further include a channel layer disposed to expose portions of the first conductivity-type semiconductor layer and the second conductivity-type semiconductor layer between the substrate and the semiconductor structure.

The first electrode may be disposed on the first conductivity-type semiconductor layer exposed by the channel layer, and the second electrode may be disposed on the second conductivity-type semiconductor layer exposed by the channel layer.

The semiconductor device package may include a first insulating layer disposed between the first interconnection line and the second interconnection line.

In addition, the semiconductor device package may include a plurality of first pads each electrically connected to the first interconnection line, and a plurality of second pads each electrically connected to the second interconnection line.

The plurality of first pads and the plurality of second pads may be disposed along the edge of the substrate. The plurality of semiconductor devices may be disposed at a central portion of the plurality of first pads and the plurality of second pads.

A cycle of the input data may be one frame. A group scan line may divide and provide a second control signal to each scan line during the cycle. The group scan line may include a number of scan lines equal to the number of the semiconductor structures connected to one data line.

The controller may determine the number of time divisions as follows.

When all of the semiconductor structures are turned on or off, the controller may determine the number of the time divisions as one.

When a signal may be applied to data lines corresponding to the group scan line, the controller may determine the number of the time divisions as one.

The controller may determine the number of time divisions as follows.

When a signal may not be applied to the data lines corresponding to the group scan line, the controller may determine the number of the time divisions as two.

Advantageous Effects

According to embodiments, it is possible to realize a display apparatus which is easy to drive.

In addition, it is possible to manufacture a display apparatus having a reduced resistance.

Furthermore, it is possible to manufacture a display apparatus having uniform current spreading.

In addition, it is possible to manufacture a display apparatus having improved luminous flux.

The various and advantageous advantages and effects of the present invention are not limited to the above description and may be more easily understood in the course of describing specific embodiments of the present invention.

BRIEF DESCRIPTION OF THE DRAWINGS

FIG. 11B is a cross-sectional view taken along line N-N' in FIG. 9.

DETAILED DESCRIPTION

Figure 1:
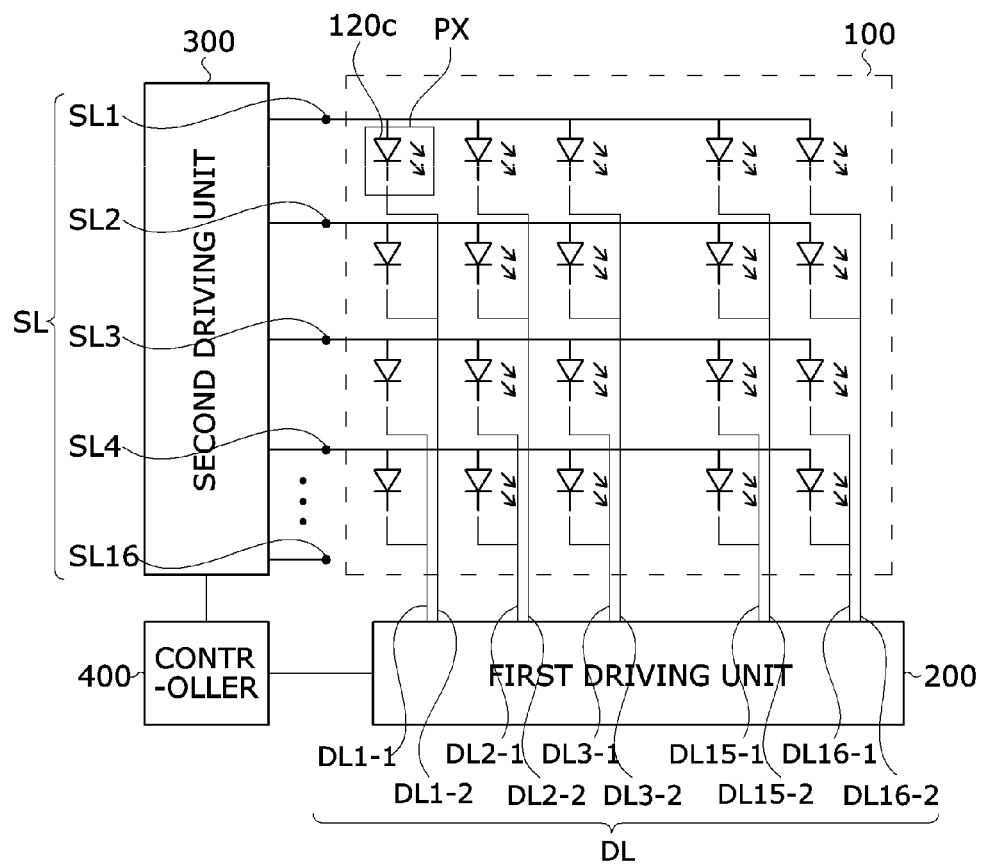
FIG. 1 is a conceptual view illustrating a display apparatus according to an embodiment of the present invention.

While the present invention is open to various modifications and alternative embodiments, specific embodiments thereof will be described and shown by way of example in the accompanying drawings. However, it should be understood that there is no intention to limit the present invention to the particular embodiments disclosed, and, on the contrary, the present invention is to cover all modifications, equivalents, and alternatives falling within the spirit and scope of the present invention.

It should be understood that, although the terms including ordinal numbers such as first, second, and the like may be used herein to describe various elements, the elements are not limited by the terms. The terms are used only for the purpose of distinguishing one element from another. For example, without departing from the scope of the present invention, a second element could be termed a first element, and similarly a first element could be also termed a second element. The term "and/or" includes any one or all combinations of a plurality of associated listed items.

In the case that one component is mentioned as being "connected" or "linked" to another component, it may be connected or linked to the corresponding component directly or other components may be present therebetween. On the other hand, in the case that one component is mentioned as being "directly connected" or "directly linked" to another component, it should be understood that other components are not present therebetween.

It is to be understood that terms used herein are for the purpose of the description of particular embodiments and not for limitation. A singular expression includes a plural expression unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art and should not be interpreted in an idealized or overly formal sense unless expressly defined otherwise herein.

Hereinafter, embodiments will be described in detail with reference to the accompanying drawings, the same or corresponding elements will be given the same reference numbers regardless of drawing symbols, and redundant descriptions will be omitted.

A semiconductor device according to the present embodiment may be a light-emitting device.

In the semiconductor device, electrons and holes recombine to emit light, and a wavelength of the light may be determined by an energy band gap inherent to a material. The emitted light may vary depending on a composition of the material.

Hereinafter, embodiments of the present invention will be described in more detail with reference to the accompanying drawings so as to be easily realized by those skilled in the art.

A semiconductor device according to the present embodiment may be a light-emitting device.

In the semiconductor device, electrons and holes recombine to emit light, and a wavelength of the light may be determined by an energy band gap inherent to a material. The emitted light may vary depending on a composition of the material.

Hereinafter, embodiments of the present invention will be described in more detail with reference to the accompanying drawings so as to be easily realized by those skilled in the art.

FIG. 1 is a conceptual view illustrating a display apparatus according to an embodiment of the present invention.

Referring to FIG. 1, a display apparatus 10 according to the embodiment may include a semiconductor device package 100 including a plurality of semiconductor structures 120, a plurality of data lines DL, a plurality of scan lines SL, a first driving unit 200, a second driving unit 300, and a controller 400.

First, the semiconductor device package 100 may include the plurality of semiconductor structures. Here, each of the plurality of semiconductor structures 120 may be one pixel PX.

The semiconductor device package 100 will be described in detail below with reference to FIGS. 2 to 13B.

The plurality of data lines DL may be electrically connected to first interconnection lines connected to the plurality of semiconductor structures 120. The connection of the plurality of data lines DL to the semiconductor structures 120 may be different according to a driving method of the display apparatus 10. For example, the display apparatus 10 may be driven in a 2-time division manner of passive matrix driving. In this case, each of the plurality of data lines DL may be electrically connected to the first interconnection line connected to two semiconductor structures 120. However, as described above, a connection method of the plurality of data lines DL and the first interconnection lines may be different according to the number of time divisions. For example, in a passive matrix driven in a 4-time division manner, one data line DL may be electrically connected to four semiconductor structures 120 (pixels).

Hereinafter, a structure in which each data line DL is connected to two semiconductor structures 120 will be described with reference to FIGS. 2 to 15. In addition, it will also be mainly described that the display apparatus 10 is driven in a 2-time division manner (when the number of time divisions is two).

In addition, the plurality of data lines DL may apply currents to the semiconductor structures according to signals provided from the first driving unit 200. A plurality of switches (not shown) may be disposed in the plurality of data lines DL, and the first driving unit 200 may provide control signals for switching (turning on or off) the plurality of switches (not shown) to the plurality of switches (not shown). The control signal may be a pulse width modulation (PWM)-type signal. However, the present invention is not limited to such a type.

In addition, the plurality of switches (not shown) may include transistors, for example, field-effect transistors (FETs). Accordingly, the first driving unit 200 may control the plurality of switches (not shown) by adjusting gate voltages applied to the plurality of switches (not shown). However, the present invention is not limited to such a type.

The plurality of scan lines SL may be electrically connected to second interconnection lines connected to the plurality of semiconductor structures 120. Similar to the data lines DL described above, the connection of the plurality of scan lines SL to the semiconductor structures 120 may be different according to a driving method of the display apparatus 10. For example, the display apparatus 10 may be driven in a 2-time division manner of passive matrix driving. In this case, each of the plurality of scan lines SL may be electrically connected to the second interconnection line connected to the plurality of semiconductor structures 120. However, as described above, a connection method of the plurality of data lines DL and the second interconnection lines may be different according to the number of time divisions.

Hereinafter, a structure in which each scan line SL is connected to two semiconductor structures 120 will be described with reference to FIGS. 2 to 15. In addition, it will also be mainly described that the display apparatus 10 is driven in a 2-time division manner (when the number of time divisions is two).

In addition, the plurality of scan lines SL may apply currents to the semiconductor structures according to signals provided from the second driving unit 300. A plurality of switches (not shown) may be disposed in the plurality of scan lines SL, and the second driving unit 300 may provide control signals for switching (turning on or off) the plurality of switches (not shown) to the plurality of switches (not shown). The control signal may be a PWM-type signal. However, the present invention is not limited to such a type.

In addition, the plurality of switches (not shown) may include transistors, for example, FETs. Accordingly, the second driving unit 300 may control the plurality of switches (not shown) by adjusting gate voltages applied to the plurality of switches (not shown). However, the present invention is not limited to such a type.

Specifically, the plurality of data lines DL may be electrically connected to a first conductivity-type semiconductor layer of the semiconductor structure 120 through the first interconnection lines, and the plurality of scan lines SL may be electrically connected to a second conductivity-type semiconductor layer of the semiconductor structure 120 through the second interconnection lines. Due to such a configuration, the plurality of data lines DL and the plurality of scan lines SL may inject currents into the plurality of semiconductor structures 120, and thus, the plurality of semiconductor structures 120 may emit light.

That is, the display apparatus 10 according to the embodiment may control the PWM signals provided to the data lines DL and the scan lines SL through the first driving unit 200 and the second driving unit 300, thereby controlling light emission of the plurality of semiconductor structures 120.

The controller 400 may provide control signals to the first driving unit 200 and the second driving unit 300. The controller 400 may determine the number of time divisions for image data input in one frame and may provide control signals corresponding to the determined number of time divisions to the first driving unit 200 and the second driving unit 300. Due to such a configuration, the display apparatus 10 according to the embodiment may change the number of time divisions according to image data. This will be described in detail below with reference to FIGS. 12 to 18.

Figure 2:
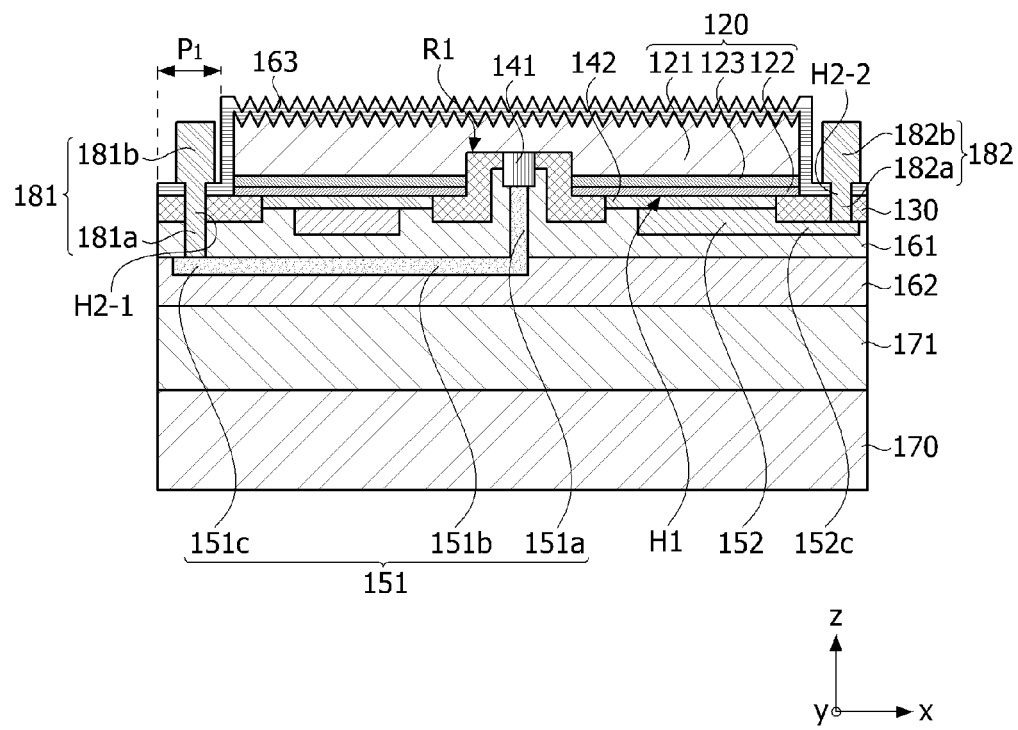
FIG. 2 is a cross-sectional view of a semiconductor device package according to an embodiment.

FIG. 2 is a cross-sectional view of a semiconductor device package according to an embodiment.

Referring to FIG. 2, a semiconductor device package 100 according to the embodiment may include a substrate 170, a bonding layer 171, a semiconductor structure 120, a channel layer 130, a first electrode 141, a second electrode 142, a first interconnection line 151, a second interconnection line 152, a first insulating layer 161, a second insulating layer 162, a passivation layer 163, a first pad 181, and a second pad 182. In addition, the semiconductor structure 120 may be disposed on the substrate 170.

Figure 4:
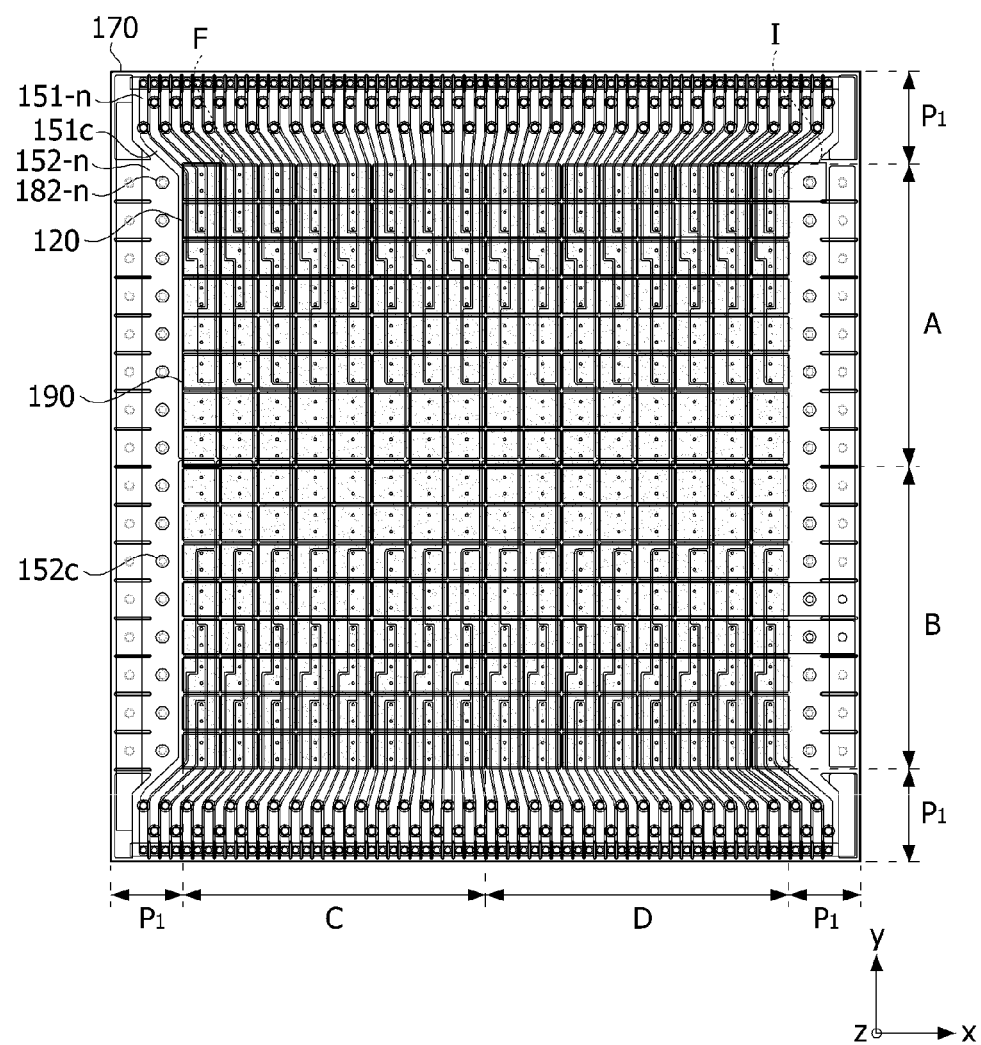
FIG. 4 is a plan view of a semiconductor device package according to an embodiment.

Here, it will be described below that FIG. 2 illustrates one semiconductor structure 120 disposed between the first pad 181 and the second pad 182 for convenience of description. However, as shown in FIG. 4, substantially, a plurality of semiconductor structures 120 (see FIG. 2) may be disposed to be spaced apart from each other by a predetermined distance on the substrate 170, and the first pad 181 and the second pad 182 may be disposed to surround an edge of the substrate 170.

First, the substrate 170 may serve to support the semiconductor structure 120. The substrate 170 may include a material having a heat dissipation property. Therefore, a heat dissipation property may be improved through the substrate 170. For example, the substrate 170 may include ceramic, but the present invention is not limited thereto. In particular, since a manufacturing process, package mounting, and heat dissipating of the semiconductor device package 100 are easily performed due to the substrate 170, reliability of an apparatus can be improved. However, the present invention is not necessarily limited thereto, and the substrate 170 may be a metal substrate made of various materials.

The bonding layer 171 may bond the substrate 170 and the semiconductor structure 120. In other words, the semiconductor structure 120 and structures positioned below the semiconductor structure 120 may be disposed on the substrate 170 by the bonding layer 171. The bonding layer 171 may be made of at least one selected from among AuSn, NiSn, AuIn, CuSn, $SiO_2$, and a resin, but the present invention is not limited thereto. For example, the bonding layer 171 may include a barrier metal or a bonding metal and may include, for example, at least one selected from among titanium (Ti), gold (Au), tin (Sn), nickel (Ni), chromium (Cr), gallium (Ga), indium (In), bismuth (Bi), copper (Cu), silver (Ag), and tantalum (Ta).

The semiconductor structure 120 may be disposed on the substrate 170. The semiconductor structure 120 may include a first conductivity-type semiconductor layer 121, a second conductivity-type semiconductor layer 122, and an active layer disposed between the first conductivity-type semiconductor layer 121 and the second conductivity-type semiconductor layer 122. In the drawing, the first conductivity-type semiconductor layer 121 is illustrated as facing upward and the second conductivity-type semiconductor layer 122 is illustrated as facing the substrate 170, but the present invention is not limited thereto.

The first conductivity-type semiconductor layer 121 may be implemented using at least one selected from among a III-V group compound semiconductor, a II-VI group compound semiconductor, and the like. The first conductivity-type semiconductor layer 121 may be made of a semiconductor material having an empirical formula of $In_xAl_yGa_{1-x-y}N$ ($0 \leq x \leq 1$, $0 \leq y \leq 1$, and $0 \leq x+y \leq 1$) or may be made of a material selected from among AlInN, AlGaAs, GaP, GaAs, GaAsP, and AlGaInP. The first conductivity-type semiconductor layer 121 may be doped with a first dopant. The first dopant may be an n-type dopant such as silicon (Si), germanium (Ge), Sn, selenium (Se), or tellurium (Te). That is, the first conductivity-type semiconductor layer 121 may be an n-type semiconductor layer doped with an n-type dopant.

Meanwhile, an uneven structure may be formed on the first conductivity-type semiconductor layer 121. The uneven structure can improve light extraction efficiency of the semiconductor structure 120.

The second conductivity-type semiconductor layer 122 may be implemented using at least one selected from among a III-V group compound semiconductor, a II-VI group compound semiconductor, and the like. The second conductivity-type semiconductor layer 122 may be made of a semiconductor material having an empirical formula of $In_xAl_yGa_{1-x-y}N$ ($0 \leq x \leq 1$, $0 \leq y \leq 1$, and $0 \leq x+y \leq 1$) or may be made of a material selected from among AlInN, AlGaAs, GaP, GaAs, GaAsP, and AlGaInP. The second conductivity-type semiconductor layer 122 may be doped with a second dopant. The second dopant may be a p-type dopant such as magnesium (Mg), zinc (Zn), calcium (Ca), strontium (Sr), or barium (Ba). That is, the second conductivity-type semiconductor layer 122 may be a p-type semiconductor layer doped with a p-type dopant.

The active layer 123 may be disposed between the first conductivity-type semiconductor layer 121 and the second conductivity-type semiconductor layer 122. The active layer 123 is a layer in which electrons (or holes) injected through the first conductivity-type semiconductor layer 121 meet holes (or electrons) injected through the second conductivity-type semiconductor layer 122. As electrons and holes are recombined to transition to a low energy level, the active layer 123 may generate light having a wavelength corresponding thereto.

The active layer 123 may have any one of a single well structure, a multi well structure, a single quantum well structure, a multi quantum well (MQW) structure, a quantum dot structure, and a quantum line structure, but the present invention is not limited thereto. When the active layer 123 is formed in a well structure, a well layer/barrier layer of the active layer 123 may be formed to include at least one pair structure selected from among InGaN/GaN, InGaN/InGaN, GaN/AlGaN, InAlGaN/GaN, GaAs(In-GaAs)/AlGaAs, and GaP(InGaP)/AlGaP, but the present invention is not limited thereto. The well layer may include a material having a narrower band gap than the barrier layer.

Meanwhile, the semiconductor structure 120 may include a first recess R1 having a predetermined depth. Specifically, the first recess R1 may be formed through mesa etching so as to pass through the second conductivity-type semiconductor layer 122 and the active layer 123 and extend to a partial region of the first conductivity-type semiconductor layer 121. Accordingly, a portion of the first conductivity-type semiconductor layer 121 may be exposed. Therefore, the first electrode 141 and the first interconnection line 151 may be electrically connected to the first conductivity-type semiconductor layer 121 through the first recess R1.

The channel layer 130 may be disposed in a partial region of a lower portion of the semiconductor structure 120. In addition, the channel layer 130 may be disposed to surround an edge of a lower portion of each semiconductor structure 120. The channel layer 130 may be partially disposed below the first recess R1. In addition, the channel layer 130 may be disposed between the substrate 170 and the semiconductor structure 120.

Specifically, the channel layer 130 may cover the first recess R1, and a side surface of the active layer 123, a portion of the first conductivity-type semiconductor layer 121, and a portion of the second conductivity-type semiconductor layer 122, which are exposed by the first recess R1. In this case, the channel layer 130 may be disposed such that a portion of the first conductivity-type semiconductor layer 121 is exposed in the first recess R1. Similarly, the channel layer 130 may be disposed such that a portion of the second conductivity-type semiconductor layer 122 is exposed. The channel layer 130 may be disposed between adjacent semiconductor structures 120, between the first pads 181 connected to the semiconductor structures 120, and between the second pads 182 connected to the semiconductor structures 120. In addition, the channel layer 130 may cover a portion of the second conductivity-type semiconductor layer 122. For example, the channel layer 130 may expose a portion of the second conductivity-type semiconductor layer 122 through a first hole H1.

The channel layer 130 may be made of an insulating material. Specifically, the channel layer 130 may be made of a non-conductive oxide or nitride. For example, the channel layer 130 may be formed as one selected from among a silicon oxide ($SiO_2$) layer, a silicon nitride ($Si_3N_4$) layer, a titanium oxide ($TiO_x$), and an aluminum oxide ($Al_2O_3$) layer, but the present invention is not limited thereto.

The channel layer 130 may allow the semiconductor structure 120 to be electrically connected only through the first interconnection line 151 and the second interconnection line 152 and provide structural insulation between adjacent semiconductor structures 120. In addition, the channel layer 130 may protect the second electrode 142, the first insulating layer 161, the second insulating layer 162, the bonding layer 171, and the substrate 170, which are disposed below the channel layer 130 and the semiconductor structure 120, from external contaminants or the like. As a result, a supporting force for the semiconductor structure 120 can be improved, and thus the channel layer 130 can protect the semiconductor structure 120 from damage that may occur in a manufacturing process.

The first electrode 141 may be disposed on the first conductivity-type semiconductor layer 121 and electrically connected to the first conductivity-type semiconductor layer 121. A second electrode 142 may be disposed on the second conductivity-type semiconductor layer 122 and electrically connected to the second conductivity-type semiconductor layer 122.

Specifically, the first electrode 141 may be disposed in the first recess R1. The first electrode 141 may be disposed in a region exposed by the channel layer 130 in the first recess R1.

The second electrode 142 may be disposed on the second conductivity-type semiconductor layer 122 exposed by the channel layer 130 in the first hole H1.

The first electrode 141 and the second electrode 142 may be made of a material having electrical conductivity. In addition, the first electrode 141 and the second electrode 142 may be made of a material having high reflectivity. For example, the first electrode 141 and the second electrode 142 may be made of at least one selected from among Ti, ruthenium (Ru), rhodium (Rh), iridium (Ir), Mg, Zn, aluminum (Al), indium (In), tantalum (Ta), palladium (Pd), cobalt (Co), Ni, Si, germanium (Ge), Ag, platinum (Pt), and Au, or an alloy thereof. In this case, light generated from the semiconductor structure 120 may be reflected from the first electrode 141 and the second electrode 142 and emitted upward. As a result, light extraction efficiency of the semiconductor structure can be improved. However, the present invention is not necessarily limited to such materials.

In addition, various materials for an ohmic contact may be included in the first electrode 141 and the second electrode 142.

The first insulating layer 161 may protect components of the semiconductor device package 100 and may electrically insulate adjacent components from each other. As the first insulating layer 161, an insulating layer having high transmittance may be used. For example, the first insulating layer 161 may be made of at least one selected from among $SiO_2$, $Si_xO_y$, $Si_3N_4$, $Si_xN_y$, $SiO_xN_y$, $TiO_2$, $ZrO_2$, $Si_3N_4$, $Al_2O_3$, AlN, and $MgF_2$, but the present invention is not limited to such materials. The first insulating layer 161 may cover a portion of the first electrode 141 to expose a partial region of the first electrode 141. The first insulating layer 161 may be disposed below the second electrode 142, the channel layer 130, and the second interconnection line 152 to cover the second electrode 142 and the channel layer 130. Due to such a configuration, the first insulating layer 161 may provide electrical insulation between the first interconnection line 151 and the second interconnection line 152.

The second insulating layer 162 may be disposed below the first insulating layer 161 and the first interconnection line 151. The second insulating layer 162 may cover the first interconnection line 151 and the first insulating layer 161. Due to such a configuration, the second insulating layer 162 may electrically insulate the first interconnection line 151 from the outside and protect the first interconnection line 151 from contaminants. As a result, the second insulating layer 162 can improve reliability of the semiconductor device package.

The passivation layer 163 may be disposed on an upper portion of the semiconductor device package. That is, the passivation layer 163 may be disposed on the semiconductor structure 120 and, specifically, the first conductivity-type semiconductor layer 121. In addition, when the first conductivity-type semiconductor layer 121 has an uneven structure, the passivation layer 163 disposed on the first conductivity-type semiconductor layer 121 may have an uneven structure like the first conductivity-type semiconductor layer 121.

The passivation layer 163 may be disposed on an upper surface of the semiconductor device package 100, but the present invention is not limited thereto. For example, a portion of the first pad 181 and a portion of the second pad 182 may be disposed at a higher level than the passivation layer 163 through a second-first hole H2-1 and a second-second hole H2-2, respectively.

The first interconnection line 151 may be electrically connected to the first electrode 141. The second interconnection line 152 may be electrically connected to the second electrode 142.

The first interconnection line 151 may be electrically connected to the first electrode 141 and may extend to one side of the semiconductor structure 120 to be connected to the first pad 181.

In addition, the second interconnection line 152 may be electrically connected to the second electrode 142 and may extend to the other side of the semiconductor structure 120 to be electrically connected to the second pad 182.

The first interconnection line 151 and the second interconnection line 152 may extend in different directions on the substrate 170. For example, extending directions of the first interconnection line 151 and the second interconnection line 152 may be perpendicular to each other. This will be described in detail below with reference to FIG. 4.

Specifically, the second interconnection line 152 may be disposed between the semiconductor structure 120 and the substrate 170. In addition, the second interconnection line 152 may be disposed on the second electrode 142 and electrically connected to the second electrode 142. The second interconnection line 152 may extend from the second electrode 142 in a direction toward an outer side surface of the semiconductor structure 120. For example, the second interconnection line 152 may include a second end portion 152c that extends to protrude further than the outer side surface of the semiconductor structure 120. In other words, one end portion of the second interconnection line 152 may be connected to the second electrode 142. The second end portion 152c of the second interconnection line 152 may extend from one end portion of the second interconnection line 152 toward the edge of the substrate 170. Accordingly, the second end portion 152c may be electrically connected to the second pad 182 which will be described below. In this case, the second end portion 152c may be disposed to protrude further than the side surface of the semiconductor structure 120 below the semiconductor structure 120. Due to such a configuration, the second interconnection line 152 may be easily connected to the second pad 182 disposed at a side portion of the semiconductor structure 120.

That is, as shown in FIG. 4 below, the second end portion 152c of the second interconnection line 152 may be disposed to protrude further toward the edge of the substrate 170 than an edge of the semiconductor structure 120. That is, the edge of the semiconductor structure 120 may be etched, and thus, the semiconductor structure 120 may be disposed only at a central portion of the substrate (crossing region of regions A and B, regions C and D, and regions E and F). Accordingly, the semiconductor structure 120 may expose the second end portion 152c disposed at the edge of the substrate. The second pad 182 may pass through the channel layer 130 to be electrically connected to the second pad 182. Therefore, the second end portion 152c of the second interconnection line 152 and the second pad 182 may overlap each other in a thickness direction of the substrate 170 at the edge of the substrate 170.

The first interconnection line 151 may be disposed on the first electrode 141 between the semiconductor structure 120 and the substrate 170. In addition, the first interconnection line 151 may extend from the first electrode 141 in a direction toward the edge of the semiconductor structure 120.

The first interconnection line 151 may include a first through-portion 151a, a first connection portion 151b, and a first end portion 151c. The first interconnection line 151 may be spaced apart and insulated from the second interconnection line 152 by the first insulating layer 161.

The first through-portion 151a may pass through the active layer 123, the second conductivity-type semiconductor layer 122, and the first insulating layer 161. In addition, the first through-portion 151a may pass through a portion of the first conductivity-type semiconductor layer 121.

One end of the first through-portion 151a may be connected to the first electrode 141. The first through-portion 151a may extend from the first electrode 141 toward the substrate 170. The other end of the first through-portion 151a may be connected to one end of the first connection portion 151b.

The first connection portion 151b may extend from one end thereof toward the edge of the substrate 170 along one surface of the first insulating layer 161. The other end of the first connection portion 151b may be connected to one end of the first end portion 151c.

The first end portion 151c may protrude further than the outer side surface of the semiconductor structure 120. That is, the first end portion 151c may extend toward the edge of the substrate 170. Accordingly, a portion of the first end portion 151c may overlap an edge P1 of the substrate 170 in a thickness direction thereof. Therefore, the first interconnection line 151 may be easily connected to the first pad 181 disposed at the side portion of the semiconductor structure 120.

That is, as shown in FIG. 4 to be described below, the first end portion 151c of the first interconnection line 151 may be disposed to protrude further toward the edge of the substrate 170 than the edge of the semiconductor structure 120. Accordingly, the first end portion 151c of the first interconnection line 151, the channel layer 130, and the first pad 181 may overlap each other at the edge of the substrate 170 in a direction perpendicular to the substrate 170.

The first pad 181 and the second pad 182 may be disposed to be spaced apart from the semiconductor structure 120 on the substrate 170. Specifically, the first pad 181 and the second pad 182 may be disposed to surround the semiconductor structure 120 at the side portion of the semiconductor structure 120 or the edge of the substrate 170.

The first pad 181 may be electrically connected to the first conductivity-type semiconductor layer 121 through the first interconnection line 151 and the first electrode 141. The second pad 182 may be electrically connected to the second conductivity-type semiconductor layer 122 through the second interconnection line 152 and the second electrode 142.

The first pad 181 may include a first region 181a and a second region 181b.

First, one end of the first region 181a may be connected to the other end of the first end portion 151c. The first region 181a may pass through the first insulating layer 161, the channel layer 130, and the passivation layer 163.

The second region 181b may be disposed to protrude from the passivation layer 163. The first pad 181 may be disposed to be spaced apart from the semiconductor structure 120. In particular, the first pad 181 may be disposed to be spaced apart from the side surface of the semiconductor structure 120 and the passivation layer 163 covering the side surface, but the present invention is not limited thereto.

The second pad 182 may include a first region 182a and a second region 182b.

First, the first region 182a may pass through the channel layer 130 and the passivation layer 163. One end of the first region 182a may be connected to the other end of the second end portion 152c of the second interconnection line 152.

One end of the second region 182b may be connected to the other end of the second end portion 152c. The second region 182b may be disposed to protrude from the passivation layer 163. The second pad 182 may be disposed to be spaced apart from the semiconductor structure 120. In particular, the second pad 182 may be disposed to be spaced apart from the side surface of the semiconductor structure 120 and the passivation layer 163 covering the side surface.

Figure 3:
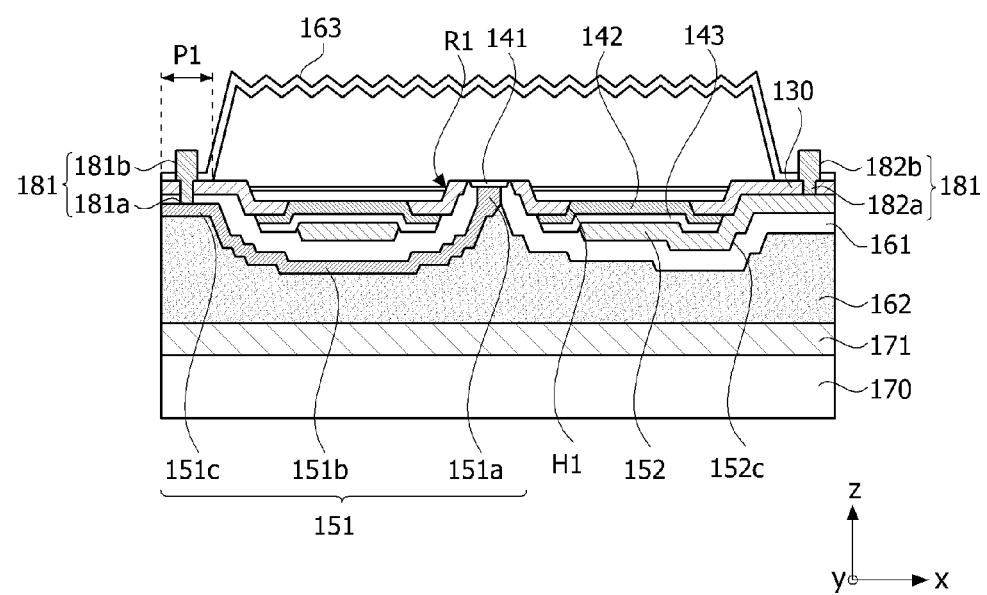
FIG. 3 is a modified example of FIG. 2.

FIG. 3 is a modified example of FIG. 2.

Referring to FIG. 3, the substrate 170, the bonding layer 171, the semiconductor structure 120, the channel layer 130, the first electrode 141, the second electrode 142, the first interconnection line 151, the second interconnection line 152, the first insulating layer 161, the second insulating layer 162, the passivation layer 163, the first pad 181, and the second pad 182, which have been described in the semiconductor device package according to the above-described embodiment, may be equally applied to the modified example. That is, a semiconductor device package according to the modified example may further include a reflective layer 143 in addition to the components of the semiconductor device package described above with reference to FIG. 2.

In this case, the reflective layer 143 may be disposed below the second electrode 142. More specifically, the reflective layer 143 may be positioned between the second electrode 142 and an interconnection line (for example, the first interconnection line 152).

The reflective layer 143 may be made of a material having electrical conductivity. In addition, the reflective layer 143 may be made of a metal material having high reflectivity. The reflective layer 143 may be made of a metal or an alloy including at least one selected from among Ag, Ni, Al, Rh, Pd, Ir, Ru, Mg, Zn, Pt, Cu, Au, and hafnium (Hf). In addition, the reflective layer 143 may be made of the metal or alloy. For example, the reflective layer 143 may include at least one selected from among Ag, Al, a Ag—Pd—Cu alloy, and a Ag—Cu alloy, but the present invention is not limited to such materials.

Figure 5:
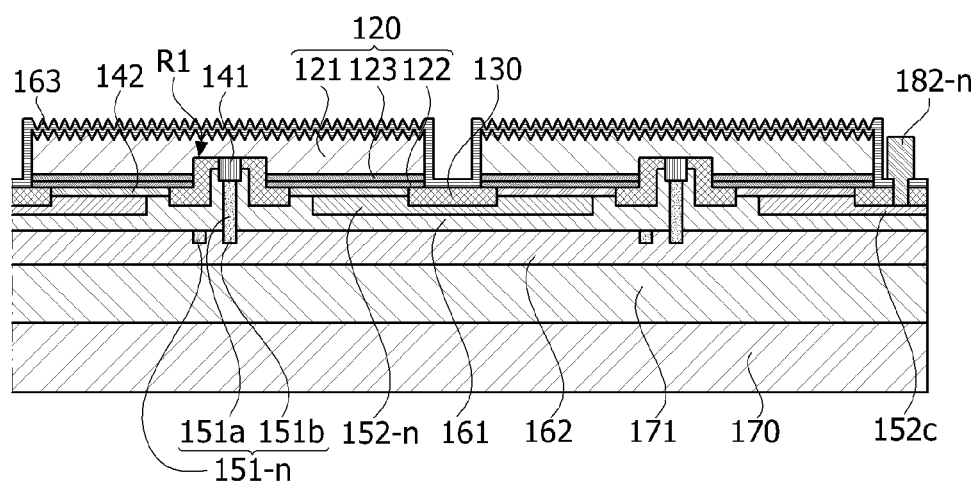
FIG. 5 is a cross-sectional view of region I in FIG. 4.
Figure 6:
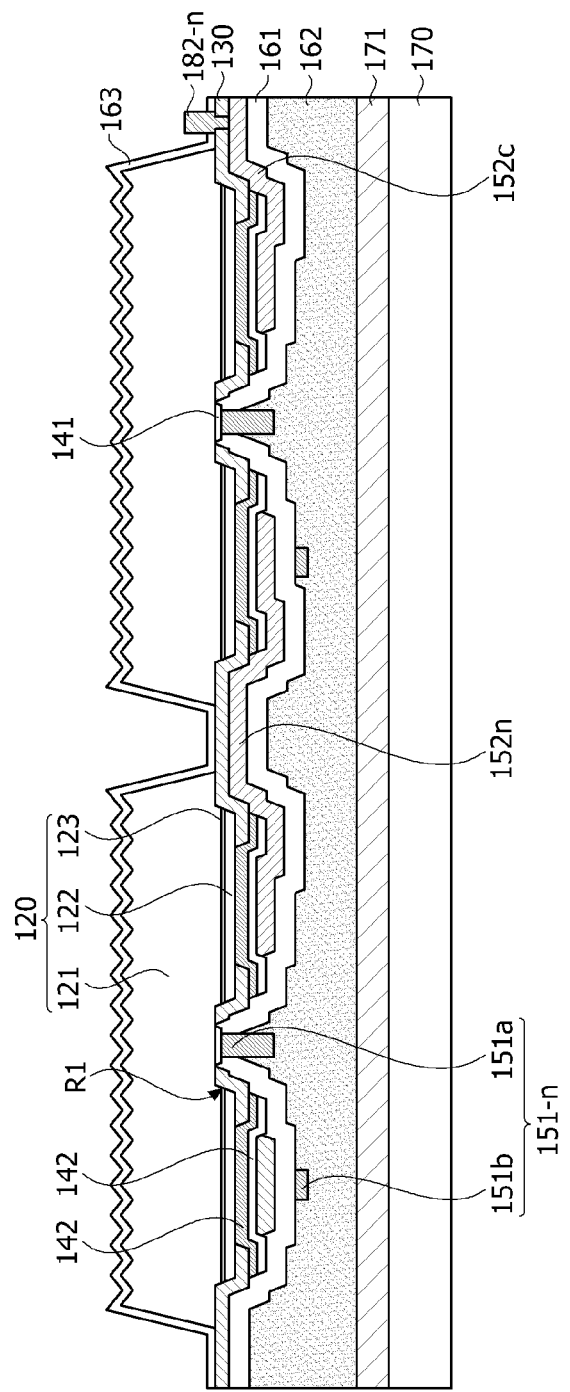
FIG. 6 is a modified example of FIG. 5.
Figure 7:
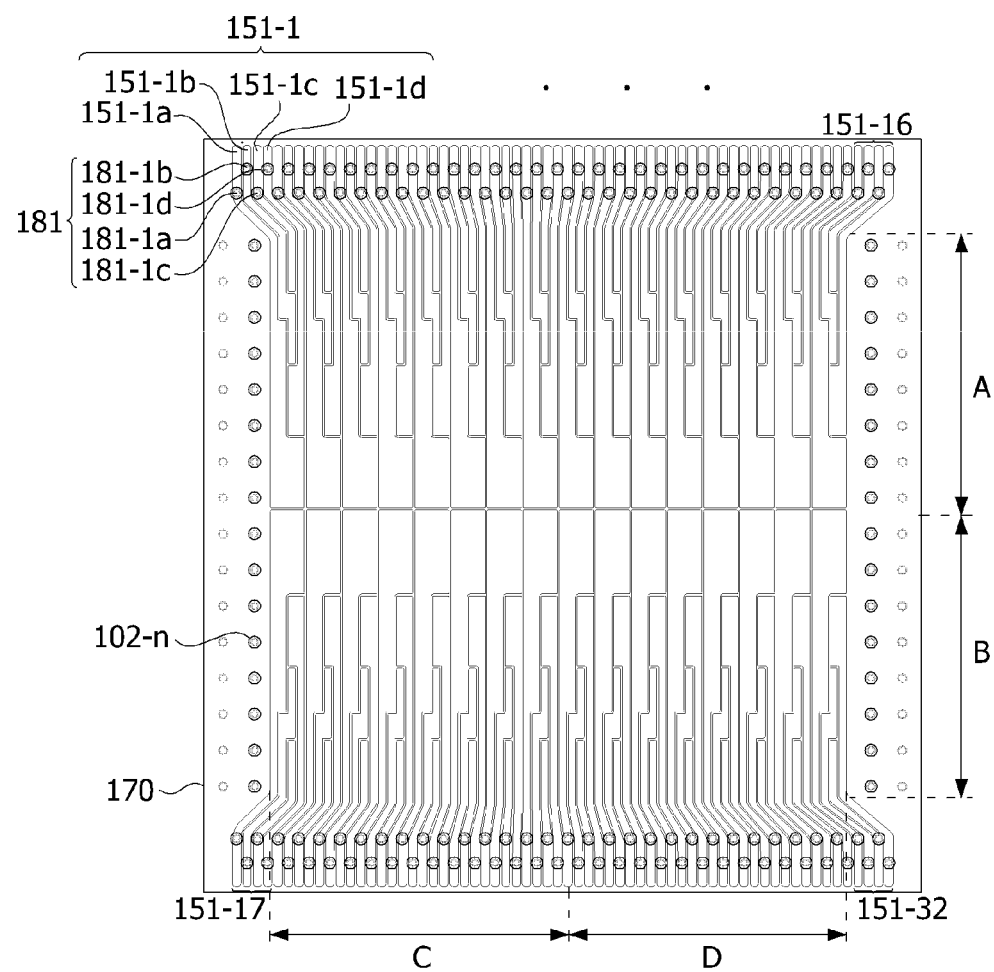
FIG. 7 is a view illustrating a first interconnection line in FIG. 4.
Figure 8:
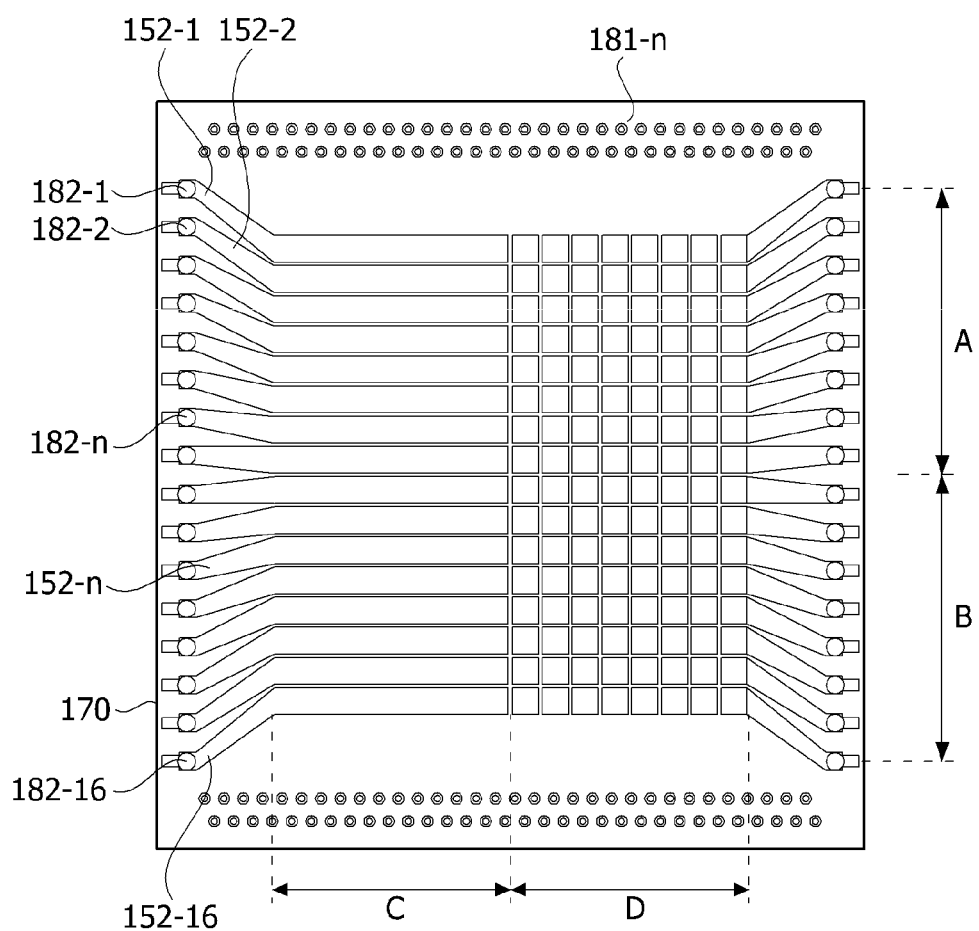
FIG. 8 is a view illustrating a second interconnection line in FIG. 4.

FIG. 4 is a plan view of a semiconductor device package according to an embodiment, and FIG. 5 is a cross-sectional view of region I in FIG. 4. FIG. 6 is a modified example of FIG. 5. FIG. 7 is a view illustrating a first interconnection line in FIG. 4, and FIG. 8 is a view illustrating a second interconnection line in FIG. 4.

Referring to FIG. 4, a semiconductor device package 100 according to the embodiment may include a plurality of semiconductor structures 120 disposed on one substrate 170.

Specifically, the semiconductor device package 100 may include the plurality of semiconductor structures 120 (see FIG. 2), a plurality of first interconnection lines 151-$n$, and a plurality of second interconnection lines 152-$n$, a plurality of first pads 181-$n$, and a plurality of second pads 182-$n$ on the substrate 170.

In FIG. 4, it has been described that one semiconductor structure 120, one first interconnection line 151, one second interconnection line 152, one first pad 181, and one second pad 182 are illustrated for convenience of description.

Specifically, the plurality of first pads 181-$n$ and the plurality of second pads 182-$n$ may be disposed to be spaced apart from the plurality of semiconductor structures 120. The plurality of first pads 181-$n$ and the plurality of second pads 182-$n$ may be disposed at an edge of the substrate 170 to surround the plurality of semiconductor structures 120.

The first interconnection lines 151-$n$ may be disposed between the semiconductor structures 120 and the plurality of first pads 181-$n$ to electrically connect first conductivity-type semiconductor layers of the semiconductor structures 120 and the plurality of first pads 181-$n$.

Similarly, the second interconnection lines 152-$n$ may be disposed between the semiconductor structures 120 and the plurality of second pads 182-$n$ to electrically connect second conductivity-type semiconductor layers of the semiconductor structures 120 and the plurality of second pads 182-$n$.

The first pads 181-$n$ may be disposed at upper and lower portions of the edge of the substrate 170 to face each other. The second pads 182-$n$ may be disposed on left and right portions of the edge of the substrate 170 to face each other. However, in some cases, the position and arrangement structure of the first pads 181-$n$ and the second pads 182-$n$ may be changed.

First, the substrate 170 may be divided into central portions A, B, C, and D and an edge P1. For example, the central portions A, B, C, and D may be central regions of the substrate in which the semiconductor structures are disposed. In addition, the first interconnection lines 151-$n$ and the second interconnection lines 152-$n$ are disposed at the central portions A, B, C, and D and may be electrically connected to the plurality of semiconductor structures.

The edge P1 may be a region excluding the central portions A, B, C, and D, and the plurality of first pads 181-$n$ and the plurality of second pads 182-$n$ may be disposed thereat. In addition, the first interconnection lines 151-$n$ and the second interconnection lines 152-$n$ may be partially disposed at the edge P1.

Accordingly, the first interconnection line 151-$n$ and the second interconnection line 152-$n$ may be electrically connected to the first pad 181-$n$ and the second pad 182-$n$ at the edge P1, respectively, and may include regions that overlap each other in a thickness direction thereof.

The plurality of semiconductor structures may be disposed to be spaced apart from each other by a predetermined distance at the central portion of the substrate 170 and may emit light. Here, 16 semiconductor structures 120 are illustrated as being disposed in each of horizontal and vertical directions, but the present invention is not limited thereto. Each semiconductor structure may have a size of 500 μm×500 μm or less. That is, each of a width and a length of the semiconductor structure may be 500 μm or less. For example, the size of the semiconductor structure may be 300 μm×300 μm, 250 μm×250 μm, or 110 μm×110 μm. More preferably, each of the width and the length of the individual semiconductor structure may be in a range of 70 μm to 80 μm. However, the present invention is not limited thereto.

In the plurality of semiconductor structures, lines 1 to 8 are defined as region A and lines 9 to 16 are defined as region B from the top of the substrate 170. In addition, in the plurality of semiconductor structures, 1 to 8 lines are defined as region C and 9 to 16 lines are defined as region D from the left of the substrate 170.

Specifically, referring to FIGS. 5 and 6, as described above, a second end portion 152c may protrude further outward than an extension line of a side surface of the semiconductor structure 120. The second end portion 152c may be electrically connected to the second pad 182-n.

Meanwhile, the first interconnection lines 151-n and the second interconnection lines 152-n may be electrically connected to the plurality of semiconductor structures 120. Although only two semiconductor structures 120 are illustrated in the drawings, substantially, as shown in FIG. 3, the plurality of semiconductor structures 120 may be disposed.

A first connection portion 151b of the first interconnection line 151-n may be disposed along one surface of the first insulating layer 161 between the substrate 170 and the plurality of semiconductor structures 120. A first through-portion 151a may extend from each semiconductor structure 120 to electrically connect the plurality of semiconductor structures 120 and one first connection portion 151b.

Meanwhile, four first interconnection lines 151-n may be disposed below one semiconductor structure 120 disposed at an outermost side.

In addition, one second interconnection line 152-n may be disposed along one surfaces of the plurality of second electrodes 142 between the substrate 170 and the plurality of semiconductor structures 120.

First, referring to FIG. 4, the plurality of first interconnection lines 151-n (n=1) may be disposed at the edge P1 of the substrate 170. In this case, one first-nth interconnection line 151-n may be electrically connected to eight semiconductor structures 120. Accordingly, 64 first interconnection lines 151-n may be disposed on each of upper and lower sides of the substrate 170. That is, four first-n$^{th}$ interconnection lines 151-n may be disposed below one semiconductor structure 120. However, this is merely an example for describing the present invention, and the present invention is not limited thereto. That is, the number of the semiconductor structures 120 connected to one first-n$^{th}$ interconnection line 151-n and the number of the first-n$^{th}$ interconnection lines 151-n disposed below one semiconductor structure 120 may be changed. Hereinafter, for convenience of description, the first-n$^{th}$ interconnection lines 151-n connected to the semiconductor structures 120 of region A are defined as a first-first interconnection line 151-1, a first-second interconnection line 151-2, . . . and a first-32$^{th}$ interconnection line 151-32 in order from the left.

For example, the first-first interconnection line 151-1 may be electrically connected to eight semiconductor structures 120 disposed in a first column at a left side of region A. Here, a column is defined as a vertical line in a first direction (y-axis direction) in the substrate 170, and a row is defined as a horizontal line in a second direction (x-axis direction) in the substrate 170.

Referring to FIGS. 7 and 8, the first-first interconnection line 151-1 may include a first-1a interconnection line 151-1a, a first-1b interconnection line 151-1b, a first-1c interconnection line 151-1c, and a first-1d interconnection line 151-1d.

In addition, the first-first interconnection line 151-1 may be electrically connected to the eight semiconductor structures disposed in the first column at the left side of region A. Similarly, the first-second interconnection line 151-2 may be electrically connected to eight semiconductor structures disposed in a second column at the left side of region A, and the same may be applied up to the first-32$^{th}$ interconnection line 151-32. On the other hand, the first-17$^{th}$ to first-32$^{th}$ interconnection lines 151-17 to 151-32 may be electrically connected to semiconductor structures of region C and region D.

The plurality of second interconnection lines 152-n (n=1) may be disposed at left and right sides of the edge P1 of the substrate 170. In this case, one second-nth interconnection line 152-n may be electrically connected to eight semiconductor structures.

16 second-n$^{th}$ interconnection lines 152-n may be disposed at each of left and right sides of the substrate 170. That is, unlike the first-n$^{th}$ interconnection line 151-n, one second-n$^{th}$ interconnection line 152-n may be disposed below one semiconductor structure 120. However, this is merely an example for describing the present invention, and the present invention is not limited thereto. That is, the number of the semiconductor structures connected to one second-n$^{th}$ interconnection line 152-n and the number of the second-n$^{th}$ interconnection lines 152-n disposed below one semiconductor structure may be changed.

Hereinafter, for convenience of description, the second interconnection lines 152-n disposed at the left side of the substrate 170 are defined as a second-first interconnection line 152-1, a second-second interconnection line 152-2, . . . and a second-16$^{th}$ interconnection line 152-16 in order from the top. Similarly, the second interconnection lines 152-n disposed at the right side of the substrate 170 may include second-17$^{th}$ to second-32$^{th}$ interconnection lines 152-17 to 152-32 in order from the top.

The second-first interconnection line 152-1 may be electrically connected to eight semiconductor structures disposed in a first row of an upper side of region C. Specifically, the second-first interconnection line 152-1 may be electrically connected to second conductivity-type semiconductor layers of the eight semiconductor structures disposed in the first row of the upper side.

Similarly, the second-second interconnection line 152-2 may be electrically connected to eight semiconductor structures disposed in a second row of the upper side of region C. The same may be applied up to the second-16$^{th}$ interconnection line 152-16.

In addition, the same may be applied to region D. That is, the second-n$^{th}$ interconnection lines 152-n may be electrically connected to eight semiconductor structures. For example, one second-n$^{th}$ interconnection line 152-n may be electrically connected to eight semiconductor structures in each row of region D in order from the top of the substrate 170.

As described above, the first-n$^{th}$ interconnection lines 151-n may each be electrically connected to eight semiconductor structures in region A and region B (or region C and region D) in order from the left.

In addition, the second-n$^{th}$ interconnection lines 152-n may each be electrically connected to eight semiconductor structures in region C and region D in order from the top.

The plurality of first pads 181-n (n=1) may be disposed at the upper and lower sides of the edge P1 of the substrate 170. In this case, four first-n$^{th}$ pads 181-n may be disposed on the first interconnection line 151-n. That is, a total of 128 first-n$^{th}$ pads 181-n may be disposed with respect to 32 first interconnection lines 151-n.

For example, a first-first pad 181-1 may include a first-1a pad 181-1a, a first-1b pad 181-1b, a first-1c pad 181-1c, and a first-1d pad 181-1d which are disposed in order from the left at the upper side of the substrate 170. The first-1a pad 181-1a, the first-1b pad 181-1b, the first-1c pad 181-1c, and the first-1d pad 181-1d may be electrically connected to the first-1a interconnection line 151-1a, the first-1b interconnection line 151-1b, the first-1c interconnection line 151-1c, and the first-1d interconnection line 151-1d, respectively.

The first-1a interconnection line 151-1a, the first-1b interconnection line 151-1b, the first-1c interconnection line 151-1c, and the first-1d interconnection line 151-1d may be connected to first conductivity-type semiconductor layers of two adjacent semiconductor structures of the eight semiconductor structures.

In addition, the plurality of first-$n^{th}$ pads 181-$n$ may be defined as a first-first pad 181-1, a first-second pad 181-2, . . . and a first-16$^{th}$ pad 181-16 in order from the left at the upper side of the substrate. The plurality of first-$n^{th}$ pads 181-$n$ may be defined as first-17$^{th}$ to first-32$^{th}$ pads 181-17 to 181-32 in order from the left at the lower side of the substrate.

Accordingly, the first-first to first-16$^{th}$ pads 181-1 to 181-16 may be electrically connected to the first-first to first-16$^{th}$ interconnection lines 151-1 to 151-16 disposed in region A.

The first-17$^{th}$ to first-32$^{th}$ pads 181-17 to 181-32 may be electrically connected to the first-17$^{th}$ to first-32$^{th}$ interconnection lines 151-17 to 151-32 disposed in region B.

The plurality of second pads 182-$n$ (n=1) may be disposed at the edge P1 of the substrate 170. In this case, second-nth pads 182-$n$ may be disposed on second-$n^{th}$ interconnection lines 152-$n$, respectively. In addition, as described above, 16 second-$n^{th}$ pads 182-$n$ may be disposed at each of the left and right sides of the substrate 170. Furthermore, one second-$n^{th}$ pad 182-$n$ may be electrically connected to eight semiconductor structures in the same row. However, this is merely an example for describing the present invention, and the present invention is not limited thereto.

First, the second-$n^{th}$ pads 182-$n$ disposed at the left side of the substrate 170 may be defined as a second-first pad 182-1, a second-second pad 182-2, . . . and a second-16$^{th}$ pad 182-16 in order from the top. Here, the second-first pad 182-1 may be disposed on the second-first interconnection line 152-1 and may be electrically connected. The second-first pad 182-1 may be electrically connected to eight semiconductor structures disposed in the first row of the upper side of region C. The same may be applied up to the second-16$^{th}$ pad 182-16. In addition, the same may be applied to the second pads 182-17 to 182-32 disposed at the right side of the substrate 170.

A fluorescent layer 190 may be disposed on the plurality of semiconductor structures 120 and a passivation layer 163 to cover the plurality of semiconductor structures 120. Accordingly, the fluorescent layer 190 may absorb light emitted from the plurality of semiconductor structures 120 and convert the absorbed light into light in a different wavelength range to emit the converted light. For example, the fluorescent layer 190 may emit white light.

As described above, the plurality of first and second pads 181-$n$ and 182-$n$ may be disposed along the edge P1 of the substrate 170. In addition, the plurality of semiconductor structures may be disposed inside the plurality of pads 181-$n$ and 182-$n$. That is, the plurality of first and second pads 181-$n$ and 182-$n$ may be disposed to surround the plurality of semiconductor structures. In addition, the plurality of first interconnection lines 151-$n$ and second interconnection lines 152-$n$ may extend from the first and second conductivity-type semiconductor layers 121 and 122 or the first and second electrodes 141 and 142 to the edge of the substrate and be connected to the plurality of pads 181-$n$ and 182-$n$. The plurality of semiconductor structures may not be individually formed and may be formed by growing the first to second conductivity-type semiconductor layers 121 and 122 and the active layer 123 all at once and isolating the first to second conductivity-type semiconductor layers 121 and 122 and the active layer 123 in a unit of one chip (device) through etching. Therefore, processability can be improved, and concurrently, an emission region can be increased.

Figure 9:
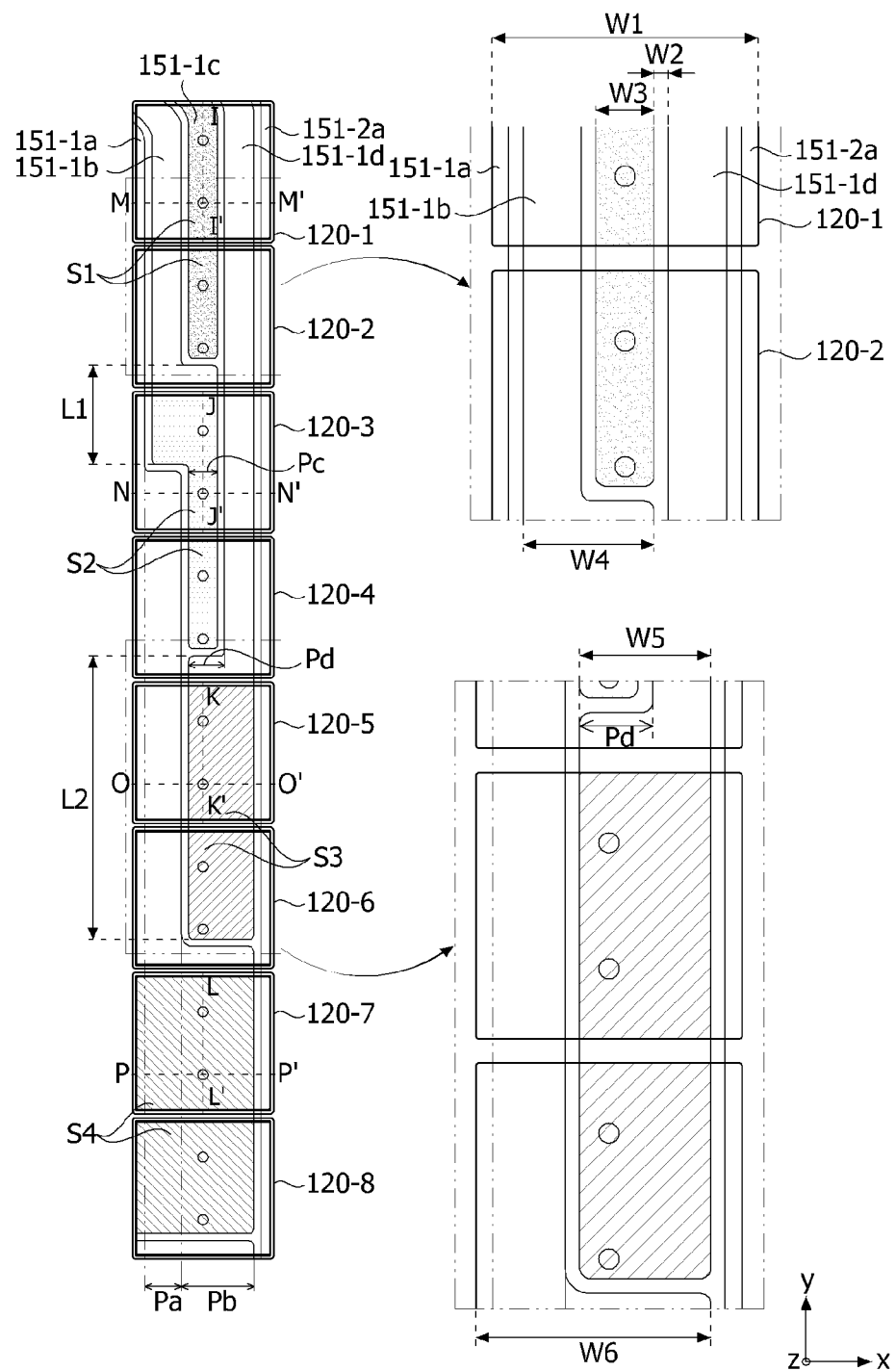
FIG. 9 is an enlarged view of region F in FIG. 4.
Figure 10A:
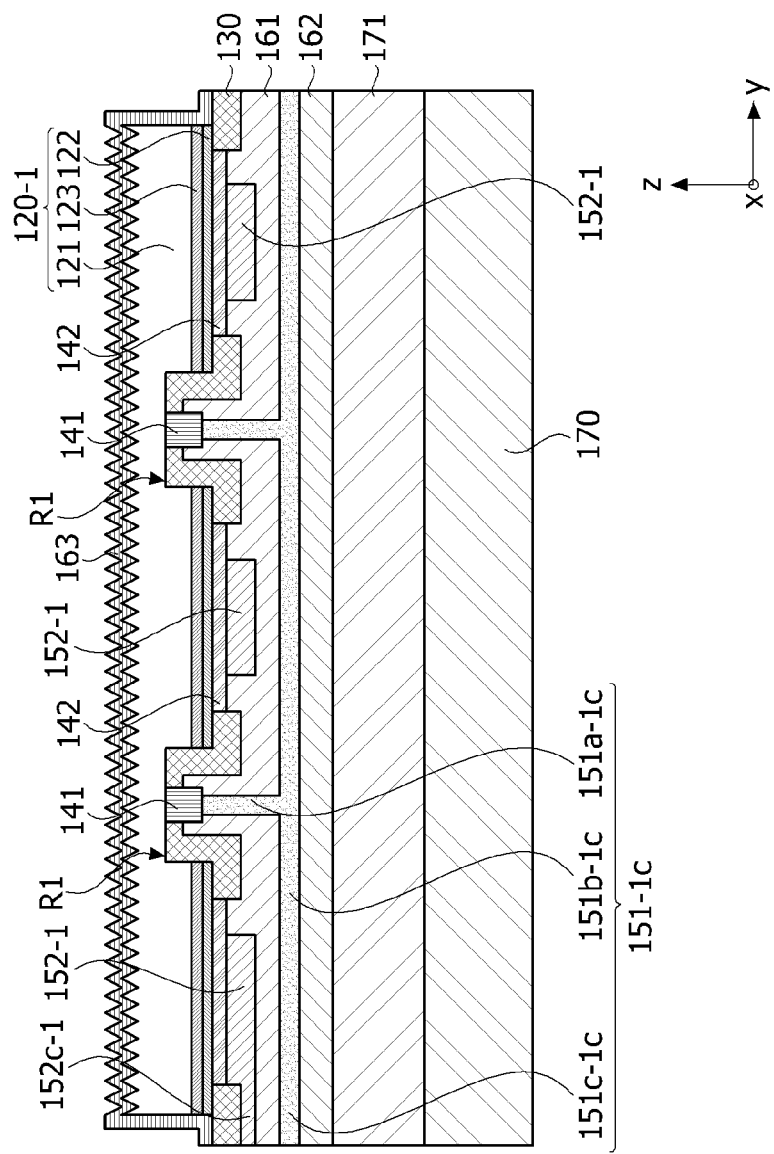
FIG. 10A is a cross-sectional view taken along line I-I' in FIG. 9.
Figure 10B:
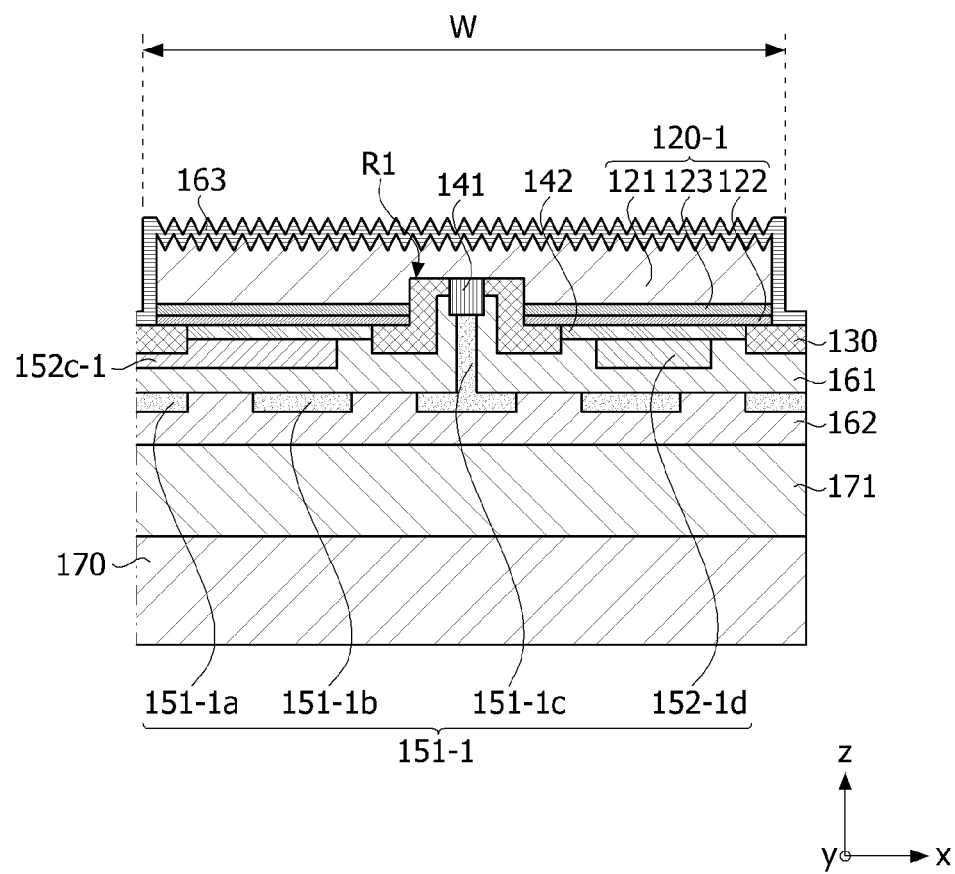
FIG. 10B is a cross-sectional view taken along line M-M' in FIG. 9.
Figure 10C:
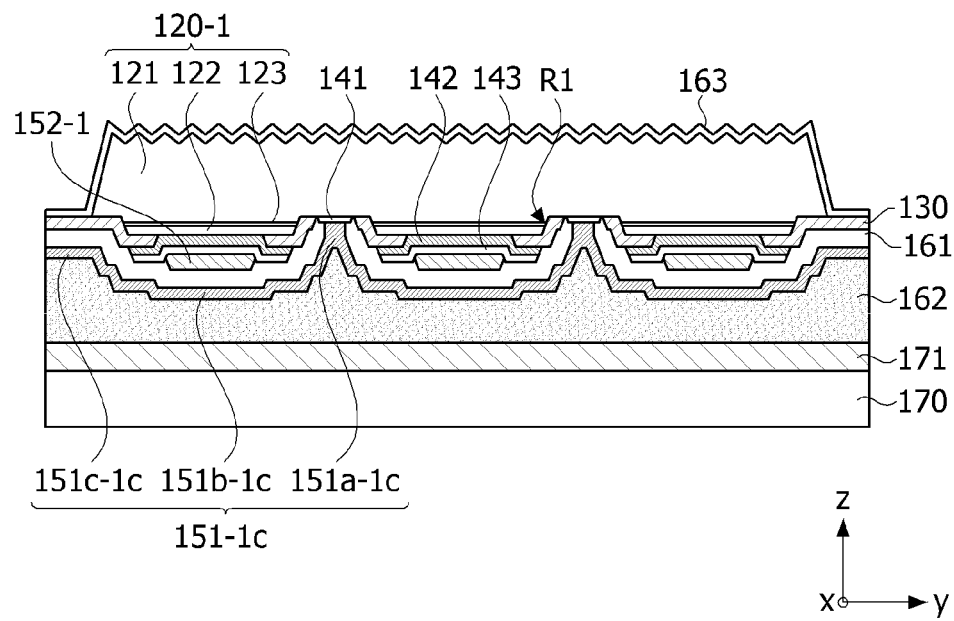
FIG. 10C is a modified example of FIG. 10A.
Figure 10D:
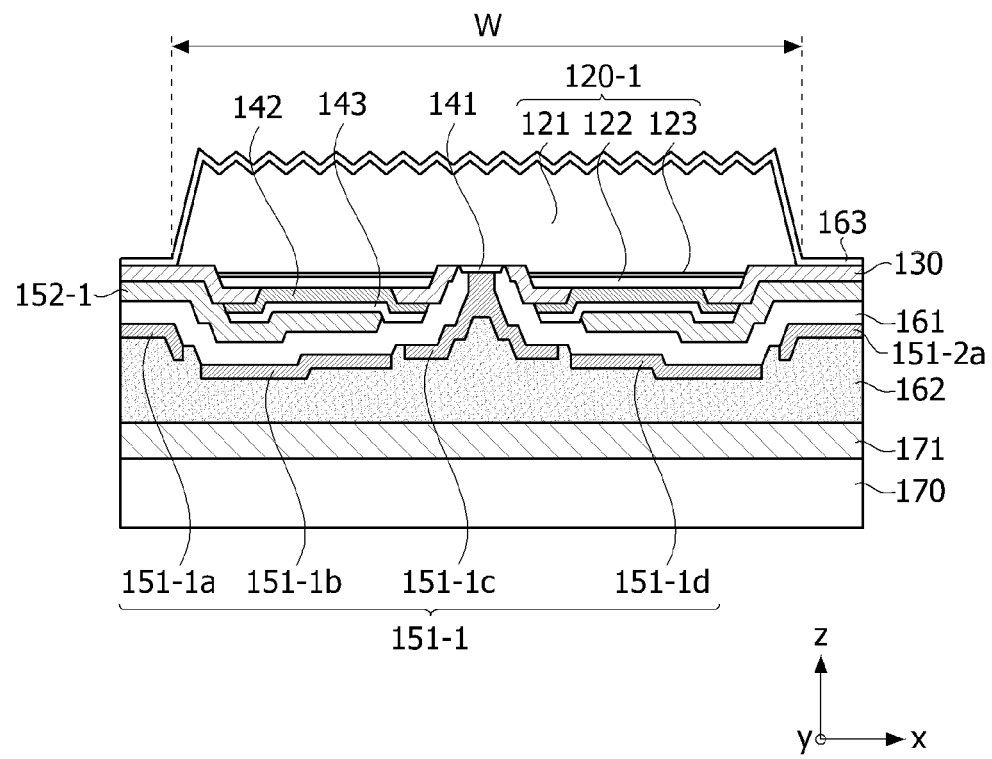
FIG. 10D is a modified example of FIG. 10B.
Figure 11A:
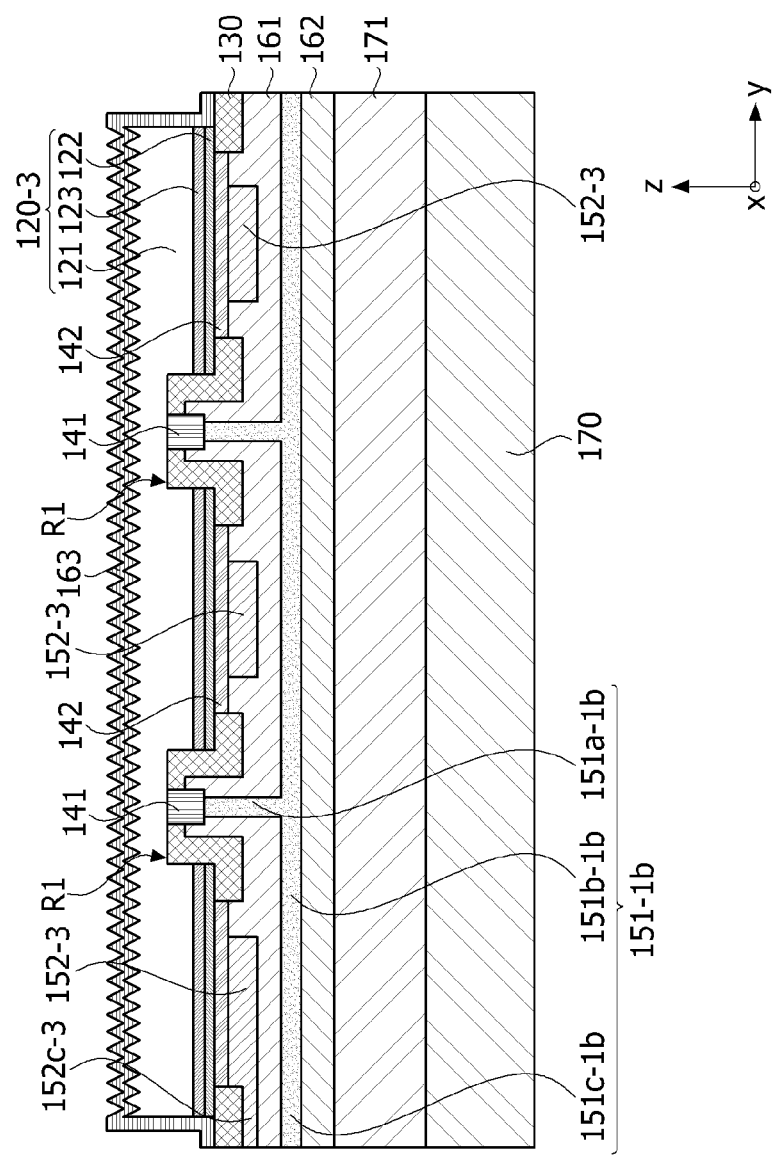
FIG. 11A is a cross-sectional view taken along line J-J' in FIG. 9.
Figure 1B:
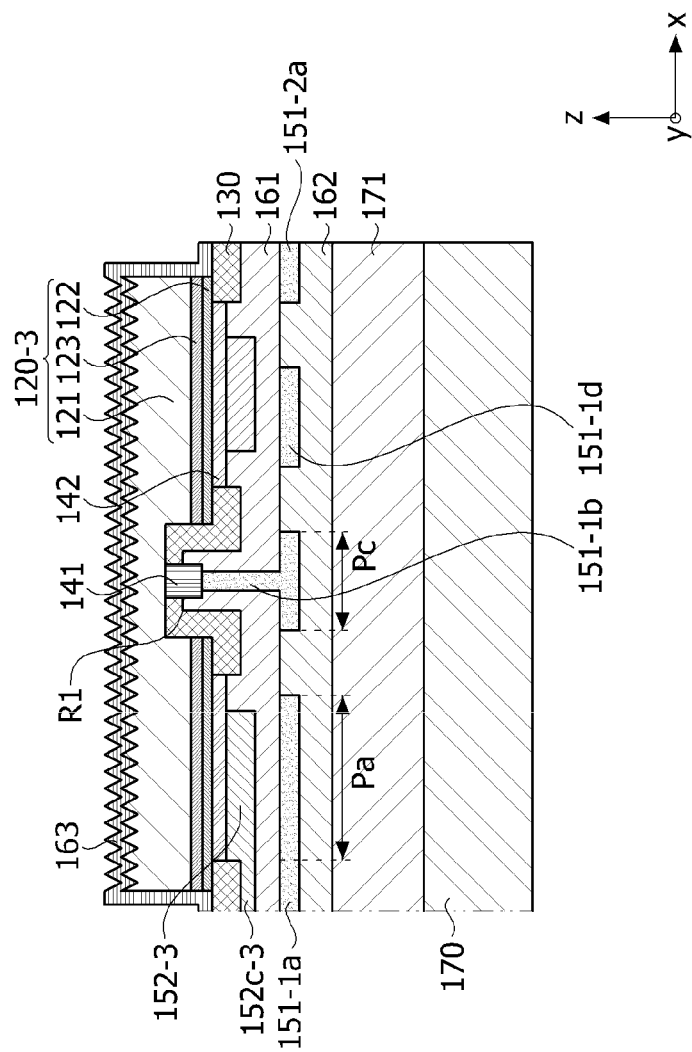
Figure 11C:
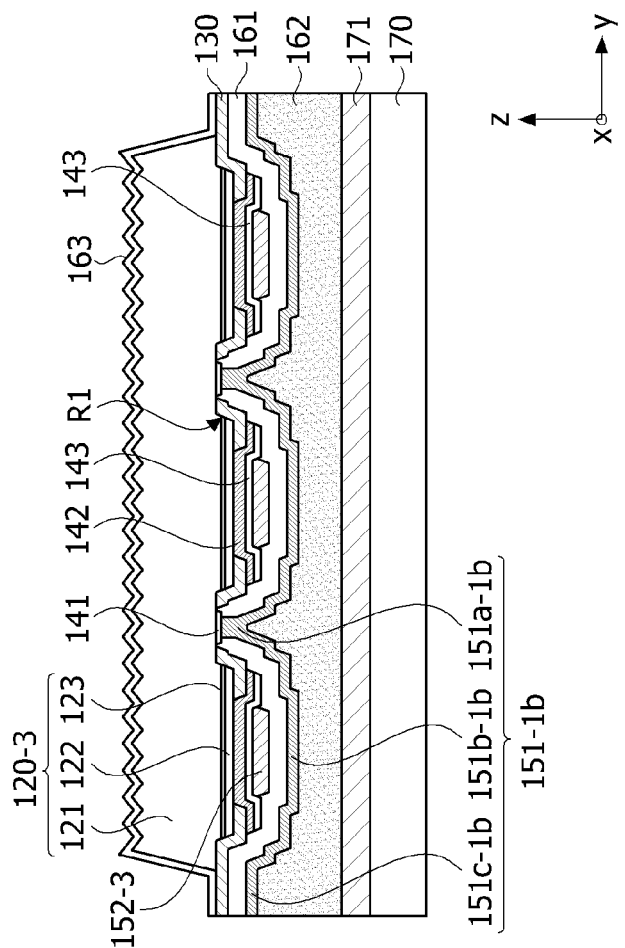
FIG. 11C is a modified example of FIG. 11A.
Figure 11D:
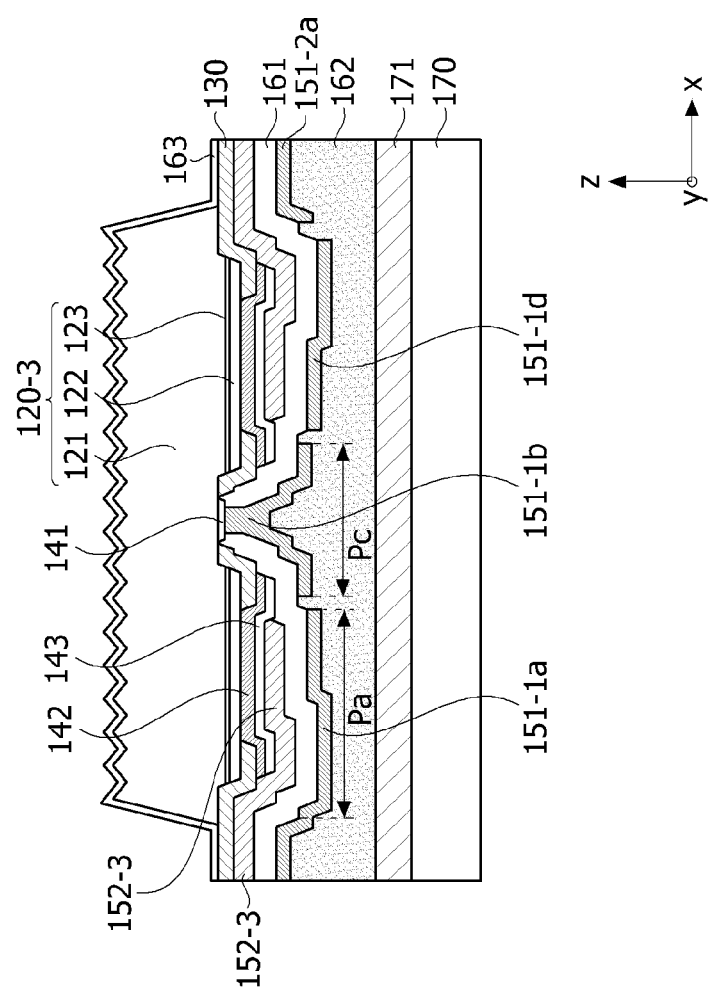
FIG. 11D is a modified example of FIG. 11B.
Figure 12A:
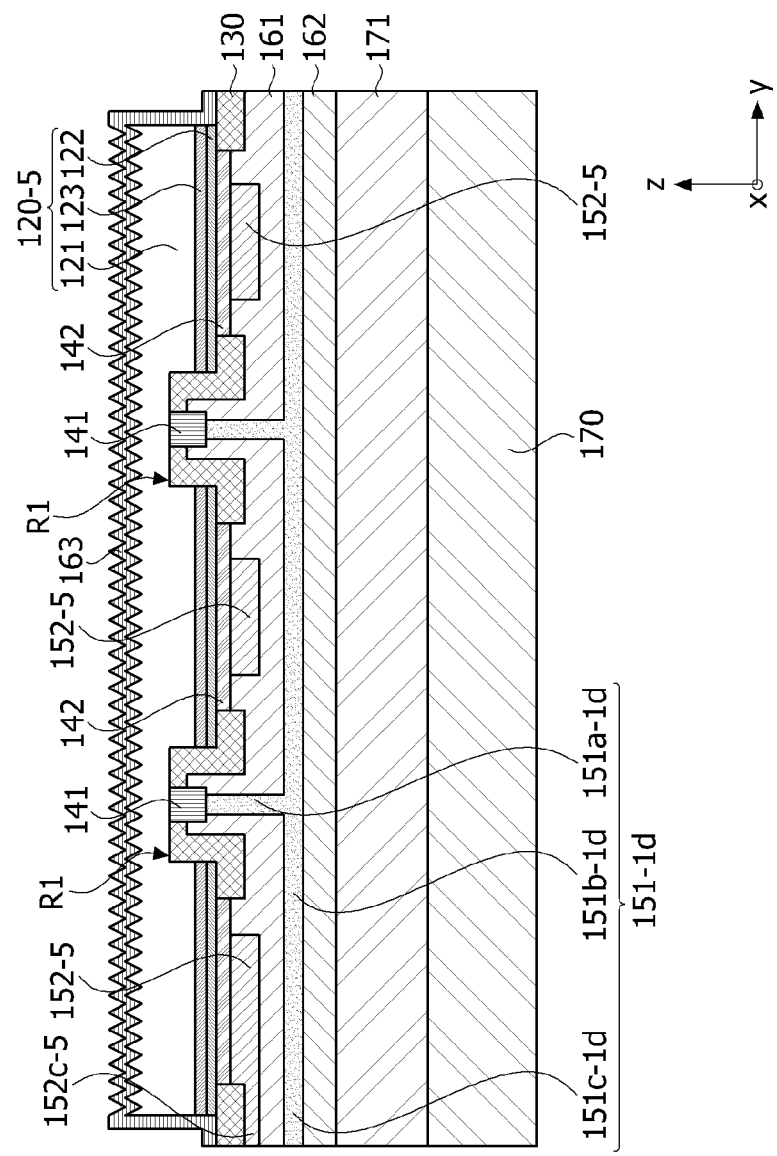
FIG. 12A is a cross-sectional view taken along line K-K' in FIG. 9.
Figure 12B:
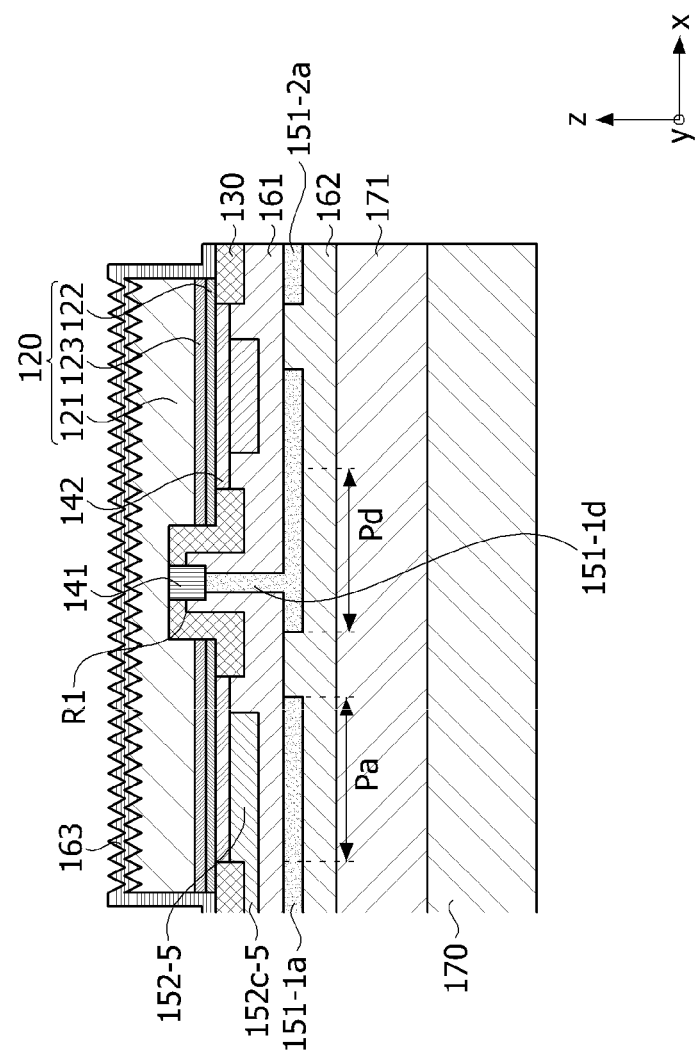
FIG. 12B is a cross-sectional view taken along line O-O' in FIG. 9.
Figure 12C:
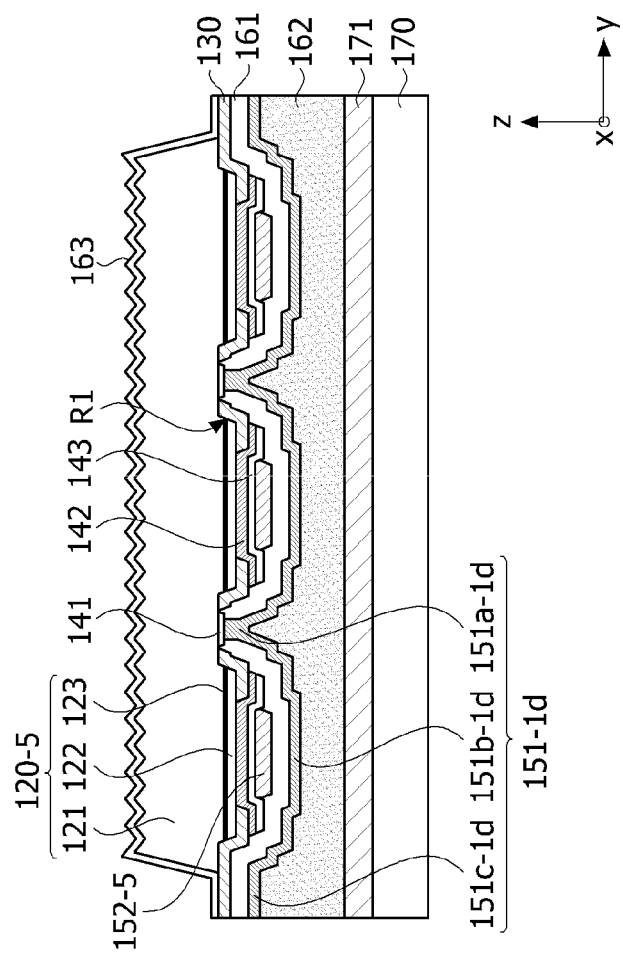
FIG. 12C is a modified example of FIG. 12A.
Figure 12D:
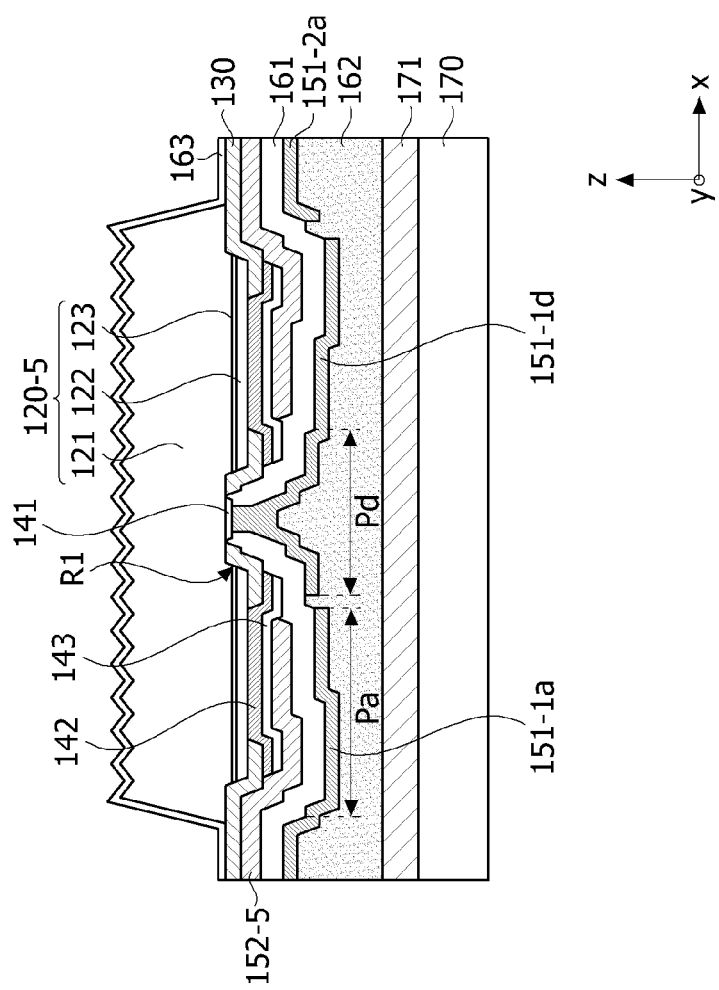
FIG. 12D is a modified example of FIG. 12B.
Figure 13A:
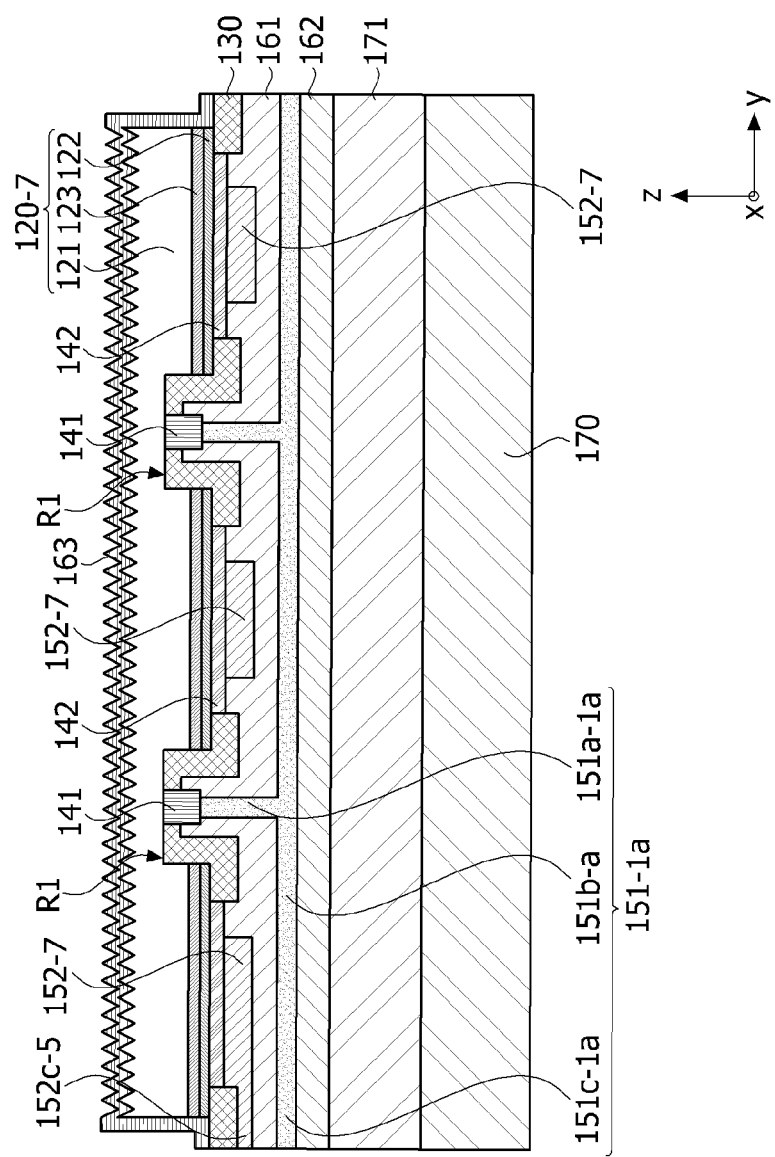
FIG. 13A is a cross-sectional view taken along line L-L' in FIG. 9.
Figure 13B:
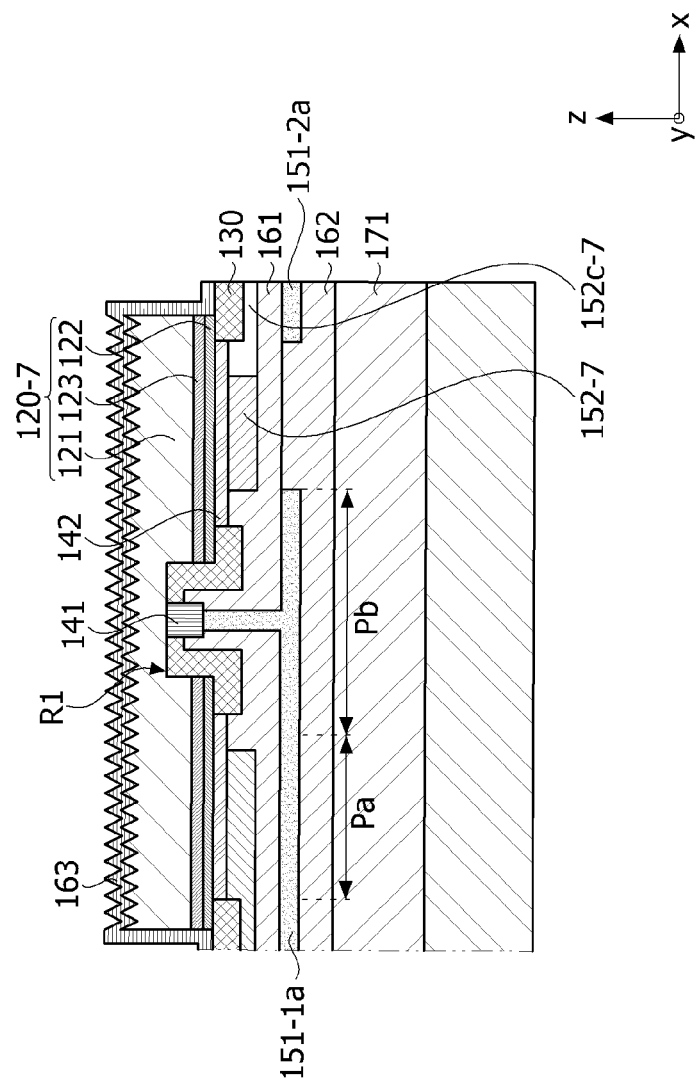
FIG. 13B is a cross-sectional view taken along line P-P' in FIG. 9.
Figure 13C:
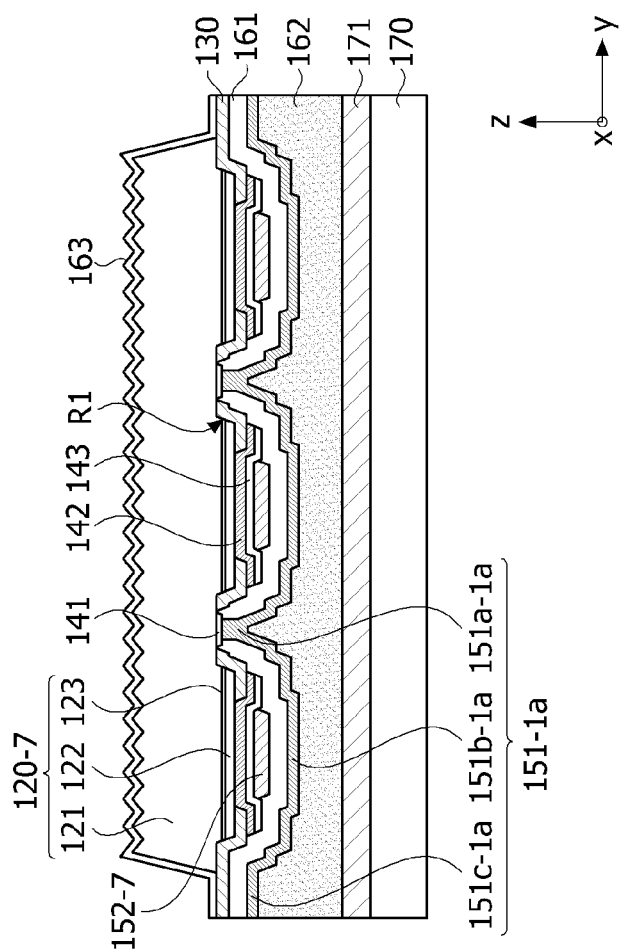
FIG. 13C is a modified example of FIG. 13A.
Figure 13D:
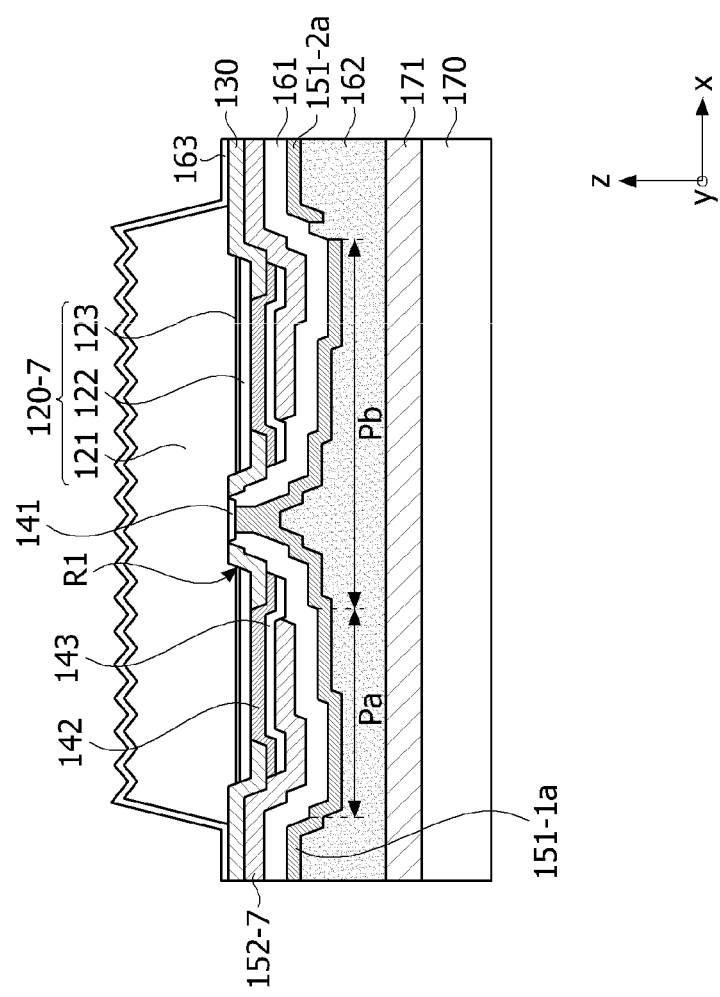
FIG. 13D is a modified example of FIG. 13B.

FIG. 9 is an enlarged view of region F in FIG. 4. FIG. 10A is a cross-sectional view taken along line I-I' in FIG. 9, FIG. 10B is a cross-sectional view taken along line M-M' in FIG. 9, and FIG. 10C is a modified example of FIG. 10A, and FIG. 10D is a modified example of FIG. 10B. FIG. 11A is a cross-sectional view taken along line J-J' in FIG. 9, FIG. 11B is a cross-sectional view taken along line N-N' in FIG. 9, FIG. 11C is a modified example of FIG. 11A, and FIG. 11D is a modified example of FIG. 11B. FIG. 12A is a cross-sectional view taken along line K-K' in FIG. 9, FIG. 12B is a cross-sectional view taken along line O-O' in FIG. 9, FIG. 12C is a modified example of FIG. 12A, and FIG. 12D is a modified example of FIG. 12B. FIG. 13A is a cross-sectional view taken along line L-L' in FIG. 9, FIG. 13B is a cross-sectional view taken along line P-P' in FIG. 9, FIG. 13C is a modified example in FIG. 13A, and FIG. 13D is a modified example of FIG. 13B. First, referring to FIG. 9, as described above, among the plurality of first interconnection lines 151, an area of a region, in which an interconnection line with the greatest length extending in the first direction (y-axis direction) overlaps a semiconductor structure, which is electrically connected thereto, in a thickness direction thereof (z-axis direction), may be smaller as compared with an interconnection line with the smallest length extending in the first direction.

For example, the first-first interconnection line 151-1 may include the first-1a interconnection line 151-1$a$, the first-1b interconnection line 151-1$b$, the first-1c interconnection line 151-1$c$, and the first-1d interconnection line 151-1$d$.

A length extending in the first direction (y-axis direction) may be great in order from the first-1a interconnection line 151-1$a$, the first-1d interconnection line 151-1$d$, the first-1b interconnection line 151-1$b$, to the first-1c interconnection line 151-1$c$. Accordingly, the first-1a interconnection line 151-1$a$ may be an interconnection line of which a length extending in the first direction (y-axis direction) is the greatest and may be electrically connected to a first-seventh semiconductor structure 120-7 and a first-eighth semiconductor structure 120-8. In addition, the first-1c interconnection line 151-1$c$ is an interconnection line of which a length extending in the first direction (y-axis direction) is the smallest and may be electrically connected to a first-first semiconductor structure 120-1 and a first-second semiconductor structure 120-2.

In this case, since the first-1a interconnection line 151-1$a$ and the first-1c interconnection line 151-1$c$ have the greatest difference between the lengths extending in the first direction (y-axis direction), when a current is injected thereinto, the first-1a interconnection line 151-1$a$ and the first-1c interconnection line 151-1$c$ may also have a great current spreading difference. Accordingly, in the first interconnection line according to the embodiment, an area of a region S4, in which the first-1a interconnection line 151-1$a$ overlaps the semiconductor structures 120-7 and 120-8, which are electrically connected thereto, in the thickness direction (z-axis direction), may be smaller than an area of a region S1 in which the first-1c interconnection line 151-1$c$ overlaps the semiconductor structures 120-1 and 120-2, which are electrically connected thereto, in the thickness direction (z-axis direction). In order to have such an area difference, a length of an interconnection line, which has a relatively great extending length, in the second direction (x-axis direction) may be greater than a width of an interconnection line having a relatively small extending length. Thus, a current spreading difference can be reduced by reducing a resistance difference between the first-1a interconnection line 151-1$a$ and the first-1c interconnection line 151-1$c$, which have the greatest difference between the lengths extending in the first direction (y-axis direction). In addition, a light output difference caused by the current spreading difference can be reduced.

In addition, in the first interconnection line 151 according to the embodiment, as a length thereof extending in the first direction (y-axis direction) is increased, an area of a region, in which the first interconnection line 151 overlaps a semiconductor structure, which is electrically connected thereto, in a thickness direction thereof, may also be increased.

As described above, the first-first interconnection line 151-1 may include the first-1a interconnection line 151-1a, the first-1b interconnection line 151-1b, the first-1c interconnection line 151-1c, and the first-1d interconnection line 151-1d.

The length extending in the first direction (y-axis direction) may be great in order from the first-1a interconnection line 151-1a, the first-1d interconnection line 151-1d, the first-1b interconnection line 151-1b, to the first-1c interconnection line 151-1c.

Specifically, the first-1a interconnection line 151-1a may be electrically connected to the first-seventh semiconductor structure 120-7 and the first-eighth semiconductor structure 120-8. The first-1b interconnection line 151-1b may be electrically connected to a first-third semiconductor structure 120-3 and a first-fourth semiconductor structure 120-4. The first-1c interconnection line 151-1c may be electrically connected to the first-first semiconductor structure 120-1 and the first-second semiconductor structure 120-2. The first-1d interconnection line 151-1d may be electrically connected to a first-fifth semiconductor structure 120-5 and a first-sixth semiconductor structure 120-6.

Accordingly, the first-1a interconnection line 151-1a may have the region S4 in which the first-1a interconnection line 151-1a overlaps the semiconductor structures 120-7 and 120-8, which are electrically connected thereto, in a thickness direction thereof. In addition, the first-1b interconnection line 151-1b may have a region S2 in which the first-1b interconnection line 151-1b overlaps the semiconductor structures 120-3 and 120-4, which are electrically connected thereto, in a thickness direction thereof. The first-1c interconnection line 151-1c may have the region S1 in which the first-1c interconnection line 151-1c overlaps the semiconductor structures 120-1 and 120-2, which are electrically connected thereto, in a thickness direction thereof. The first-1d interconnection line 151-1d may have a region S3 in which the first-1d interconnection line 151-1d overlaps the semiconductor structures 120-5 and 120-6, which are electrically connected thereto, in a thickness direction thereof.

An area may be decreased in order from the region S4 in which the first-1a interconnection line 151-1a overlaps the semiconductor structures 120-7 and 120-8, which are electrically connected thereto, in the thickness direction thereof, the region S3 in which the first-1d interconnection line 151-1d overlaps the semiconductor structures 120-5 and 120-6, which are electrically connected thereto, in the thickness direction thereof, the region S2 in which the first-1b interconnection line 151-1b overlaps the semiconductor structures 120-3 and 120-4, which are electrically connected thereto, in the thickness direction thereof, and the region S1 in which the first-1c interconnection line 151-1c overlaps the semiconductor structures 120-1 and 120-2, which are electrically connected thereto, in the thickness direction thereof.

An area of the region S4, in which the first-1a interconnection line 151-1a overlaps the semiconductor structures 120-7 and 120-8, which are electrically connected thereto, in the thickness direction thereof, may be changed according to a size of the semiconductor structures. The same may be applied to an area of the region S3 in which the first-1d interconnection line 151-1d overlaps the semiconductor structures 120-5 and 120-6, which are electrically connected thereto, in the thickness direction thereof, an area of the region S2 in which the first-1b interconnection line 151-1b overlaps the semiconductor structures 120-3 and 120-4, which are electrically connected thereto, in the thickness direction thereof, and an area of the region S1 in which the first-1c interconnection line 151-1c overlaps the semiconductor structures 120-1 and 120-2, which are electrically connected thereto, in the thickness direction thereof.

An area ratio of the area of the region S1 in which the first-1c interconnection line 151-1c overlaps the semiconductor structures 120-1 and 120-2, which are electrically connected thereto, in the thickness direction thereof, to the area of the region S4 in which the first-1a interconnection line 151-1a overlaps the semiconductor structures 120-7 and 120-8, which are electrically connected thereto, in the thickness direction thereof, may be in a range of 1:3 to 1:6. When the area ratio of the area of the region S1 in which the first-1c interconnection line 151-1c overlaps the semiconductor structures 120-1 and 120-2, which are electrically connected thereto, in the thickness direction thereof, to the area of the region S4 in which the first-1a interconnection line 151-1a overlaps the semiconductor structures 120-7 and 120-8, which are electrically connected thereto, in the thickness direction thereof, is smaller than 1:3, there may be a limitation in that a current spreading difference is increased. When the area ratio of the area of the region S1 in which the first-1c interconnection line 151-1c overlaps the semiconductor structures 120-1 and 120-2, which are electrically connected thereto, in the thickness direction thereof, to the area of the region S4 in which the first-1a interconnection line 151-1a overlaps the semiconductor structures 120-7 and 120-8, which are electrically connected thereto, in the thickness direction thereof, is greater than 1:6, there is a problem in that a width of the first-1c interconnection line 151-1c is decreased such as to reduce a contact area with first conductivity-type semiconductor layers of the first-first semiconductor structure 120-1 and the first-second semiconductor structure 120-2.

An area ratio of the area of the region S1 in which the first-1c interconnection line 151-1c overlaps the semiconductor structures 120-1 and 120-2, which are electrically connected thereto, in the thickness direction thereof, to the area of the region S3 in which the first-1d interconnection line 151-1d overlaps the semiconductor structures 120-5 and 120-6, which are electrically connected thereto, in the thickness direction thereof, may be in a range of 1:2 to 1:3.

When the area ratio of the area of the region S1 in which the first-1c interconnection line 151-1c overlaps the semiconductor structures 120-1 and 120-2, which are electrically connected thereto, in the thickness direction thereof, to the area of the region S3 in which the first-1d interconnection line 151-1d overlaps the semiconductor structures 120-5 and 120-6, which are electrically connected thereto, in the thickness direction thereof, is smaller than 1:2, there is a problem in that light output of the first-1c interconnection line 151-1c is reduced.

When the area ratio of the area of the region S1 in which the first-1c interconnection line 151-1c overlaps the semiconductor structures 120-1 and 120-2, which are electrically connected thereto, in the thickness direction thereof, to the area of the region S3 in which the first-1d interconnection line 151-1d overlaps the semiconductor structures 120-5 and 120-6, which are electrically connected thereto, in the thickness direction thereof, is greater than 1:3, there is a problem in that it is difficult to minimize an electrical resistance of the first-1a interconnection line 151-1a.

An area ratio of the area of the region S1 in which the first-1c interconnection line 151-1c overlaps the semiconductor structures 120-1 and 120-2, which are electrically connected thereto, in the thickness direction thereof, to the area of the region S2 in which the first-1b interconnection line 151-1b overlaps the semiconductor structures 120-3 and 120-4, which are electrically connected thereto, in the thickness direction thereof, may be in a range of 1:1.05 to When the area ratio of the area of the region S1 in which the first-1c interconnection line 151-1c overlaps the semiconductor structures 120-1 and 120-2, which are electrically connected thereto, in the thickness direction thereof, to the area of the region S2 in which the first-1b interconnection line 151-1b overlaps the semiconductor structures 120-3 and 120-4, which are electrically connected thereto, in the thickness direction thereof, is smaller than 1:1.05, there is a problem in that a deviation of light output is increased due to an imbalance in a reduction in resistance of an interconnection line.

When the area ratio of the area of the region S1 in which the first-1c interconnection line 151-1c overlaps the semiconductor structures 120-1 and 120-2, which are electrically connected thereto, in the thickness direction thereof, to the area of the region S2 in which the first-1b interconnection line 151-1b overlaps the semiconductor structures 120-3 and 120-4, which are electrically connected thereto, in the thickness direction thereof, is greater than 1:1.5, there is a limitation in that it is difficult for an interconnection line to be in contact with semiconductor structures electrically connected thereto.

Furthermore, the first-1a interconnection line 151-1a, the first-1b interconnection line 151-1b, and the first-1d interconnection line 151-1d may each include a region of which a width is increased in the second direction. In the first-1a interconnection line 151-1a, the first-1b interconnection line 151-1b, and the first-1d interconnection line 151-1d, lengths in the first direction of the regions, of which the width is increased in the second direction, may also be decreased in order.

Due to such a configuration, as a length of the first interconnection line 151 extending in the first direction is increased, a width of the first interconnection line 151 in the second direction may also be increased such that an area of a region, in which the first interconnection line 151 overlaps a semiconductor structure electrically connected thereto, is increased. As a result, since interconnection lines have different widths and areas according to a deviation of lengths thereof extending in the first direction, a resistance difference between the interconnection lines can be reduced. Accordingly, a current spreading difference through the first interconnection lines can be reduced, and a light output difference caused by the current spreading difference can also be reduced.

In addition, a width W1 of the first-first semiconductor structure 120-1 in the second direction (x-axis direction) may be in a range from 250 μm to 350 μm.

A minimum width W3 of the first-1a interconnection line 151-1a, the first-1b interconnection line 151-1b, the first-1c interconnection line 151-1c, and the first-1d interconnection line 151-1d in the second direction (x-axis direction) may be in a range of 50 μm to 70 μm. A separation width W2 between the first-1a interconnection line 151-1a, the first-1b interconnection line 151-1b, the first-1c interconnection line 151-1c, and the first-1d interconnection line 151-1d in the second direction (x-axis direction) may be in a range of 10 μm to 20 μm.

In this case, a ratio of the separation width W2 between the first-1a interconnection line 151-1a, the first-1b interconnection line 151-1b, the first-1c interconnection line 151-1c, and the first-1d interconnection line 151-1d in the second direction (x-axis direction) to the minimum width W3 of the first-1a interconnection line 151-1a, the first-1b interconnection line 151-1b, the first-1c interconnection line 151-1c, and the first-1d interconnection line 151-1d in the second direction (x-axis direction) may be in a range of 1:3.5 to 1:7. When the ratio of the separation width W2 of the first-1a interconnection line 151-1a, the first-1b interconnection line 151-1b, the first-1c interconnection line 151-1c, and the first-1d interconnection line 151-1d in the second direction (x-axis direction) to the minimum width W3 of the first-1a interconnection line 151-1a, the first-1b interconnection line 151-1b, the first-1c interconnection line 151-1c, and the first-1d interconnection line 151-1d in the second direction (x-axis direction) is smaller than 1:3.5, there is a limitation in that a resistance is increased due to a reduction in width of the first interconnection line. In addition, when the ratio of the separation width W2 of the first-1a interconnection line 151-1a, the first-1b interconnection line 151-1b, the first-1c interconnection line 151-1c, and the first-1d interconnection line 151-1d in the second direction (x-axis direction) to the minimum width W3 of the first-1a interconnection line 151-1a, the first-1b interconnection line 151-1b, the first-1c interconnection line 151-1c, and the first-1d interconnection line 151-1d in the second direction (x-axis direction) is greater than 1:7, there is a problem in that electrical disconnection occurs between the first interconnection lines.

In addition, a maximum width W4 of the first-1a interconnection line 151-1a may be in a range of 120 μm to 150 μm. Furthermore, a maximum width W5 of the first-1d interconnection line 151-1d may be in a range of 120 μm to 150 μm. Accordingly, as described above, a reduction in resistance due to the width of the first-1a interconnection line 151-1a and the first-1d interconnection line 151-1d in the second direction may be greater than a reduction in resistance of the first-1a interconnection line 151-1a due to the maximum width of the first-1a interconnection line 151-1a.

In addition, a length L1 of a region in the first direction (y-axis direction), in which the first-1b interconnection line 151-1b has the maximum width W4, may be in a range of 180 μm to 220 μm. On the other hand, a length L2 of a region in the first direction (y-axis direction), in which the first-1d interconnection line 151-1d has the maximum width W5, may be in a range of 550 urn to 600 μm Accordingly, even when a length of the first-1d interconnection line 151-1d in the first direction (y-axis direction) is greater than that of the first-1b interconnection line 151-1b, a region of the first-1d interconnection line 151-1d, which has the maximum width, may be greater than a region of the first-1b interconnection line 151-1b, which has the maximum width, thereby reducing a resistance difference between the interconnection lines.

The first-1a interconnection line 151-1a, the first-1b interconnection line 151-1b, the first-1c interconnection line 15 first-1c, and the first-1d interconnection line 151-1 may be disposed in order from the left and may be electrically connected to any one of the first-first to first-eighth semiconductor structures 120-1 to 120-8 in the first column. For example, each of the first-1a interconnection line 151-1a, the first-1b interconnection line 151-1*b*, the first-1c interconnection line 151-1*c*, and the first-1d interconnection line 151-1*d* may be electrically connected to two semiconductor structures which are in series in the first direction (y-axis direction). As a result, the semiconductor device package according to the embodiment may drive a plurality of semiconductor structures (emit light) in a 2-time division passive matrix (PM).

Specifically, the first-1a interconnection line 151-1*a* may be disposed in the first column from the left and may be electrically connected to the first-seventh semiconductor structure 120-7 and the first-eighth semiconductor structure 120-8. To this end, the first-1a interconnection line 151-1*a* may be disposed below all of the first-first to first-eighth semiconductor structures 120-1 to 120-8.

A portion of the first-1a interconnection line 151-1*a* may not overlap the first-first to first-eighth semiconductor structures 120-1 to 120-8 in the thickness direction (z-axis direction).

In addition, the first-1a interconnection line 151-1*a* may extend downward, and thus, the width thereof, that is, a length in the second direction (x-axis direction) may be increased. For example, the first-1a interconnection line 151-1*a* may include a first protrusion Pa and a second protrusion Pb. The first protrusion Pa and the second protrusion Pb may increase the width of the first-1a interconnection line 151-1*a*.

For example, the first protrusion Pa may be disposed from the third semiconductor structure 120-3 to the first-sixth semiconductor structure 120-6. The second protrusion Pb may be disposed from the first-sixth semiconductor structure 120-6 to the first-eighth semiconductor structures 120-8. Due to such a configuration, the width of the first-1a interconnection line 151-1*a* can be increased, and a resistance thereof can be reduced.

In addition, the second protrusion Pb may be electrically connected to first conductivity-type semiconductor structures of the first-seventh semiconductor structures 120-7 and the first-enigth semiconductor structures 120-8. That is, the second protrusion Pb may overlap first electrodes of the first-seventh semiconductor structures 120-7 and the first-eighth semiconductor structures 120-8 in a thickness direction thereof.

In addition, the first protrusion Pa may overlap the first-1b interconnection line 151-1*b* in the first direction (y-axis direction). The second protrusion Pb may overlap a third protrusion Pc of the first-1b interconnection line 151-1*b*, the first-1c interconnection line 151-1*c*, and a fourth protrusion Pd of the first-1d interconnection line 151-1*d* in the first direction (y-axis direction).

The first-1b interconnection line 151-1*b* may be disposed in a second column from the left and may be electrically connected to the first-fifth semiconductor structure 120-5 and the first-sixth semiconductor structures 120-6. To this end, the first-1b interconnection line 151-1*b* may be disposed below the first-first to first-sixth semiconductor structures 120-1 to 120-6. However, the first-1b interconnection line 151-1*b* may not be disposed below the first-seventh semiconductor structure 120-7 and the first-eighth semiconductor structure 120-8. Accordingly, the first-1a interconnection line 151-1*a* may include the second protrusion Pb below the first-first to first-eighth semiconductor structures 120-1 to 120-8 and may be electrically connected to the first conductivity-type semiconductor layers of the first-seventh semiconductor structure 120-7 and the first-eighth semiconductor structure 120-8.

The first-1b interconnection line 151-1*b* may include the third protrusion Pc. The third protrusion Pc may be disposed at the first-third semiconductor structure 120-3 and the first-fourth semiconductor structure 120-4. In addition, the third protrusion Pc may be connected to first electrodes of the first-third semiconductor structure 120-3 and the first-fourth semiconductor structure 120-4 and may be disposed to overlap the first electrodes in the thickness direction (z-axis direction).

Furthermore, the third protrusion Pc may overlap the first-1c interconnection line 151-1*c*, the fourth protrusion Pd of the first-1d interconnection line 151-1*d*, and the second protrusion Pb of the first-1a interconnection line 151-1*a* in the first direction (y-axis direction).

The first-1c interconnection line 151-1*c* may be disposed below the first-first semiconductor structure 120-1 and the first-second semiconductor structure 120-1. Specifically, the first-1c interconnection line 151-1*c* may be connected to first electrodes of the first-first semiconductor structure 120-1 and the first-second semiconductor structure 120-2 and may be disposed to overlap the first electrodes in the thickness direction. The first-1c interconnection line 151-1*c* may extend in the first direction (y-axis direction) at a central portion of the first-second semiconductor structure 120-2. This may be applied when the first-first interconnection line 151-1 includes an even number of interconnection lines. For example, when the first-first interconnection line 151-1 includes an odd number of interconnection lines, the odd number of the interconnection lines may be symmetrically disposed with respect to one interconnection line below a semiconductor structure. For example, when the first-first interconnection line 151-1 includes an even number of interconnection lines, the even number of the interconnection lines may be asymmetrically disposed below a semiconductor structure, unlike when the first-first interconnection line 151-1 includes the odd number of the interconnection lines.

Since the first-1c interconnection line 151-1*c* is electrically connected to the first-first semiconductor structure 120-1 and the first-second semiconductor structure 120-1, the first-1c interconnection line 151-1*c* may not be disposed at the first-third to first-eighth semiconductor structures 120-3 to 120-8. Accordingly, the third protrusion Pc of the first-1b interconnection line 151-1*b*, the second protrusion Pb of the first-1a interconnection line 151-1*a*, and the fourth protrusion Pd of first-1d interconnection line 151-1*c* may be disposed in regions which overlap the first-11$^{th}$ interconnection line 151-1*a* in the first direction (y-axis direction) at the first-third to first-eighth semiconductor structures 120-3 to 120-8. The fourth protrusion Pd may overlap the first-1c interconnection line 151-1*c*, the third protrusions Pc of the first-1b interconnection line 151-1*d*, and the second protrusion Pb of the first-1a interconnection line 151-1*a* in the first direction (y-axis direction).

Due to such a configuration, as a length of the first-first interconnection line 151-1 increases in the first direction (y-axis direction), a width of the first-first interconnection line 151-1 may increase in the second direction (x-axis direction). Accordingly, a resistance increased according to the length of the first-first interconnection line 151-1 can be offset due to an increase in width thereof, and thus, currents having similar levels can be spread into the first-first to first-eighth semiconductor structures 120-1 to 120-8. Therefore, light outputs emitted from the plurality of semiconductor structures 120 may be maintained at similar levels.

Finally, the first-1d interconnection line 151-1*d* may be disposed below the first-first to first-sixth semiconductor structures 120-1 to 120-6. In addition, the first-1d interconnection line 151-1d may be connected to first electrodes of the first-fifth semiconductor structure 120-5 and the first-sixth semiconductor structure 120-6 and may be disposed to overlap the first electrodes in the thickness direction (z-axis direction).

As described above, the length of the first-1d wiring length 15-1d in the first direction (y-axis direction) may be greater than that of the first-1c interconnection line 151-1c and the first-1b interconnection line 151-1b. On the other hand, the length of the first-1d interconnection line 151-1d in the first direction (y-axis direction) may be a smaller than that of the first-1a interconnection line 151-1a.

In addition, the first-1d interconnection line 151-1d may include the fourth protrusion Pd. Due to such a configuration, the length of the first-1d interconnection line 151-1d in the first direction (y-axis direction) is the next largest after the first-1a interconnection line 151-1 and thus has a great resistance. Therefore, a resistance increased according to a length can be cancelled through the fourth protrusion Pd.

Referring to FIG. 10A, the first-1c interconnection line 151-1c may be disposed to overlap the first-first semiconductor structure 120-1 in the thickness direction (z-axis direction).

Thus, as described with reference to FIG. 9, the first-1c interconnection line 151-1c may be electrically connected to the first conductivity-type semiconductor layers 121 of the first-first and first-second semiconductor structures 120-1 and 120-2 adjacent to each other in the same column and may not extend to the first-third to first-eighth semiconductor structures 120-3 to 120-8. Therefore, among the first-1a interconnection line 151-1a, the first-1b interconnection line 151-1b, the first-1c interconnection line 151-1c, and the first-1d interconnection line 151-1d, the first-1c interconnection line 151-1c may have the smallest length in the first direction (y-axis direction).

As described above, the first-1c interconnection line 151-1c may include a first-1c end portion 151c-1c, a first connection portion 151b-1c, and a first through-portion 151a-1c of the first-1c interconnection line 151-1c. In addition, the second-first interconnection line 152-1 may be disposed to be electrically connected to a second electrode 142 below the second electrode 142 of the first-first semiconductor structure 120-1. In the drawing, a plurality of second-first interconnection lines 152-1 appear to be spaced apart from each other but are electrically connected.

The contents described with reference to FIG. 2 may be equally applied to the substrate 170, a bonding layer 171, a second insulating layer 162, a first insulating layer 161, a channel layer 130, a first electrode 141, the second electrode 142, the first-first semiconductor structure 120-1, and a passivation layer 163. These contents may be applied to FIGS. 10A to 13D.

Referring to FIG. 10B, as described above, the first-1a interconnection line 151-1a, the first-1b interconnection line 151-1b, the first-1c wiring 151-1c, and the first-1d interconnection line 151-1d of the first interconnection line 151-1 may be disposed below the first-first semiconductor structure 120-1. In addition, a portion of a first-2a interconnection line 151-2a may also be disposed below the first-first semiconductor structure 120-1.

A width ratio of a width of the first-first semiconductor structure 120-1 in the second direction (x-axis direction) to the total width of the first-1a interconnection line 151-1a, the first-1b interconnection line 151-1b, the first-1c wiring 151-1c, and the first-1d interconnection line 151-1d in the second direction (x-axis direction) may be in a range of 1:0.7 to 1:0.9. The same may be applied to not only FIG. 10B, but also FIGS. 10D, 11B, 11D, 12B, 12D, 13B, and 13D.

Due to such a configuration, according to the semiconductor device package according to the embodiment, while a resistance of an interconnection line is reduced as much as possible, a current can be injected into a plurality of semiconductor structures.

Referring to FIGS. 10C and 10D, as described above, a reflective layer 143 may be further included in addition to the components of the above-described semiconductor device package. The reflective layer 143 may be disposed below the second electrode 142. The reflective layer 143 may be positioned between the second electrode 142 and the interconnection line (for example, the first interconnection line 152) to easily reflect light generated in the active layer upward. Therefore, light output can be improved.

In addition, a ratio of a width of the first-1a interconnection line 151-1a, the first-1b interconnection line 151-1b, the first-1c interconnection line 151-1c, and the first-1d interconnection line 151-1d in the second direction (x-axis direction) to a width of a region in the second direction (x-axis direction), in which the first conductivity-type semiconductor layer 121 is exposed by the channel layer 130 in each of the semiconductor structures 120 electrically connected thereto, may be in a range of 1:0.6 to 1:0.9. Due to such a configuration, a current injection into each of the first conductivity-type semiconductor layers 121 may be facilitated through the first interconnection line 151.

Referring to FIG. 11A, the first-1b interconnection line 151-1b may be disposed to overlap the first-third semiconductor structure 120-3 in the thickness direction (z-axis direction).

Thus, as described with reference to FIG. 9, the first-1b interconnection line 151-1b may be electrically connected to first conductivity-type semiconductor layers of the first-third and first-fourth semiconductor structures 120-3 and 120-4 in the same column and may not extend to the first-fifth to first-eighth semiconductor structures 120-5 to 120-8. Thus, the length of the first-1b interconnection line 151-1b may be greater than that of the first-1c interconnection line 151-1c in the first direction (y-axis direction) and may be smaller than that of the first-1a interconnection line 151-1a and the first-1d interconnection line 151-1d in the first direction (y-axis direction).

As described above, the first-1b interconnection line 151-1b may include a first end portion 151c-1b, a first connection portion 151b-1b, and a through-portion 151a-1b of the first-1b interconnection line 151-1b.

In addition, the second-third interconnection line 152-3 may be disposed to be electrically connected to a second electrode 142 below the second electrode 142 of the first-third semiconductor structure 120-3. In the drawing, a plurality of second-third interconnection lines 152-3 appear to be spaced apart from each other but are electrically connected.

Referring to FIG. 11B, as described above, the first-1a interconnection line 151-1a, the first-1b interconnection line 151-1b, and the first-1d wiring of the first interconnection line 151-1d of the first interconnection line 151-1 may be disposed below the first-first semiconductor structure 120-1.

Specifically, the first-first interconnection line 151-1a may include the first protrusion Pa. As described above, since the length of the first-first interconnection line 151-1a is the greatest in the first direction (y-axis direction) in the same column, the width thereof in the second direction (x-axis direction) may be increased through the first protrusion Pa, thereby reducing a resistance of an interconnection line.

The first-1b interconnection line 151-1*b* may be electrically connected to the first conductivity-type semiconductor layer 121 of the first-third semiconductor structure 120-3 through the third protrusion Pc.

In addition, a portion of the first-2a interconnection line 151-2*a* may also be disposed below the first-first semiconductor structure 120-1.

Referring to FIG. 12A, the first-1d interconnection line 151-1*d* may be disposed to overlap the first-fifth semiconductor structure 120-5 in the thickness direction (z-axis direction).

Thus, as described with reference to FIG. 7, the first-1d interconnection lines 151-1*d* may be electrically connected to first conductivity-type semiconductor layers of the first-fifth and first-sixth semiconductor structures 120-5 and 120-6 in the same column and may not extend to the first-seventh semiconductor structure 120-7 and the first-eighth semiconductor structure 120-8. Accordingly, the length of the first-1d interconnection line 151-1*d* may be greater than that of the first-1c interconnection line 151-1*c* and the first-1b interconnection line 151-1*b* in the first direction (y-axis direction) and may be smaller than that of the first-1a interconnection line 151-1*a* in the first direction (y-axis direction).

As described above, the first-1d interconnection line 151-1*d* may include a first end portion 151*c*-1*d*, a first connection portion 151*b*-1*d*, and a through-portion 151*a*-1*d* of the first-1d interconnection line 151-1*d*.

In addition, the second-fifth interconnection line 152-5 may be disposed to be electrically connected to a second electrode 142 below the second electrode 142 of the first-fifth semiconductor structure 120-5. In the drawing, a plurality of second-fifth interconnection lines 152-5 appear to be spaced apart from each other but are electrically connected.

Referring to FIGS. 11C and 11D, as described above, a reflective layer 143 may be further included in addition to the components of the above-described semiconductor device package. The reflective layer 143 may be disposed below the second electrode 142. The reflective layer 143 may be positioned between the second electrode 142 and the interconnection line (for example, the first interconnection line 152) to easily reflect light generated in the active layer upward. Therefore, light output can be improved.

Referring to FIG. 12B, as described above, the first-1a interconnection line 151-1*a* and the first-1d interconnection line 151-1*d* of the first interconnection line 151-1 may be disposed below the first-first semiconductor structure 120-1.

Specifically, the first-first interconnection line 151-1*a* may include the first protrusion Pa. As described above, since the length of the first-first interconnection line 151-1*a* is the greatest in the first direction (y-axis direction) in the same column, the width thereof in the second direction (x-axis direction) may be increased through the first protrusion Pa, thereby reducing a resistance of an interconnection line.

The first-1d interconnection line 151-1*d* may be electrically connected to the first conductivity-type semiconductor layer 121 of the first-fifth semiconductor structure 120-5 through the fourth protrusion Pd.

In addition, a portion of the first-2a interconnection line 151-2*a* may also be disposed below the first-first semiconductor structure 120-1.

Referring to FIGS. 12C and 12D, as described above, a reflective layer 143 may be further included in addition to the components of the above-described semiconductor device package. The reflective layer 143 may be disposed below the second electrode 142. The reflective layer 143 may be positioned between the second electrode 142 and the interconnection line (for example, the first interconnection line 152) to easily reflect light generated in the active layer upward. Therefore, light output can be improved.

Referring to FIG. 13A, the first-1a interconnection line 151-1*a* may be disposed to overlap the first-fifth semiconductor structure 120-5 in the thickness direction (z-axis direction).

Thus, as described with reference to FIG. 9, the first-1a interconnection line 151-1*a* may be electrically connected to the first conductive semiconductor layers of the first-seventh and first-eighth semiconductor structures 120-7 and 120-8 in the same column and may be disposed to extend in the first direction (y-axis direction) farther than the first-1b interconnection line 151-1*b* and the first-1c interconnection line 151-1*c*. Thus, the length of the first-1a interconnection line 151-1*a* may be greater than that of the first-1c interconnection line 151-1*c*, the first-1b interconnection line 151-1*b*, and the first-1d interconnection line 151-1*d* in the first direction (y-axis direction).

As described above, the first-1a interconnection line 151-1*a* may include a first end portion 151*c*-1*a*, a first connection portion 151*b*-1*a*, and a through-portion 151*a*-1*a* of the first-1a interconnection line 151-1*a*.

In addition, the second-seventh interconnection line 152-7 may be disposed to be electrically connected to a second electrode 142 below the second electrode 142 of the first-seventh semiconductor structure 120-7. In the drawing, a plurality of second-seventh interconnection lines 152-7 appear to be spaced apart from each other but are electrically connected.

Referring to FIG. 13B, as described above, the first-1a interconnection line 151-1*a* of the first interconnection line 151-1 may be disposed below the first-first semiconductor structure 120-1.

Specifically, the first-first interconnection line 151-1*a* may include the first protrusion Pa and the second protrusion Pb. As described above, since the length of the first-first interconnection line 151-1*a* is the greatest in the first direction (y-axis direction) in the same column, the width thereof in the second direction (x-axis direction) may be increased through the first protrusion Pa and the second protrusion Pb, thereby reducing a resistance of an interconnection line. In addition, the second protrusion Pb may be electrically connected to a first electrode 141 of the first-seventh semiconductor structure 120-7. In addition, a portion of the first-2a interconnection line 151-2*a* may also be disposed below the first-first semiconductor structure 120-1.

Figure 14:
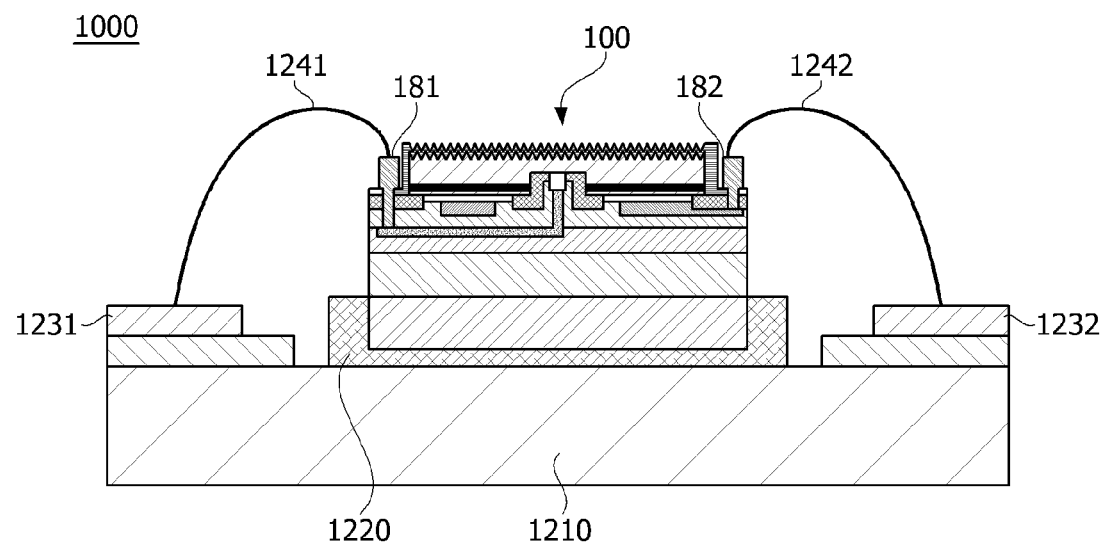
FIG. 14 is a conceptual view of a semiconductor device package according to an embodiment.

Referring to FIGS. 13C and 13D, as described above, a reflective layer 143 may be further included in addition to the components of the above-described semiconductor device package described. The reflective layer 143 may be disposed below the second electrode 142. The reflective layer 143 may be positioned between the second electrode 142 and the interconnection line (for example, the first interconnection line 152) to easily reflect light generated in the active layer upward. Therefore, light output can be improved. FIG. 14 is a conceptual view of a semiconductor device package according to another embodiment.

Referring to FIG. 14, a semiconductor package 1000 according to an embodiment of the present invention may include a package substrate 1210, solder 1220, pads 1231 and 1232, wires 1241 and 1242, and a semiconductor device package 100.

The semiconductor device package 100 may have the same structure as described above. In FIG. 14, for convenience of description, the semiconductor device package is illustrated in the same manner as in FIG. 2, but the semiconductor device package 100 may actually include a plurality of semiconductor structures 120, a plurality of first pads 181, and a plurality of second pads 182 as shown in FIG. 4.

The semiconductor device package 100 including a plurality of semiconductor devices may be mounted on the package substrate 1210 using the substrate 170 (see FIGS. 2 and 3). That is, individual devices are not disposed on a support substrate to be each mounted on the package substrate 1210, but a plurality of semiconductor structures may be mounted at once using one substrate 170. Therefore, the support substrate, a pad, a wire, and solder for mounting the individual devices may be omitted to reduce a bonding interface and a heat dissipation path, thereby minimizing a thermal resistance.

In particular, it is possible to omit wire bonding between the individual elements and the support substrate and bonding between the support substrate and the package substrate. Therefore, a space required for mounting can be saved, an emission region can be enlarged, and processability can be improved.

The semiconductor device package 100 may be mounted on the package substrate 1210. The package substrate 1210 may include a plurality of circuit patterns. Accordingly, it is possible to control driving of the plurality of semiconductor structures 120 of the semiconductor device package 100.

The solder 1220 may be disposed between the package substrate 1210 and the semiconductor device package 100. That is, the semiconductor device package 100 may be stably disposed on the package substrate 1210 using the solder 1220.

The pads 1231 and 1232 may include a first pad 1231 and a second pad 1232. The first and second pads 1231 and 1232 may be connected to the circuit patterns of the package substrate 1210.

The wires 1241 and 1242 may include a first wire 1241 and a second wire 1242. The first wire 1241 may electrically connect the first pad 1231 of the package substrate 1210 and the first pad of the semiconductor device package 100. The second wire 1242 may electrically connect the second pad 1232 of the package substrate 1210 and the second pad of the semiconductor device package 100.

Meanwhile, a plurality of first and second pads 1231 and 1232 and a plurality of first and second wires 1241 and 1242 of the package substrate 1210 may be provided like the first and second pads of the semiconductor device package 100. For example, the first pads (or the second pads) of the semiconductor device package 100 may be connected to the plurality of semiconductor structures. The first pad (or the second pad) of the semiconductor device package 100 may be connected to the first pad 1231 (or the second pad 1232) of the package substrate 1210 through the first wire 1241 (or the second wire 1242).

That is, one pad of the package substrate 1210 may be connected to the plurality of semiconductor structures. Therefore, the pads 1231 and 1232 are connected to the plurality of semiconductor structures instead of one semiconductor structure, thereby saving a space and simplifying a process.

FIGS. 15A to 15M are views sequentially illustrating a method of manufacturing a semiconductor device package according to an embodiment.

Figure 15A:
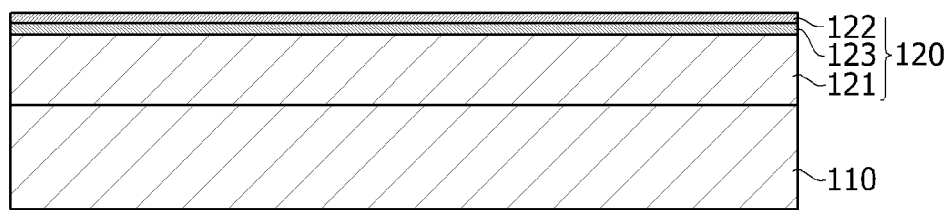
FIGS. 15A to 15M are views sequentially illustrating a method of manufacturing a semiconductor device package according to an embodiment.

Referring to FIG. 15A, an operation of providing a substrate 110 and forming a semiconductor structure 120 on the substrate 110 may be performed. That is, a first conductivity-type semiconductor layer 121, an active layer 123, and a second conductivity-type semiconductor layer 122 may be sequentially grown on the substrate 110.

The substrate 110 may include a transparent, conductive, or insulating substrate. The substrate 110 may be made of a material suitable for growth of a semiconductor material or be a carrier wafer. The substrate 110 may be made of a material selected from among sapphire ($Al_2O_3$), $SiO_2$, SiC, Si, GaAs, GaN, ZnO, GaP, InP, Ge, and $Ga_2O_3$, but the present invention is not limited thereto.

The semiconductor structure 120 may include the first conductivity-type semiconductor layer 121, the second conductivity-type semiconductor layer 122, and the active layer 123 disposed between the first conductivity-type semiconductor layer 121 and the second conductivity-type semiconductor layer 122. The semiconductor structure 120 may be grown through a vapor deposition method such as a metal organic chemical vapor deposition (MOCVD) method, a molecular beam epitaxy (MBE) method, or a hydride vapor phase epitaxy (HVPE) method, but the present invention is not limited thereto.

Figure 15B:
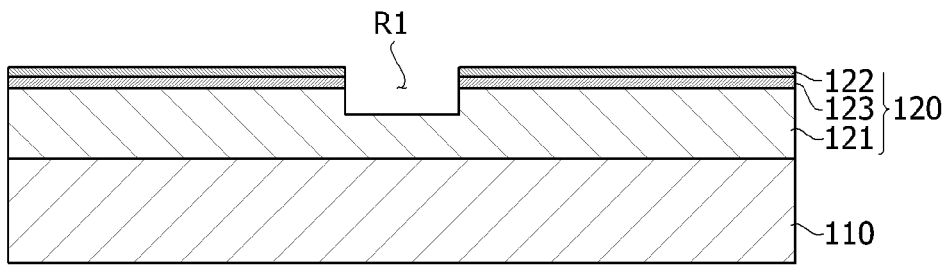

Referring to FIG. 15B, an operation of mesa-etching a portion of the semiconductor structure 120 to form a first hole H1 may be performed. A first recess R1 may be formed to have a predetermined depth from the second conductivity-type semiconductor layer 122. The first recess R1 may be formed down to a partial region of the first conductivity-type semiconductor layer 121. That is, portions of the second conductivity-type semiconductor layer 122, the active layer 123, and the first conductivity-type semiconductor layer 121 may be etched.

Figure 15C:
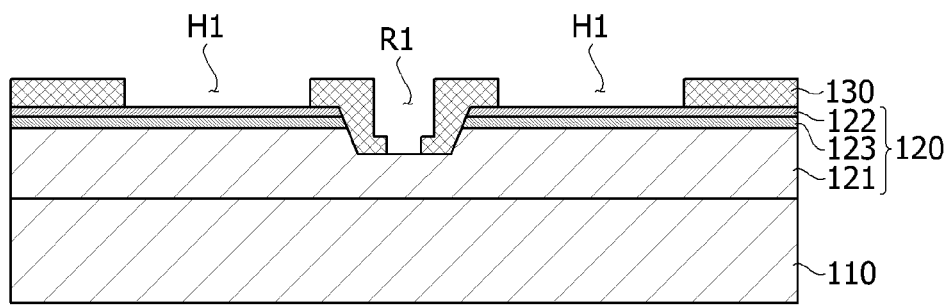

Referring to FIG. 15C, an operation of forming a channel layer 130 on the semiconductor structure 120 may be performed. In this case, the channel layer 130 may be formed only in a partial region of the semiconductor structure 120. That is, the channel layer 130 may expose portions of the first conductivity-type semiconductor layer 121 and the second conductivity-type semiconductor layer 122.

Specifically, the channel layer 130 may cover a portion of the first recess R1. In addition, the channel layer 130 may cover a portion of the second conductive semiconductor layer 122 adjacent to the first recess R1. In this case, the channel layer 130 may expose a portion of the first conductivity-type semiconductor layer 121 through another hole in the first recess R1. A first electrode 141 to be described below may be disposed in the first recess R1.

The channel layer 130 may expose a portion of the second conductivity-type semiconductor layer 122 through the first hole H1. That is, the first hole H1 may be a region of the second conductivity-type semiconductor layer 122, in which the channel layer 130 is not formed. A second electrode 142 to be described below may be disposed in the first hole H1.

Meanwhile, the first hole H1 may be formed by forming the channel layer 130 on the second conductive semiconductor layer 122 and then etching a partial region of the channel layer 130. Alternatively, a region, in which the first hole H1 is to be formed, may be covered using a mask or the like, and then, the channel layer 130 may be formed only in a partial region of the second conductivity-type semiconductor layer 122. However, the present invention is not limited to such methods.

Figure 15D:
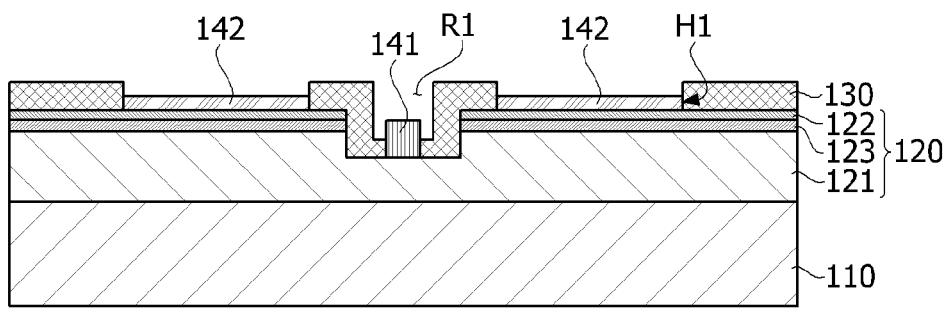

Referring to FIG. 15D, an operation of arranging the first electrode 141 and the second electrode 142 in the hole formed in the first recess R1 and the first hole H1 may be performed. The first electrode 141 may be disposed in the first recess R1. Specifically, the first electrode 141 may pass through the channel layer 130 in the first recess R1 and be disposed in another hole. The first electrode 141 may be electrically connected to the first conductivity-type semiconductor layer 121.

The second electrode 142 may be disposed in the first hole H1. The second electrode 142 may be electrically connected to the second conductivity-type semiconductor layer 122 exposed through the first hole H1.

On the other hand, in the drawing, two second electrodes 142 are illustrated as being provided to be spaced apart from each other, but the two second electrodes 142 may be substantially connected. That is, a hole is formed in the second electrode 142, and thus, when viewed in a cross-sectional view, the two second electrodes may be illustrated as being spaced apart from each other.

Figure 15E:
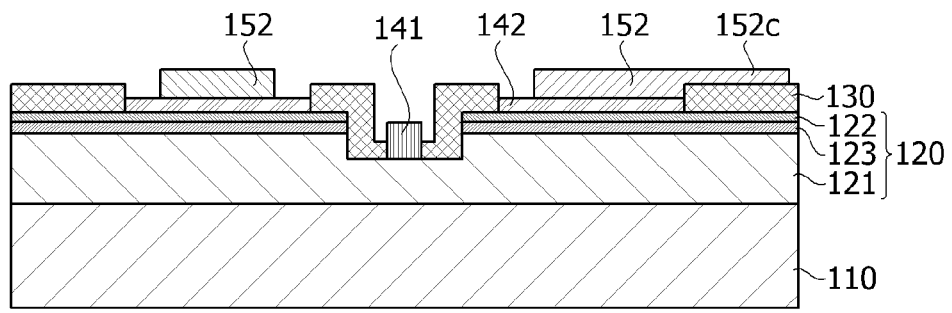

Referring to FIG. 15E, an operation of arranging a second interconnection line 152 on the second electrode 142 may be performed. The second interconnection line 152 may extend in a direction toward a side surface of the substrate 110. For example, the second interconnection line 152 may include a second end portion 152c extending to an upper portion of the channel layer 130 disposed at an end of the substrate 110.

Accordingly, the second end portion 152c may overlap the channel layer 130 in a direction perpendicular to the substrate 110. The second interconnection line 152 and a pad may be electrically connected by the second end portion 152c. Therefore, the end portion of the second interconnection line 152 may be easily connected to a second pad.

Figure 15F:
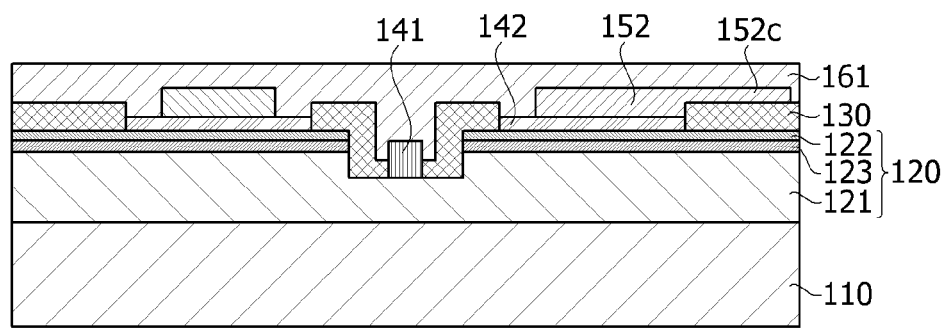

Referring to FIG. 15F, an operation of arranging a first insulating layer 161 to cover the channel layer 130, the first electrode 141, the second electrode 142, and the second interconnection line 152 may be performed. The second interconnection line 152 and a first interconnection line 151 to be described below may be electrically insulated by the first insulating layer 161.

Figure 15G:
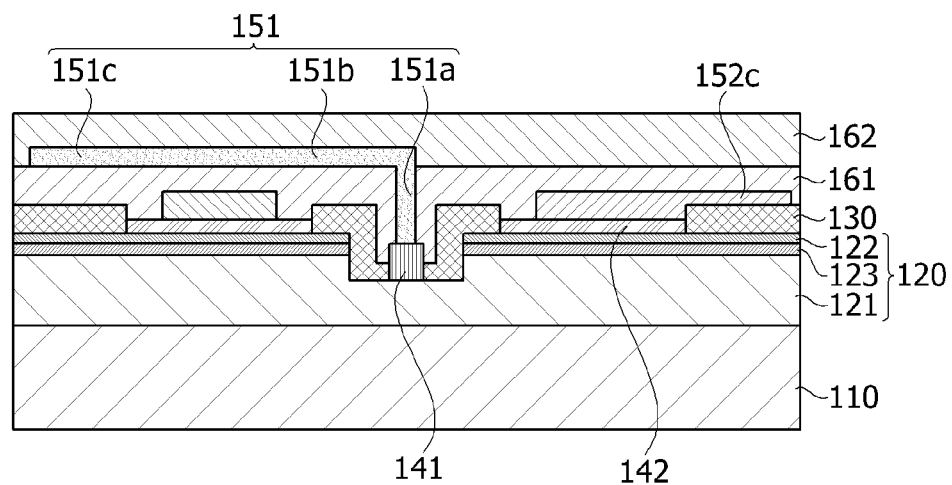

Referring to FIG. 15G, an operation of forming the first interconnection line 151 so as to pass through the first insulating layer 161 and arranging a second insulating layer 162 may be performed. Here, the first interconnection line 151 may include a first through-portion 151a, a first connection portion 151b, and a first end portion 151c.

The first through-portion 151a may extend from the first electrode 141 toward one surface of the first insulating layer 161. The first connection portion 151b may be bent from the first through-portion 151a and extend along one surface of the first insulating layer 161. The first end portion 151c may extend in a direction toward the end of the substrate 110. Therefore, the first end portion 151c of the first interconnection line 151 may be easily connected to a pad, which will be described below.

The first through-portion 151a may be disposed to pass through the first insulating layer 161, and the first connection portion 151b may be disposed on one surface of the first insulating layer 161. In this case, a hole is formed from one surface of the first insulating layer 161 toward the first electrode 141, and a first region 151a may be disposed inside the hole.

In addition, the first end portion 151c may be disposed to extend to the upper portion of the channel layer 130 disposed at the end of the substrate 110. That is, the first end portion 151c may overlap the channel layer 130 in the direction perpendicular to the substrate 110. The first interconnection line 151 and a pad may be electrically connected by the first end portion 151c.

After the first interconnection line 151 is formed, the second insulating layer 162 may be disposed to cover the first insulating layer 161 and the first interconnection line 151. The first interconnection line 151 may be insulated and protected by the second insulating layer 162.

Figure 15H:
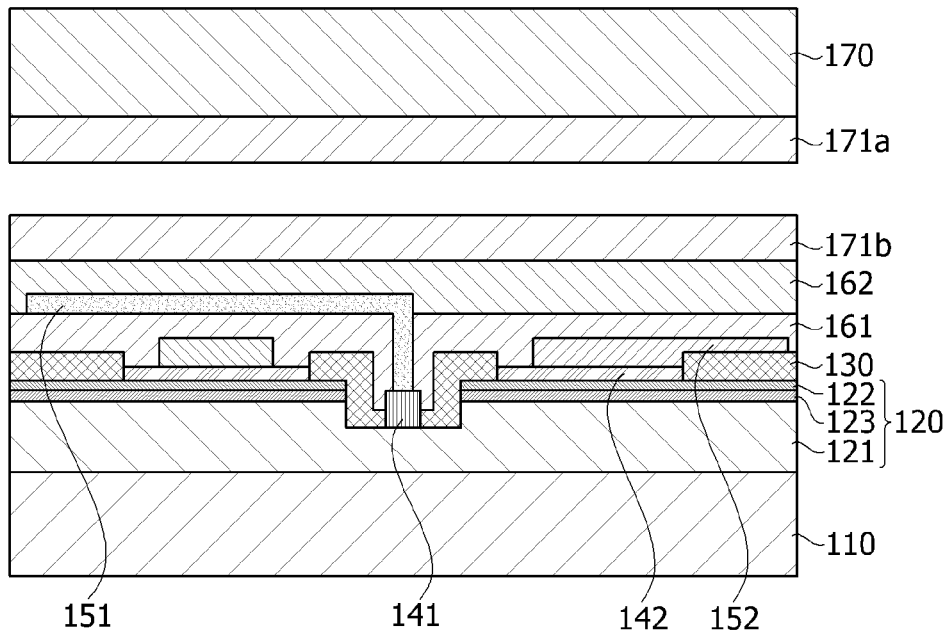

Referring to FIG. 15H, an operation of bonding a ceramic substrate 170 onto the second insulating layer 162 may be performed. In this case, a first bonding layer 171a may be disposed on the ceramic substrate 170, and a second bonding layer 171b may be disposed on the second insulating layer 162. That is, the second insulating layer 162 and the ceramic substrate 170 may be bonded by the first and second bonding layers 171a and 171b being bonded.

Figure 15I:
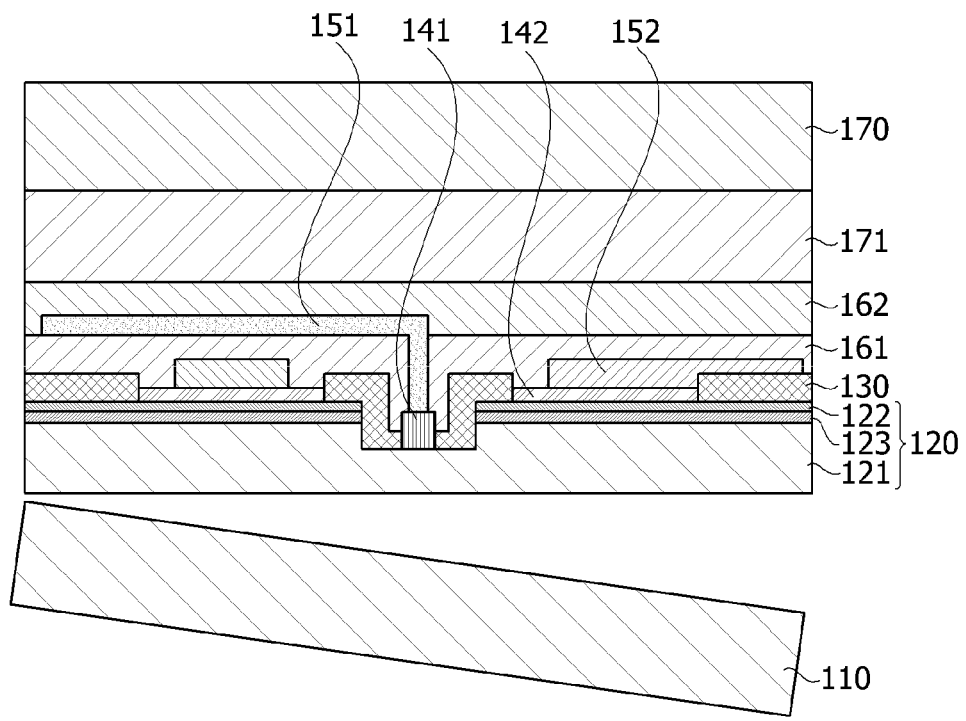

Referring to FIG. 15I, an operation of separating the substrate 110 from the semiconductor structure 120 may be performed. In this case, the substrate 110 may be removed by a laser lift-off (LLO) method using an excimer laser or the like. Specifically, when light having energy greater than or equal to band gap energy of the substrate is irradiated onto the substrate 110, the substrate 110 may absorb the energy to be decomposed. That is, gas molecules of a material included in the substrate 110 may be generated to separate the substrate 110 from the semiconductor structure 120.

Meanwhile, when the substrate 110 is separated, the semiconductor structure 120 may be supported by the ceramic substrate 170. In addition, heat generated in an LLO process may be effectively dissipated by the ceramic substrate 170.

Figure 15J:
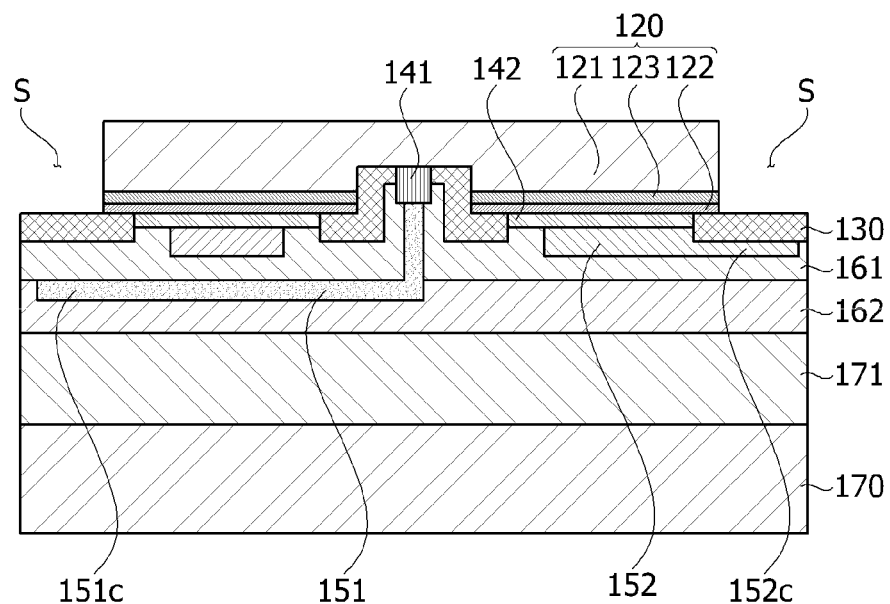

Referring to FIG. 15J, a side portion of the semiconductor structure 120 may be etched. Specifically, an edge of the semiconductor structure 120 corresponding to an edge of the substrate 170 may be etched.

In this case, the etching may be performed such that the etching stops when a material constituting the channel layer 130 is detected by an endpoint detection method. In addition, the first interconnection line 151 and the second interconnection line 152 may be disposed below the exposed channel layer 130. That is, an etch position may be adjusted such that the channel layer 130 and the first and second end portions 151c and 152c of the first and second interconnection lines 151 and 152 are disposed below an etched region S.

When the semiconductor structure 120 is etched, the channel layer 130 can protect components positioned below the channel layer 130 to minimize damage that may occur in a manufacturing process. In addition, a first pad 181 and a second pad 182, which will be described below, may be easily connected to the first and second end portions 151c and 152c disposed below the etched region S.

An operation of FIG. 15J may be performed as an operation of positioning the substrate 170 at a lower side.

The semiconductor structure 120 may be supported by the substrate 170 so that processes to be described below may be smoothly performed.

Meanwhile, in the drawings, although one semiconductor structure 120 is illustrated, substantially, a plurality of semiconductor structures 120 may be provided (see FIG. 4).

That is, in the operation of FIG. 15J, an isolation process may be performed along with the etching of the side portion of the semiconductor structure 120. The semiconductor structure 120 may be divided into a plurality of pieces by the isolation process. Therefore, one semiconductor structure 120 may be isolated into a plurality of semiconductor structures in a chip unit. In this case, the plurality of semiconductor structures may be disposed to be spaced apart from each other by a predetermined distance.

In addition, although only one first interconnection line 151 and one second interconnection line 152 electrically connected to one first conductivity-type semiconductor layer 121 and one second conductivity-type semiconductor layer 122 are illustrated in the drawings, substantially, a plurality of first interconnection lines 151 and a plurality of second interconnection lines 152 may be provided. Furthermore, each of the first and second interconnection lines 151 and 152 may be electrically connected to the plurality of semiconductor structures 120. That is, in FIGS. 15E and 15G, one first interconnection line 151 and one second interconnection line 52 are illustrated as being formed, but as described above, a plurality of first interconnection lines 151 and a plurality of second interconnection lines 152 connected to a plurality of semiconductor structures in a chip unit may be actually provided.

Figure 15K:
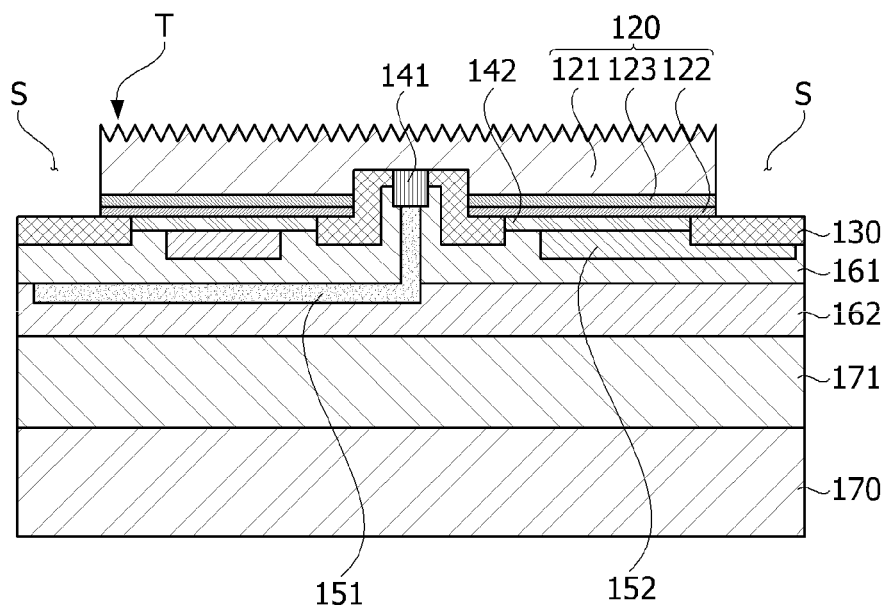

Referring to FIG. 15K, an operation of forming an uneven structure T on the semiconductor structure 120 may be performed. Specifically, the uneven structure T may be formed on the first conductivity-type semiconductor layer 121. Light extraction efficiency of the semiconductor device package 100 can be improved due to the uneven structure T.

Figure 15L:
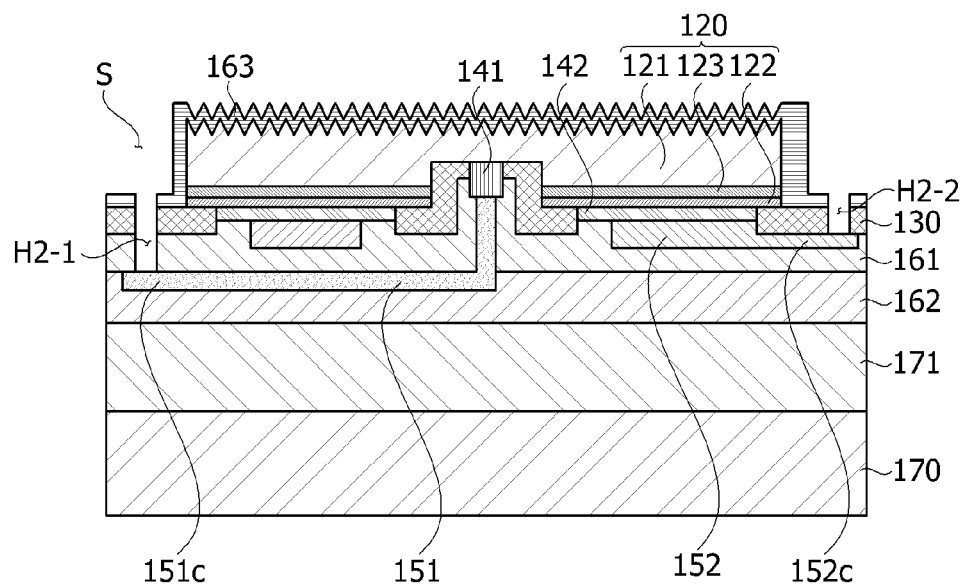

Referring to FIG. 15L, an operation of arranging a passivation layer 163 on the semiconductor structure 120 and the exposed channel layer 130 and forming holes H2-1 and H2-2 such that the end portions 151c and 152c of the interconnection lines 151 and 152 are exposed may be performed. In this case, the holes H2-1 and H2-2 may be formed through etching from the etched region S.

That is, the semiconductor structure 120 may be insulated and protected by the passivation layer 163. In this case, the passivation layer 163 may also include an uneven structure due to the uneven structure of the semiconductor structure 120.

In addition, a second-first hole H2-1 may be formed such that the first end portion 151c is exposed, and a second-second hole H2-2 may be formed such that the second end portion 152c is exposed. That is, the second-first hole H2-1 may be formed by etching the channel layer 130 and the first insulating layer 161 from the passivation layer 163. The second-second hole H2-1 may be formed by etching the channel layer 130 from the passivation layer 163.

Figure 15M:
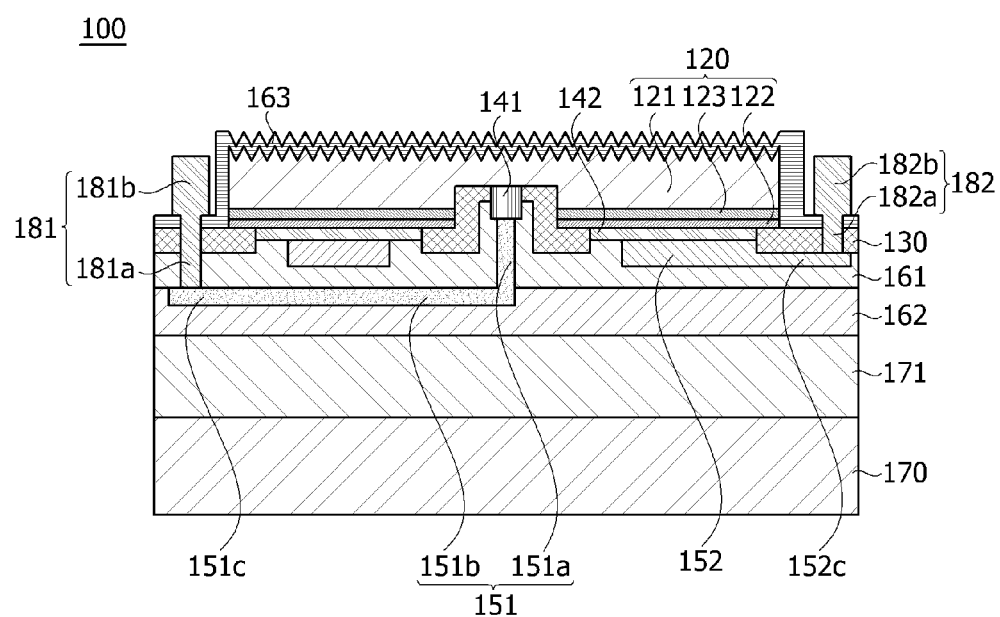

Referring to FIG. 15M, an operation of arranging the first and second pads 181 and 182 in the etched region of the semiconductor structure 120 may be performed. In this case, the first and second pads 181 and 182 may include first regions 181a and 182a and second regions 181b and 182b.

Specifically, the first regions 181a and 182a may be disposed in the second-first and second-second holes H2-1 and H2-2. That is, the second regions 181b and 182b may be disposed to protrude from the first regions 181a and 182a disposed in the second-first and second-second holes to the etched region of the semiconductor structure 120.

The first region 181a of the first pad 181 may be electrically connected to the first end portion 151c of the first interconnection line 151. The first region 181a may pass through the first insulating layer 161, the channel layer 130, and the passivation layer 163. The second region 181b of the first pad 181 may protrude outward from the passivation layer 163 and be disposed at the side portion of the semiconductor structure 120.

The first region 182a of the second pad 182 may be electrically connected to the second end portion 152c of the second interconnection line 152. The first region 182a may pass through the channel layer 130 and the passivation layer 163. The second region 182b of the second pad 182 may protrude outward from the passivation layer 163 and be disposed at the side portion of the semiconductor structure 120.

Meanwhile, in the drawings, although one first pad 181 and one second pad 182 are disposed, substantially, a plurality of first pads 181 and a plurality of second pads 182 may be present as in the semiconductor structures 120 and the first and second interconnection lines 151 and 152.

As described above, in the present invention, a semiconductor structure in a large unit may be formed, and the semiconductor structure may be isolated on the substrate 170 to be separated into the semiconductor structures 120 in a chip unit. In addition, peripheral portions of the semiconductor structures corresponding to a peripheral portion of the substrate 170 may be etched together, and the first and second pads 181 and 182 may be disposed in regions in which the semiconductor structure is etched. In this case, the first and second interconnection lines 151 and 152 electrically connected to the semiconductor structure 120 may be disposed to extend to a lower portion of the etched region. Therefore, connections between the first and second pads 181 and 182 and the interconnection lines can be easily performed.

That is, the plurality of semiconductor structures 120 may be disposed on one substrate 170, and the plurality of first pads 181 and the plurality of second pads 182 may be disposed along the peripheral portion of the substrate 170. In this case, one first pad 181 and one second pad 182 may be electrically connected to the plurality of semiconductor structures 120. In addition, the first and second interconnection lines 151 and 152 may be formed between the semiconductor structure 120 and the substrate 170.

Accordingly, wire bonding for connecting individual chips (semiconductor devices) on a substrate and a package substrate can be omitted to miniaturize a package. In addition, processability can be improved by shortening a process. In addition, a semiconductor region can be further expanded by saving an unnecessary space.

Figure 16:
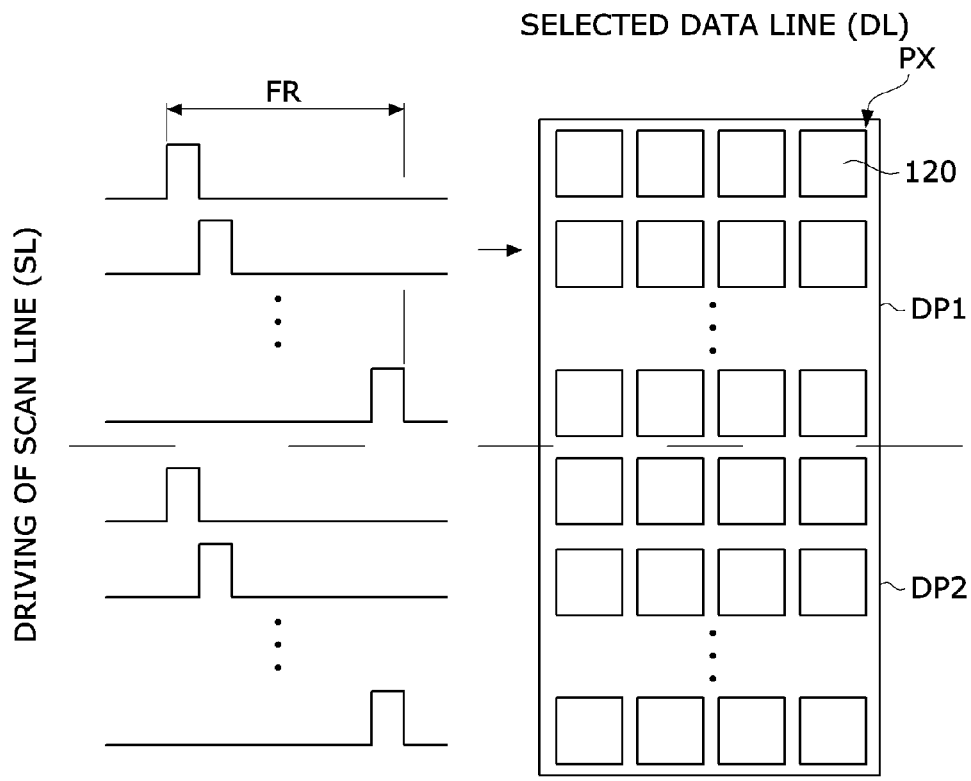
FIGS. 16 to 18 are views for describing a passive matrix driving method according to an embodiment.
Figure 17:
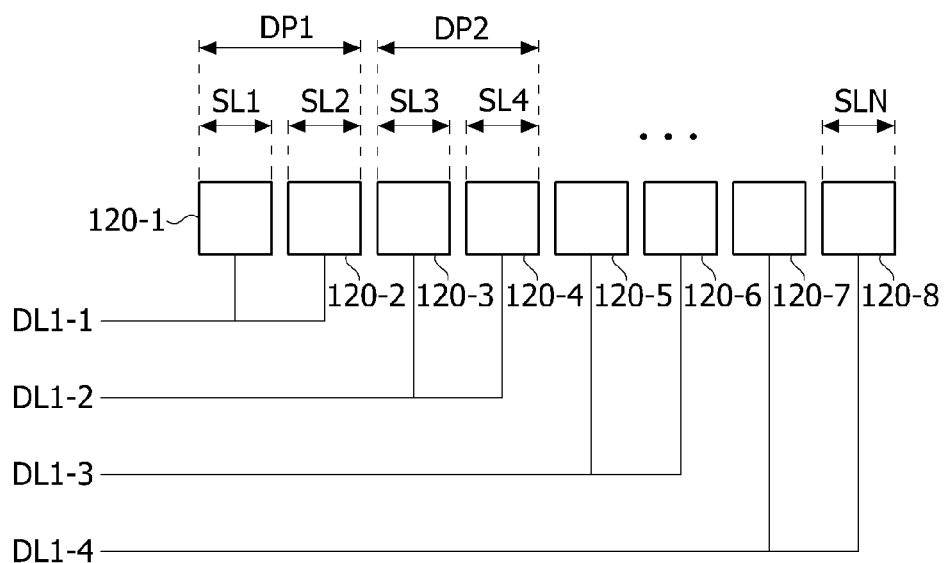
Figure 18:
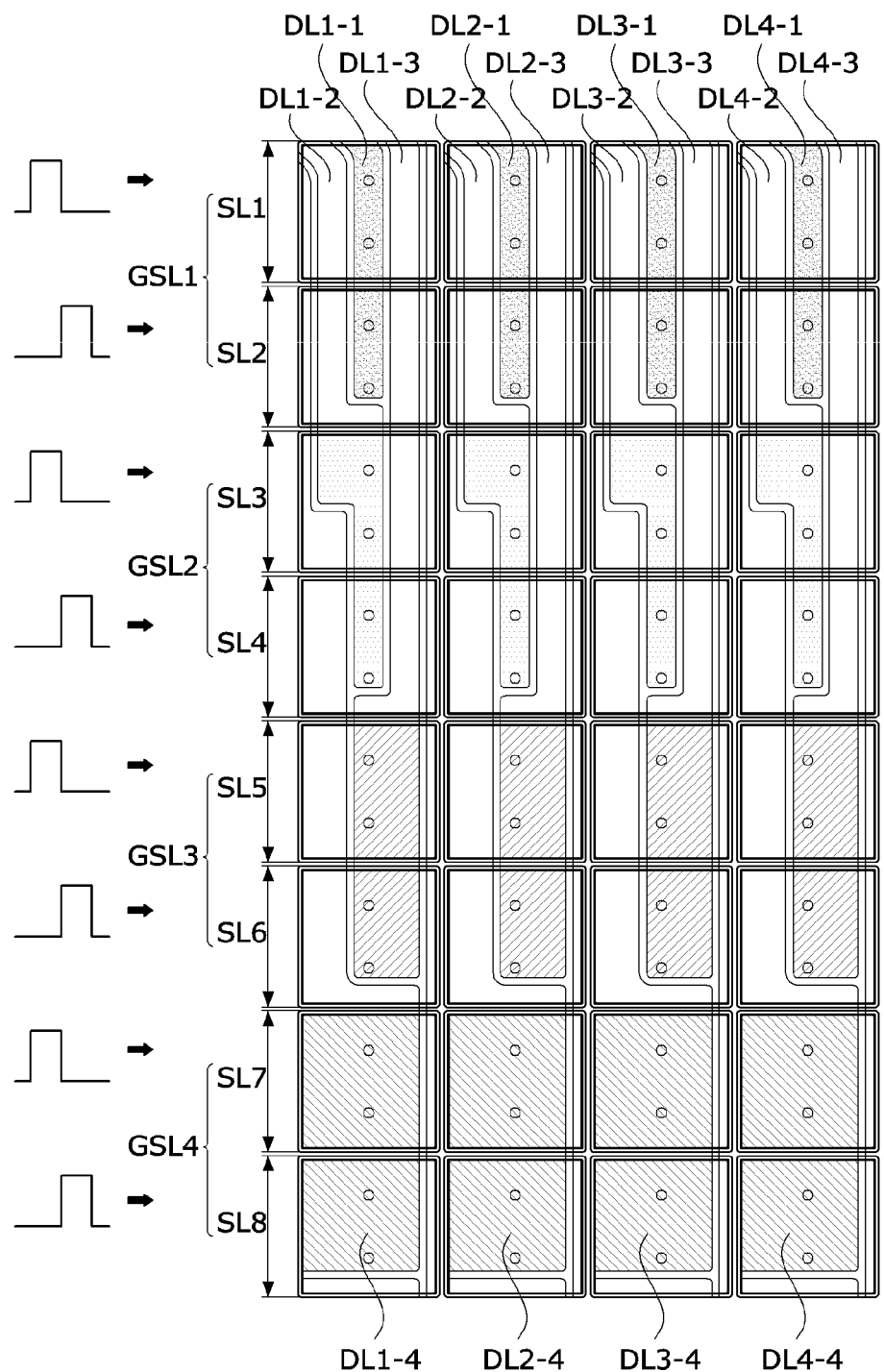

FIGS. 16 to 18 are views for describing a passive matrix driving method according to an embodiment.

First, referring to FIGS. 16 and 17, a first driving unit may apply a first control signal to a selected data line DL. In addition, a second driving unit may apply a second control signal to a scan line SL.

As shown in FIG. 16, a plurality of semiconductor structures 120 may be included in a display region DP. In addition, as described above, the display region DP may include pixels PX that are the semiconductor structures 120.

In this case, the display region DP may be divided into a plurality of division display regions DP1 and DP2 according to the number of time divisions by the scan line SL. The division display regions DP1 and DP2 may each include a number of scan lines SL equal to the number of time divisions corresponding to a structure of a semiconductor device package 100. Here, the number of the time divisions corresponding to the structure of the semiconductor device package 100 may be the number of semiconductor structures connected to one data line DL. Accordingly, the scan line SL may include group scan lines that are each divided into a number of scan lines equal to the number of the time divisions. For example, in 2-time division, a first group scan line may include a first scan line SL1 and a second scan line SL.

The second control signal may be applied to the scan line SL in the division display regions DP1 and DP2 in different time periods during one frame FR. Here, one frame FR refers to a time during which image data is displayed through the display region DP. In general, one frame FR is 60 Hz, i.e., 1/60 seconds, but is not limited to such a frequency. One frame FR may be variously changed according to a display apparatus.

In the case of 2-time division, the first division display region DP1 and the second division display region DP2 may each include two scan lines SL. For example, the first division display region DP1 may include the first scan line SL1 and the second scan line SL2, and the second division display region DP2 may include a third scan line SL3 and a fourth scan line SL4.

In this case, the second control signal may be applied to one scan line in the first division display region DP1 and one scan line in the second division display region DP2 in a first time period within one frame FR.

In addition, the second control signal may be applied to the other scan line in the first division display region DP1 and the other scan line in the second division display region DP2 in a second time period within one frame FR (for example, in the case of 2-time division, in a time period excluding the first time period within one frame FR).

When the second control signal is applied to one scan line in the first division display region DP1, the same second control signal may be applied to one scan line in the second division display region DP2. That is, the second control signal may be applied to a plurality of division display regions DP through one scan line for each time division.

In addition, the second control signal may be sequentially applied to the scan lines for every division display region DP. For example, the second control signal may be applied to the first scan line SL1 of the first group scan line GSL1 and the third scan line SL3 in a first time period, and the second control signal may be applied to the second scan line SL2 and the fourth scan line SL4 of a second group scan line GSL2 in a second time period. The same may be applied other group scan lines.

However, the present invention is not limited to such a sequential method. The second control signal may be applied to the first scan line SL1 and the fourth scan line SL4 in the first time period, and the second signal may be applied to the second scan line SL2 and the third scan line SL3 in the second time period.

Due to such a configuration, a display apparatus according to an embodiment may display image data, which is applied through a passive matrix method, through the semiconductor structure 120.

In addition, as described above, the numbers of the scan lines SL, the data lines DL, and the display regions DP may be changed according to the number of the semiconductor structures 120 of the semiconductor device package and may also be changed according to the number of time divisions.

Referring to FIG. 18, FIG. 18 illustrates only a partial region of a semiconductor device package according to an embodiment, and a scan line SL may include first to eight scan lines SL1 to SL8. In addition, a data line may include 16 data lines. Here, the present invention will be mainly described on the basis of these numbers but is not limited thereto.

The first scan line SL1 may be electrically connected to each of a first-first data line DL1-1, a second-first data line DL2-1, a tjhird-first data line DL3-1, and a fourth-first data line DL4-1 through a semiconductor structure 120. The first-first data line DL1-1 may be electrically connected to a first-1a interconnection line 151-1a which is described above. The second-first data line DL2-1, the tjhird-first data line DL3-1, and the fourth-first data line DL4-1 may be electrically connected to a first-2a interconnection line 151-2a, a first-3a interconnection line 151-3a, and a first-4a interconnection line 151-4a, respectively.

The second scan line SL2 may be electrically connected to each of the first-first data line DL1-1, the second-first data line DL2-1, the tjhird-first data line DL3-1, and the fourth-first data line DL4-1 through a semiconductor structure 120. As described above, the first-first data line DL1-1 may be electrically connected to the first-1a interconnection line 151-1a. As described above, the second-first data line DL2-1, the tjhird-first data line DL3-1, and the fourth-first data line DL4-1 may be electrically connected to the first-2a interconnection line 151-2a, the first-3a interconnection line 151-3a, and the first-4a interconnection line 151-4a.

Thus, the first-first data line DL1-1, the second-first data line DL2-1, the tjhird-first data line DL3-1, and the fourth-first data line DL4-1 may each be electrically connected to the semiconductor structure 120 connected to two scan lines (here, SL1 and SL2).

Such a structure may also be equally applied to the third to eighth scan line SL3 to SL8.

That is, in a display apparatus (see FIG. 3) for 2-time division driving, one data line may be electrically connected to two scan lines through a semiconductor structure. A second control signal may be provided to the two scan lines in different time periods during one frame FR.

Figure 19:
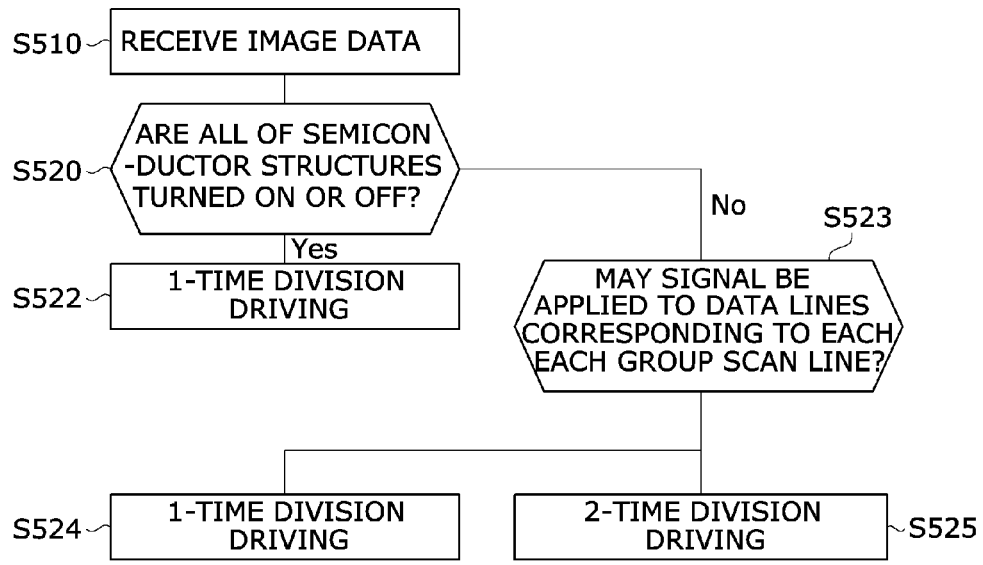
FIG. 19 is a view for describing time division determining of a display apparatus according to an embodiment.
Figure 20:
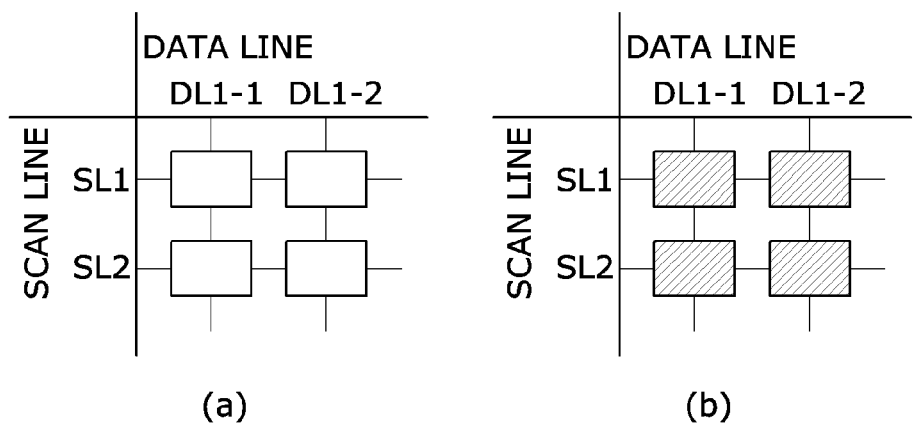
FIG. 20 is a view illustrating an example of 1-time division.
Figure 21:
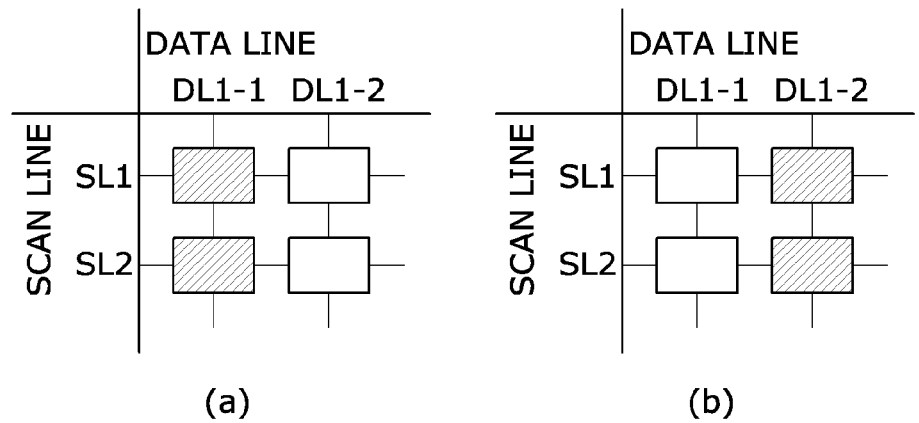
FIG. 21 is a view illustrating another example of 1-time division.
Figure 22:
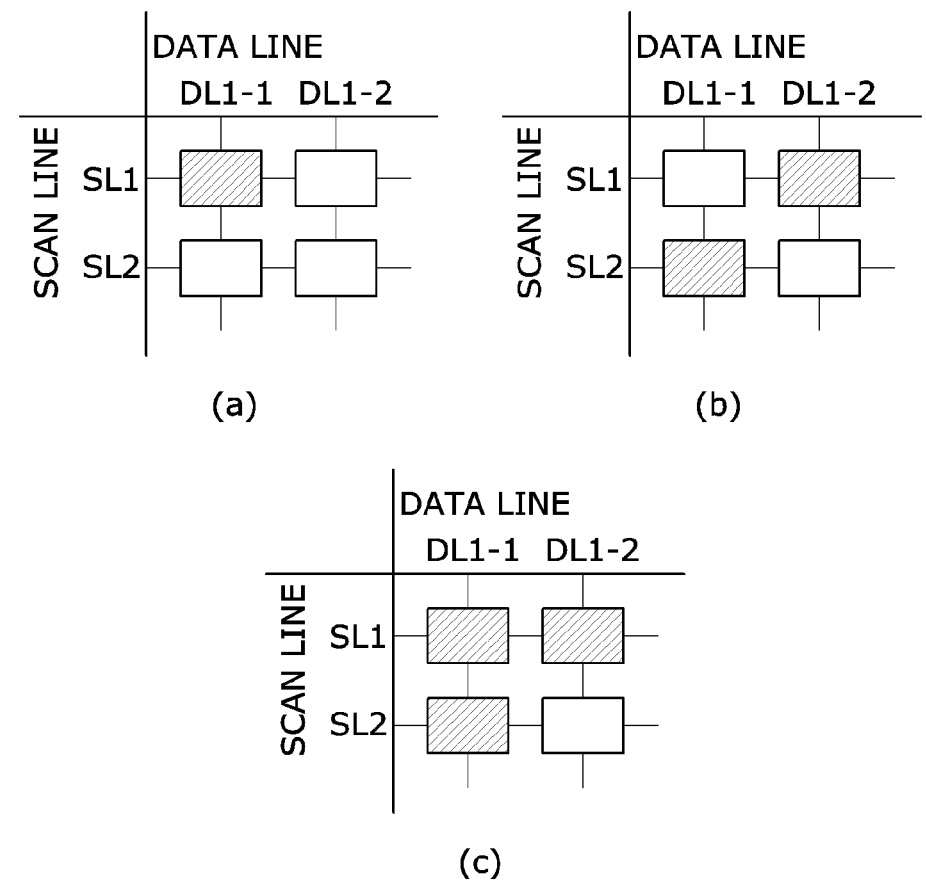
FIG. 22 is a view illustrating an example of 2-time division.

FIG. 19 is a flowchart for describing time division determining of a display apparatus according to an embodiment. FIG. 20 shows views illustrating an example of 1-time division. FIG. 21 shows views illustrating another example of 1-time division. FIG. 22 shows views illustrating an example of 2-time division.

Referring to FIG. 19, the time division determining of the display apparatus according to the embodiment may include receiving data (S510) and determining time division according to the received data (S520).

First, the display apparatus may receive the data from an external device (S510). Here, the data may be image data of one frame, and the display apparatus may allow emit each pixel to emit light according to the image data.

A controller may determine the time division according to the received data (S520). When 1-time division is applicable to the received data, the display apparatus according to the embodiment may display the image data in a 1-time division manner. As described above, the display apparatus according to the embodiment may allow a semiconductor structure, in which the number of time divisions is reduced, to emit light, thereby improving luminous flux.

Specifically, the determining of the time division (S520) may include determining whether all of the semiconductor structures are turned on or off (S521) and determining whether a signal may be applied to data lines corresponding to a group scan line (S523).

First, it may be determined whether all of the semiconductor structures are turned on or off (S521). When all of the semiconductor structures are turned on or off, the controller may determine the number of time divisions as one.

Referring to FIG. 20A, even when a second control signal is applied through all of scan lines SL1 and SL2 in the same group scan line, a first control signal may not be applied to data lines DL1-1 and DL1-2. In this case, all of the semiconductor structures may be turned off (may not emit light).

Referring to FIG. 20B, the second control signal may be applied to all of the scan lines SL1 and SL2 in the same group scan line, and the first control signal may be applied to the data lines DL1-1 and DL1-2. In this case, all of the semiconductor structures may be turned on (may emit light).

That is, even when the second control signal is applied to the semiconductor structures through the scan lines SL1 and SL2 during an entirety of one frame, image data may be displayed. Accordingly, when all of the semiconductor structures are turned on or off, the second control signal may be applied to all of the scan lines for an entire time during one frame to perform 1-time division driving.

When all of the semiconductor structures are not turned on or off, it may be determined whether a signal may be applied to the data lines corresponding to the group scan line (S523). When the signal may be applied to the data lines corresponding to the group scan line, the number of time divisions may be determined as one, and the display apparatus may be driven in a 1-time division manner within a corresponding frame (S524).

Referring to FIGS. 21A and 21B, a signal may be applied to data lines corresponding to a group scan line.

Even when a second control signal is applied through all of scan lines SL1 and SL2 in the same group scan line, a first signal may be applied to only one of data lines DL1-1 and DL1-2. That is, even when the second control signal is applied to all of the semiconductor structures through the scan lines SL1 and SL2 during one frame, the semiconductor structures disposed in a column may emit light within one frame. Accordingly, since 1-time division driving is possible, the controller may determine the number of time divisions as one.

On the other hand, when a signal may not be applied to the data line signal corresponding to the group scan line, the controller may determine the number of time divisions as two (S525).

Referring to FIGS. 22A to 22C, a signal may not be applied to data lines corresponding to a group scan line.

That is, when a second control signal is applied to all of the semiconductor structures during one frame through scan lines SL1 and SL2, and when a first control signal is applied to any one data line of two data lines DL1-1 and DL1-2, all of the semiconductor structures, which are connected to the data line to which the first control signal is applied, may emit light. Accordingly, when image data is displayed during one frame, and when a signal may not be applied to the data lines corresponding to the group scan line, the controller may determine the number of time divisions as two.

Figure 23:
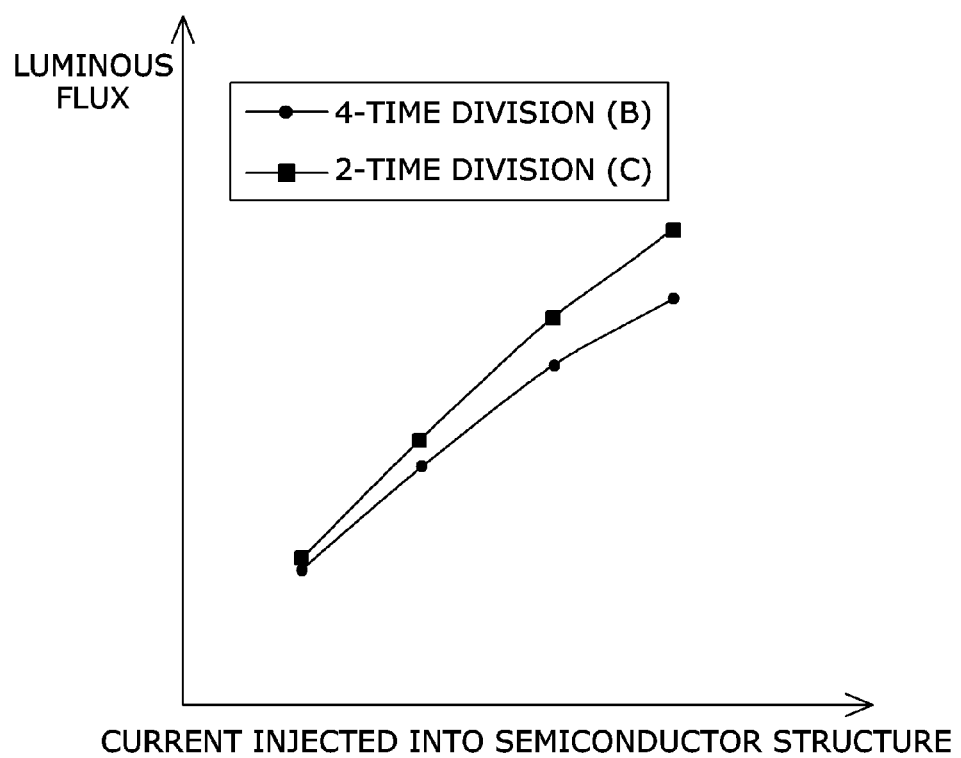
FIG. 23 is a view for describing an effect of a display apparatus according to an embodiment.

FIG. 23 is a graph for describing an effect of a display apparatus according to an embodiment.

Referring to FIG. 23, in the case of 2-time division (a) and 4-time division (b), luminous flux (y-axis) according to an average current (x-axis) injected into a semiconductor structure is illustrated. Here, the average current injected into a semiconductor device package is the same in the case of 2-time division (a) and the 4-time division (b), but a peak current of the 2-time division (a) is the half of a peak current of the 4-time division (b). A current is injected into one scan line in one time period of four time periods in one frame to one scan line in the case of the 2-time division (a) and in the case of the 4-time division (b), but a current is injected in one time period of two times periods in one frame in the case of the 2-time division (a). Thus, a peak current per scan line of the 4-time division (b) may be twice a peak current per scan line of the 2-time division. Accordingly, even when the same average current is injected as compared with the 2-time division, in the case of the 4-time division, it can be seen that luminous flux is not increased in proportion to the average current. This is because, even when a high peak current is injected, current spreading is not linearly increased. Accordingly, the display apparatus according to the embodiment may decrease the number of time divisions as necessary, thereby increasing luminous flux.

A semiconductor device package may be used as a light source of a lighting system or may be used as a light source of an image display apparatus or a light source of a lighting device. That is, the semiconductor device package may be disposed in a case and applied to various electronic devices that provide light. For example, when the semiconductor device package and red, green, and blue (RGB) fluorescent materials are mixed and used, white light having a high color rendering index (CRI) may be realized.

The above-described semiconductor device package is formed as a light-emitting device package and may be used as a light source of a lighting system. For example, the semiconductor device package may be used as a light source of an image display apparatus, a light source of a lighting device, or the like.

The semiconductor device package may be used as an edge-type backlight unit or a direct-type backlight unit when used as a backlight unit of the image display apparatus, and the semiconductor device package may be used in a lighting apparatus or as a bulb-type lighting device when used as the light source of the lighting device. In addition, the semiconductor device package may also be used as a light source of a mobile phone or a headlamp for a vehicle.

While the present invention has been mainly described with reference to the embodiments, it should be understood that the present invention is not limited to the disclosed embodiments and that various modifications and applications may be devised by those skilled in the art without departing from the gist of the present invention. For example, each component specifically shown in the embodiment may be modified and implemented. Differences related to these modifications and applications should be construed as being within the scope of the present invention defined by the appended claims.

The invention claimed is:

1. A semiconductor device package comprising:
   a substrate;
   a plurality of semiconductor structures disposed on the substrate, wherein the semiconductor structure is disposed on the substrate and includes a first conductivity-type semiconductor layer, a second conductivity-type semiconductor layer, and an active layer disposed between the first conductivity-type semiconductor layer and the second conductivity-type semiconductor layer;
   a plurality of first interconnection lines disposed between the substrate and the plurality of semiconductor structures and electrically connected to the first conductivity-type semiconductor layer;
   a plurality of second interconnection lines disposed between the substrate and the plurality of semiconductor structures and electrically connected to the second conductivity-type semiconductor layer;
   a first insulating layer disposed between the first interconnection line and the second interconnection line;
   a plurality of first pads each electrically connected to the first interconnection line;
   a plurality of second pads each electrically connected to the second interconnection line,
   wherein, among the plurality of first interconnection lines, an area of a region, in which the first interconnection line having a greatest length extending in a first direction overlaps the semiconductor structure electrically connected thereto, is greater than an area of a region in which the first interconnection line having a smallest length extending in the first direction overlaps the semiconductor structure electrically connected thereto; and a channel layer disposed to expose portions of the first conductivity-type semiconductor layer and the second conductivity-type semiconductor layer between the substrate and the semiconductor structure, a first electrode disposed on the first conductivity-type semiconductor layer exposed by the channel layer, and a second electrode disposed on the second conductivity-type semiconductor layer exposed by the channel layer.

2. The semiconductor device package of claim 1, wherein, in the plurality of first interconnection lines, as a length extending in the first direction is increased, the area of the region overlapping the electrically connected semiconductor structure is also increased.

3. The semiconductor device package of claim 1, wherein the first interconnection line includes a first through-portion, which passes through the active layer, the second conductivity-type semiconductor layer, and the first insulating layer and is electrically connected to the first conductivity-type semiconductor layer, and a first end portion which extends to a first edge of the substrate, the second interconnection line includes a second end portion extending to a second edge of the substrate, and the first end portion and the second end portion are disposed to protrude further toward the edges of the substrate than edges of the semiconductor structure.

4. The semiconductor device package of claim 1, wherein the plurality of first interconnection lines include a first-1a interconnection line, a first-1b interconnection line, a first-1c interconnection line, and a first-1 d interconnection line disposed below the plurality of semiconductor structures, wherein the first-1a interconnection line, the first-1b interconnection line, the first-1c interconnection line, and the first-1 d interconnection line are sequentially disposed in a second direction, a length in the first direction is great in order from the first-1a interconnection line, the first-1d interconnection line, the first-1b interconnection line, to the first-1c interconnection line, the area of the region overlapping the electrically connected semiconductor structure is great in order from the first-1a interconnection line, the first-1d interconnection line, the first-1b interconnection line, to the first-1c interconnection line, and the second direction is a direction perpendicular to the first direction.

5. The semiconductor device package of claim 4, wherein the first-1a interconnection line overlaps the plurality of semiconductor structures in the first direction and includes a first protrusion and a second protrusion which protrude in the second direction, the first protrusion overlaps the first-1b interconnection line in the first direction, and the second protrusion overlaps the first-1b interconnection line, the first-1c interconnection line, and the first-1d interconnection line in the first direction.

6. The semiconductor device package of claim 5, wherein the first-1b interconnection line includes a third protrusion protruding in the second direction, and the third protrusion overlaps the first-1c interconnection line, the first-1d interconnection line, and the first-1a interconnection line in the first direction.

7. The semiconductor device package of claim 6, wherein the first-1 d interconnection line includes a fourth protrusion protruding in the second direction, and the fourth protrusion overlaps the first-1c interconnection line, the first-1b interconnection line, and the first-1a interconnection line in the first direction.

8. The semiconductor device package of claim 1, wherein a width ratio of a maximum width of the semiconductor structure in a second direction to a maximum width of the first interconnection line in the second direction, which overlaps the semiconductor structure in the second direction, is in a range of 1:0.7 to 1:0.9.

9. The semiconductor device package of claim 3, wherein the first pad includes a first region, which passes through the first insulating layer and is electrically connected to the first end portion, and a second region which extends from the first region and protrudes on the first edge of the substrate, wherein the first pad, the channel layer, and the first end portion overlap each other at the first edge of the substrate, the second pad, the channel layer, and the second end portion overlap each other at the second edge of the substrate, and the first insulating layer is disposed to cover the channel layer and the second interconnection line.

10. The semiconductor device package of claim 9, wherein the first insulating layer is disposed to cover the channel layer and the second interconnection line.

11. The semiconductor device package of claim 9, wherein the plurality of first pads and the plurality of second pads are disposed along the edges of the substrate.

12. The semiconductor device package of claim 9, wherein the plurality of semiconductor devices are disposed at a central portion of the plurality of first pads and the plurality of second pads.

13. The semiconductor device package of claim 4, wherein the first-1a interconnection line is a continuous line overlapping all of the plurality of semiconductor structures, and overlaps a last two adjacent semiconductor structures of the plurality of the semiconductor structures with a first area, and the first-1c interconnection line only overlaps a first two adjacent semiconductor structures of the plurality of the semiconductor structures with a second area that is less in size than the first area.

14. A display apparatus comprising:

a semiconductor device package which includes a substrate, a plurality of semiconductor structures disposed on the substrate and each including a first conductivity-type semiconductor layer, a second conductivity-type semiconductor layer, and an active layer disposed between the first conductivity-type semiconductor layer and the second conductivity-type semiconductor layer, a plurality of first interconnection lines disposed between the substrate and the plurality of semiconductor structures and electrically connected to the first conductivity-type semiconductor layer, a plurality of second interconnection lines disposed between the substrate and the plurality of semiconductor structures and electrically connected to the second conductivity-type semiconductor layer, a first insulating layer disposed between the first interconnection line and the second interconnection line, a plurality of first pads each electrically connected to the first interconnection line, and a plurality of second pads each electrically connected to the second interconnection line, wherein, among the plurality of first interconnection lines, an area of a region, in which the first interconnection line having a greatest length extending in a first direction overlaps the semiconductor structure electrically connected thereto, is greater than an area of a region in which the first interconnection line having a smallest length extending in the first direction overlaps the semiconductor structure electrically connected thereto;
a plurality of data lines connected to the plurality of first interconnection lines;
a plurality of scan lines connected to the plurality of second interconnection lines;
a first driving unit connected to the plurality of data lines to provide a first control signal;
a second driving unit connected to the plurality of scan lines to provide a second control signal; and
a controller configured to determine the number of time divisions according to input data to provide the first control signal and the second control signal to the first driving unit and the second driving unit,
wherein the semiconductor device package further includes a channel layer disposed to expose portions of the first conductivity-type semiconductor layer and the second conductivity-type semiconductor layer between the substrate and the semiconductor structure, a first electrode disposed on the first conductivity-type semiconductor layer exposed by the channel layer, and a second electrode disposed on the second conductivity-type semiconductor layer exposed by the channel layer.

15. The display apparatus of claim 14, wherein an area of a region overlapping the electrically connected semiconductor structure is increased as a length extending in the first direction of the plurality of first interconnection lines is increased.

16. The display apparatus of claim 14,
wherein the first interconnection line includes a first through-portion which passes through the active layer, the second conductivity-type semiconductor layer, and the first insulating layer and is electrically connected to the first conductivity-type semiconductor layer, and a first end portion which extends to a first edge of the substrate, and
wherein the second interconnection line includes a second end portion extending to a second edge of the substrate.

17. The display apparatus of claim 16, wherein the first end portion and the second end portion are disposed to protrude further toward the edges of the substrate than edges of the semiconductor structure.

18. The display apparatus of claim 16, wherein a width ratio of a maximum width of the semiconductor structure in a second direction to a maximum width of the first interconnection line in the second direction, which overlaps the semiconductor structure in the second direction, is in a range of 1:0.7 to 1:0.9.

19. The display apparatus of claim 16, wherein the first electrode is disposed on the first conductivity-type semiconductor layer exposed by the channel layer, and the second electrode is disposed on the second conductivity-type semiconductor layer exposed by the channel layer.

20. The display apparatus of claim 14, wherein the semiconductor device package includes a plurality of first pads each electrically connected to the first interconnection line, and a plurality of second pads each electrically connected to the second interconnection line.

* * * * *